(12) United States Patent
Forrest et al.

(10) Patent No.: US 11,957,048 B2
(45) Date of Patent: *Apr. 9, 2024

(54) KEY MATERIALS FOR ORGANIC PHOTOVOLTAICS RELIABILITY

(71) Applicant: The Regents of the University of Michigan, Ann Arbor, MI (US)

(72) Inventors: Stephen R. Forrest, Ann Arbor, MI (US); Yongxi Li, Ann Arbor, MI (US)

(73) Assignee: The Regents of the University of Michigan

( * ) Notice: Subject to any disclaimer, the term of this patent is extended or adjusted under 35 U.S.C. 154(b) by 0 days.

This patent is subject to a terminal disclaimer.

(21) Appl. No.: 18/163,528

(22) Filed: Feb. 2, 2023

(65) Prior Publication Data
US 2023/0180602 A1   Jun. 8, 2023

Related U.S. Application Data

(63) Continuation of application No. 17/515,690, filed on Nov. 1, 2021, now Pat. No. 11,594,686.

(60) Provisional application No. 63/109,459, filed on Nov. 4, 2020.

(51) Int. Cl.
*H10K 85/60* (2023.01)
*H10K 30/81* (2023.01)

(52) U.S. Cl.
CPC ........... *H10K 85/657* (2023.02); *H10K 30/81* (2023.02)

(58) Field of Classification Search
CPC ....... H10K 30/30; H10K 30/81; H10K 85/657
See application file for complete search history.

(56) References Cited

U.S. PATENT DOCUMENTS

| 10,344,028 B2 | 7/2019 | Lee |
| 2015/0179965 A1 | 6/2015 | Lee |

FOREIGN PATENT DOCUMENTS

| CN | 1840525 | 10/2006 |
| CN | 110690349 A | 1/2020 |
| JP | 2022037676 A | 3/2022 |
| WO | 2019090229 | 5/2019 |
| WO | 2022014483 A1 | 1/2022 |
| WO | 2022120924 A1 | 6/2022 |

OTHER PUBLICATIONS

Atzrodt, J et al. The Renaissance of H/D Exchange. Angew. Chem. Int. Ed. 2007, 46, 7744.
Cui, Y., Yao, H., Zhang, J et al. Over 16% efficiency organic photovoltaic cells enabled by a chlorinated acceptor with increased open-circuit voltages. Nat Commun 10, 2515 (2019). 8 pages.
(Continued)

*Primary Examiner* — Golam Mowla
(74) *Attorney, Agent, or Firm* — Riverside Law LLP

(57) ABSTRACT

Organic photovoltaic cells (OPVs) and their compositions are described herein. one or more embodiments, the acceptor with an active layer of an OPV includes is a non-fullerene acceptor. Such non-fullerene acceptors may provide improved OPV performance characteristics such as improved power conversion efficiency, open circuit voltage, fill factor, short circuit current, and/or external quantum efficiency.

19 Claims, 4 Drawing Sheets

(56) References Cited

OTHER PUBLICATIONS

Du, X., Heumueller, T., Gruber, W., Almora, O., Classen, A., Qu, J., . . . Brabec, C. J. (2020). Unraveling the Microstructure-Related Device Stability for Polymer Solar Cells Based on Nonfullerene Small-Molecular Acceptors. Advanced Materials, 1908305. 9 pages.

Du, X., Heumueller, T., Gruber, W., Classen, A., Unruh, T., Li, N., & Brabec, C. J. (2018). Efficient Polymer Solar Cells Based on Non-fullerene Acceptors with Potential Device Lifetime Approaching 10 Years. Joule. 3(1), 2019, pp. 215-226.

Hu, Y. et al. A convenient synthesis of deuterium labeled amines and nitrogen heterocycles with KOt-By/DMSO-d¬¬6. Tetrahedron. 2015, 71, 1425.

Li, Y., Lin, J.-D., Che, X., Qu, Y., Liu, F., Liao, L.-S., & Forrest, S. R. (2017). High Efficiency Near-Infrared and Semitransparent Non-Fullerene Acceptor Organic Photovoltaic Cells. Journal of the American Chemical Society, 139 (47), 17114-17119.

Office Action (Notice of Allowance and Fees Due (PTOL-85)) dated Aug. 22, 2022 for U.S. Appl. No. 17/515,690 (pp. 1-9).

200 Multi-junction/Tandem Organic Photovoltaic Cell

| 202 Anode | 208 Intermediate Layer | 206A Active Region/Layer | 212 Intermediate Layer | 206B Active Region/Laer | 210 Intermediate Layer | 204 Cathode |

Figure 2

KEY MATERIALS FOR ORGANIC PHOTOVOLTAICS RELIABILITY

CROSS REFERENCE TO RELATED APPLICATIONS

The present application is a continuation of U.S. application Ser. No. 17/515,690, filed Nov. 21, 2021, now allowed, which claims priority to U.S. Provisional Application No. 63/109,459 filed Nov. 4, 2020, all of which applications are incorporated herein by reference in their entireties.

FIELD

The present disclosure generally relates to electrically active, optically active, solar, and semiconductor devices, and in particular, to organic photovoltaic cells and near-infrared non-fullerene acceptor compositions in such organic photovoltaic cells.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

BACKGROUND

Organic photovoltaic cells (OPVs) have sparked considerable interest in recent years owing to their flexibility, light weight, non-toxic nature and semi-transparency that makes them ideal for building integrated and building applied applications. Compared to the commercial solar modules that typically have power conversion efficiencies of PCE=15-22% of sunlight, organics have improved from 10% in 2016 to over 17% in 2019 for single junction devices. Advances have steadily continued, headed toward single junction thermodynamically limited efficiencies of ~25%, with potentially higher efficiencies based on multi-junction cells. This rapid advance has been paced by the development of non-fullerene acceptors (NFAs).

In contrast to previously employed fullerene acceptors with their limited energy-level tunability and morphological and/or photochemical stability, the tunability of molecular structure, absorption spectra and electron energy levels of NFAs provide a range of opportunities for their use in semitransparent power generating windows. However, their reliability remains a major concern, as even the most stable devices reported so far degrade within only a few years (extrapolated to a 80% of their initial PCE, known as T80). This is compared to extrapolated intrinsic lifetimes of fullerene-based cells of thousands of years.

SUMMARY

In one aspect, the disclosure provides acceptor for an organic photovoltaic cell comprising one of Formulae (I)-(III):

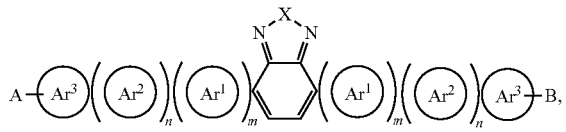
(I)

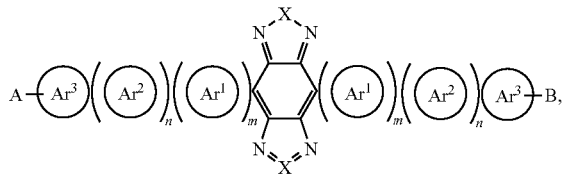
(II)

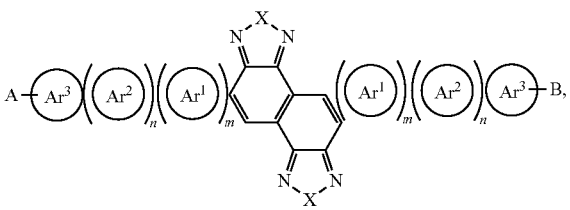
(III)

wherein:

A and B are individually selected from the group consisting of:

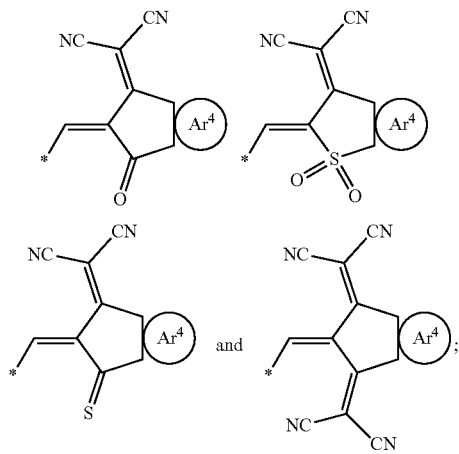

each $Ar^1$ is individually selected from the group consisting of:

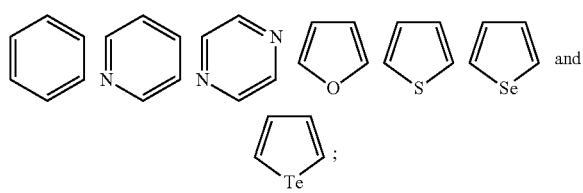

each $Ar^2$ is individually selected from the group consisting of:

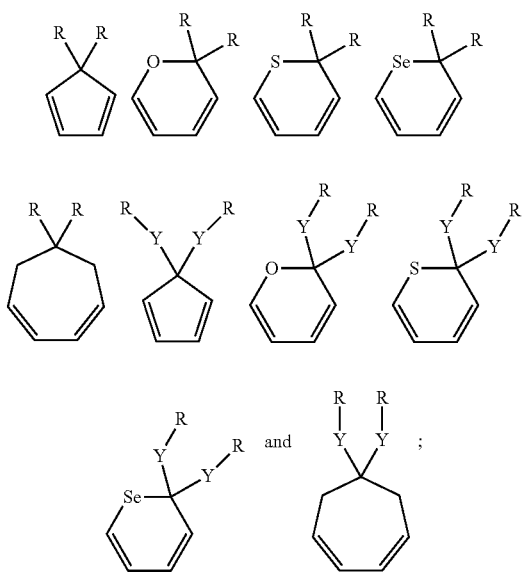

each Ar³ is individually selected from the group consisting of:

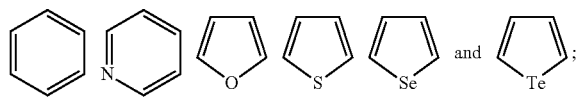

each Ar⁴ is individually selected from the group consisting of:

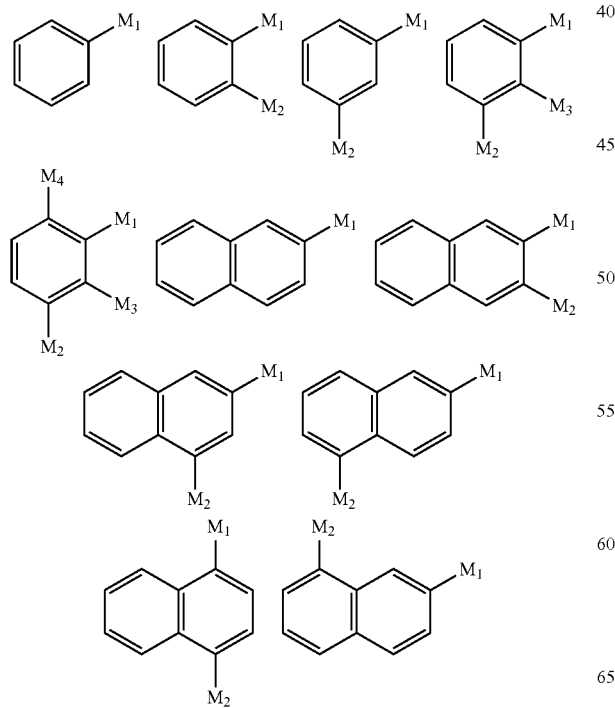

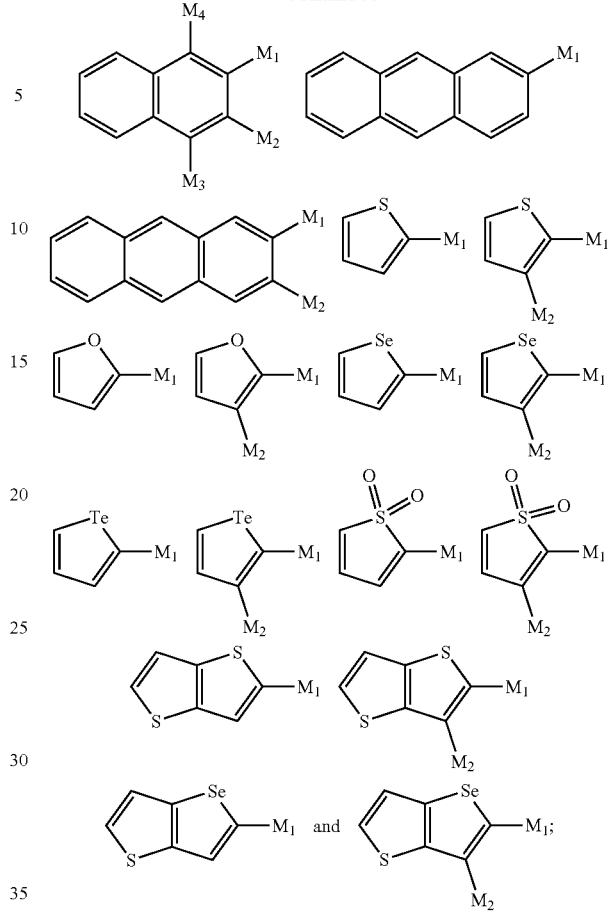

$M_1$-$M_4$ are individually selected from the group consisting of hydrogen, fluorine, chlorine, bromine, iodine, astatine, and a cyano group, wherein at least one of $M_1$-$M_4$ is a halogen;

each X is individually selected from the group consisting of S, NR, Se, Te, and O;

each R is individually a $C_1$-$C_{20}$ hydrocarbon or an aromatic hydrocarbon;

each Y is individually selected from the group consisting of:

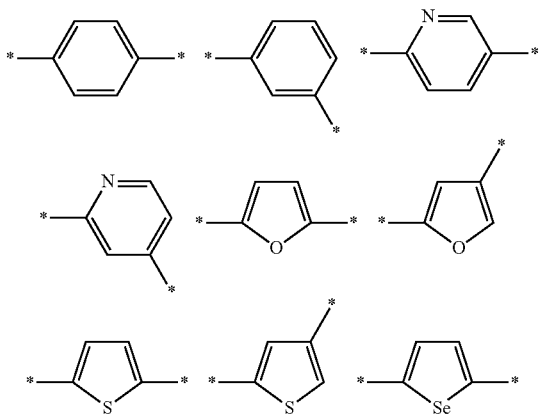

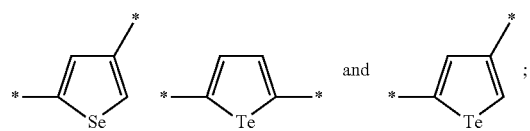
each m is an integer from 0 to 10; and
each n is an integer from 0 to 10.
In one aspect, the disclosure provides a cathode buffer material of one of
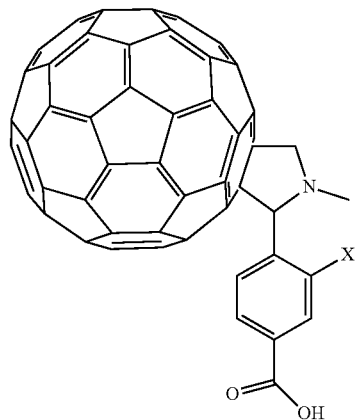
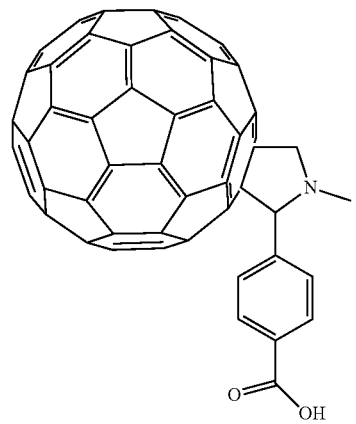
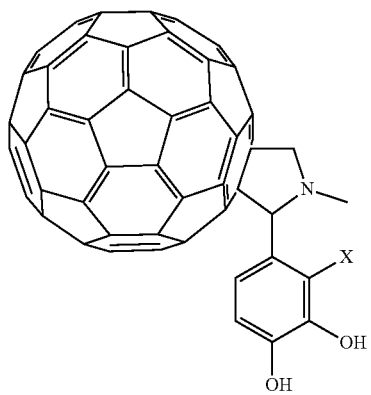
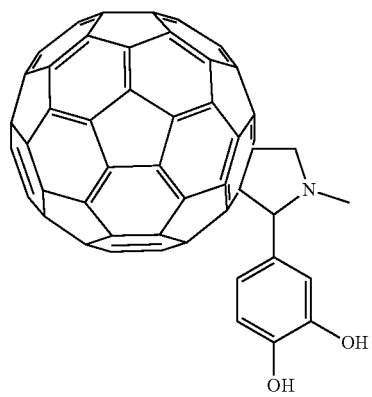
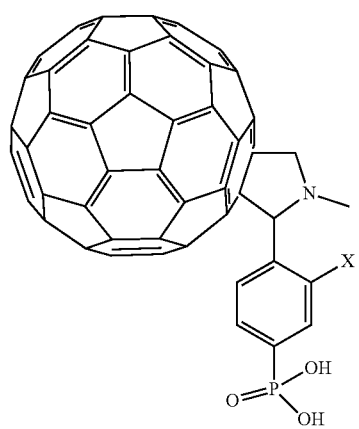
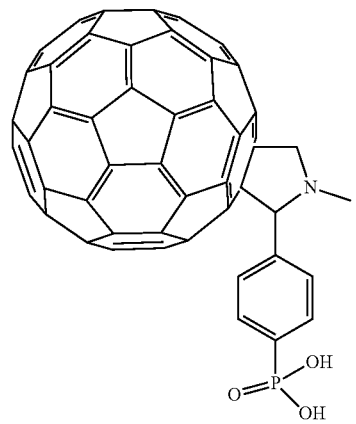
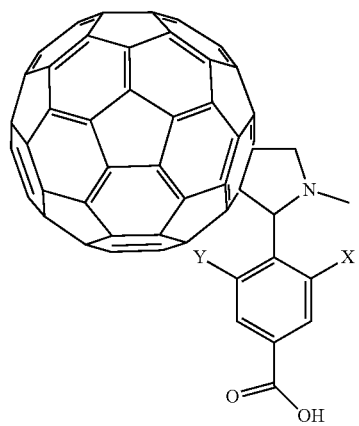

-continued
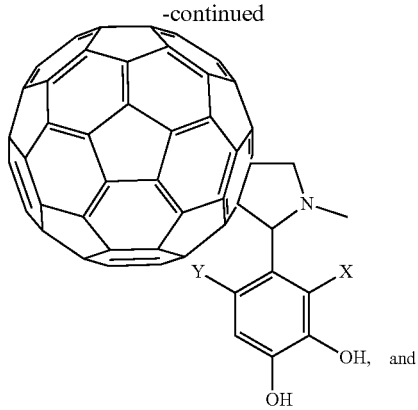
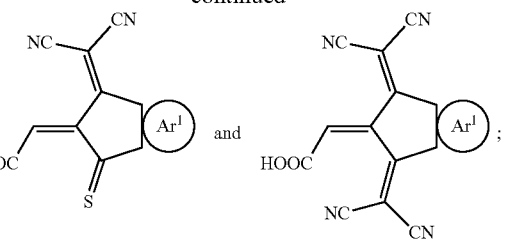
each Ar¹ is independently selected from the group consisting of:
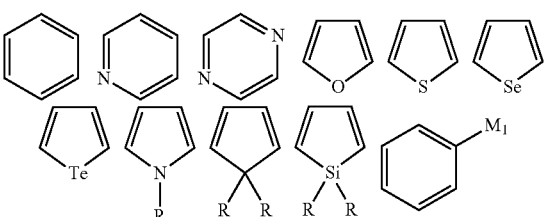
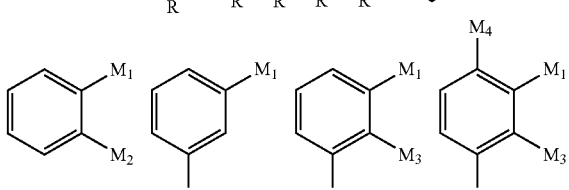
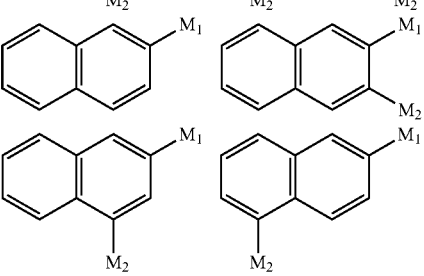
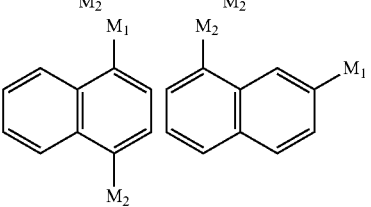
wherein each X is individually selected from the group consisting of oxygen, carbon, hydrogen, sulfur, selenium, and nitrogen;
each Y is individually selected from the group consisting of:
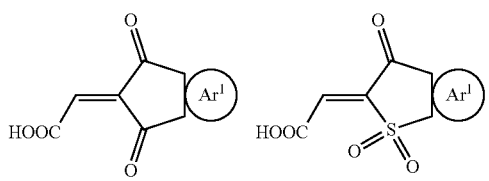
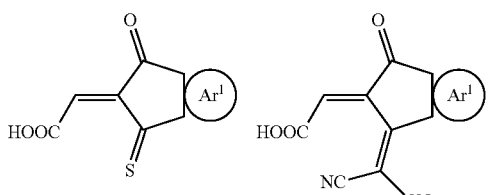
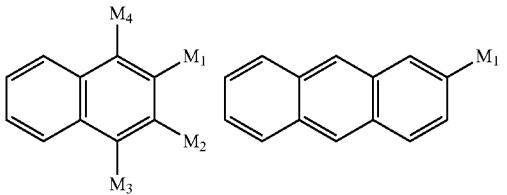
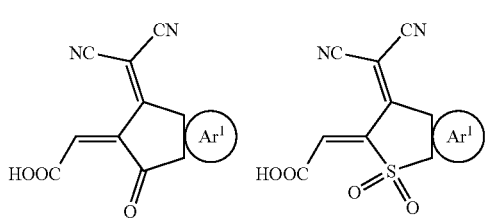
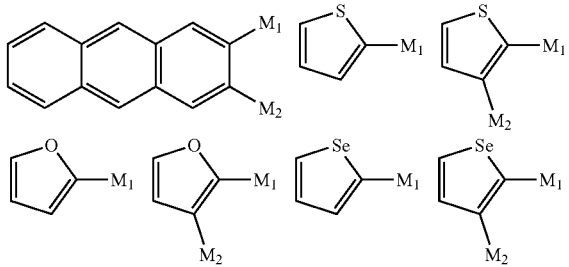

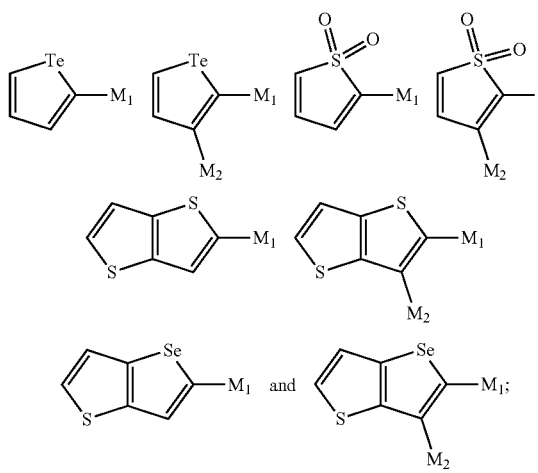

$M_1$-$M_4$ are each independently selected from the group consisting of hydrogen, fluorine, chlorine, bromine, iodine, astatine, and a cyano group, wherein at least one of $M_1$-$M_4$ is a halogen; and each R is independently a $C_1$-$C_{20}$ hydrocarbon or an aromatic hydrocarbon.

In one aspect, the disclosure provides a cathode buffer material comprising a group selected from:

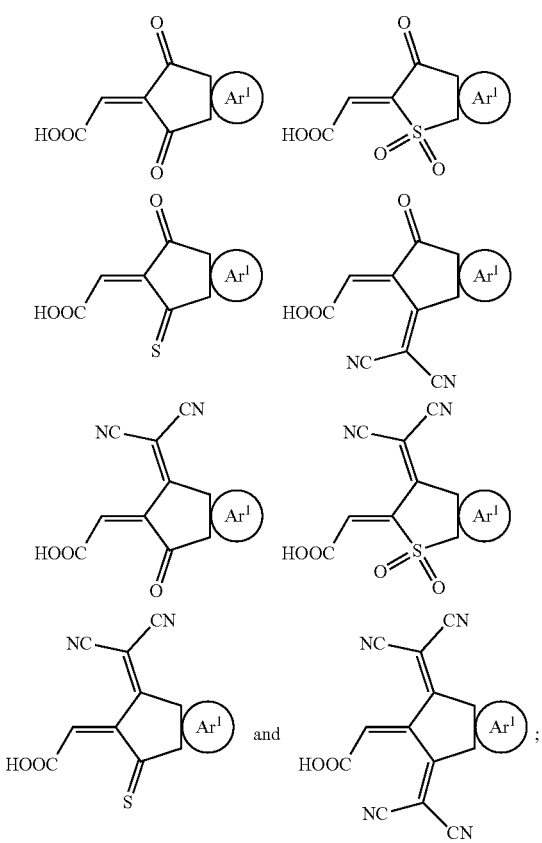

wherein each $Ar^1$ is independently selected from the group consisting of:

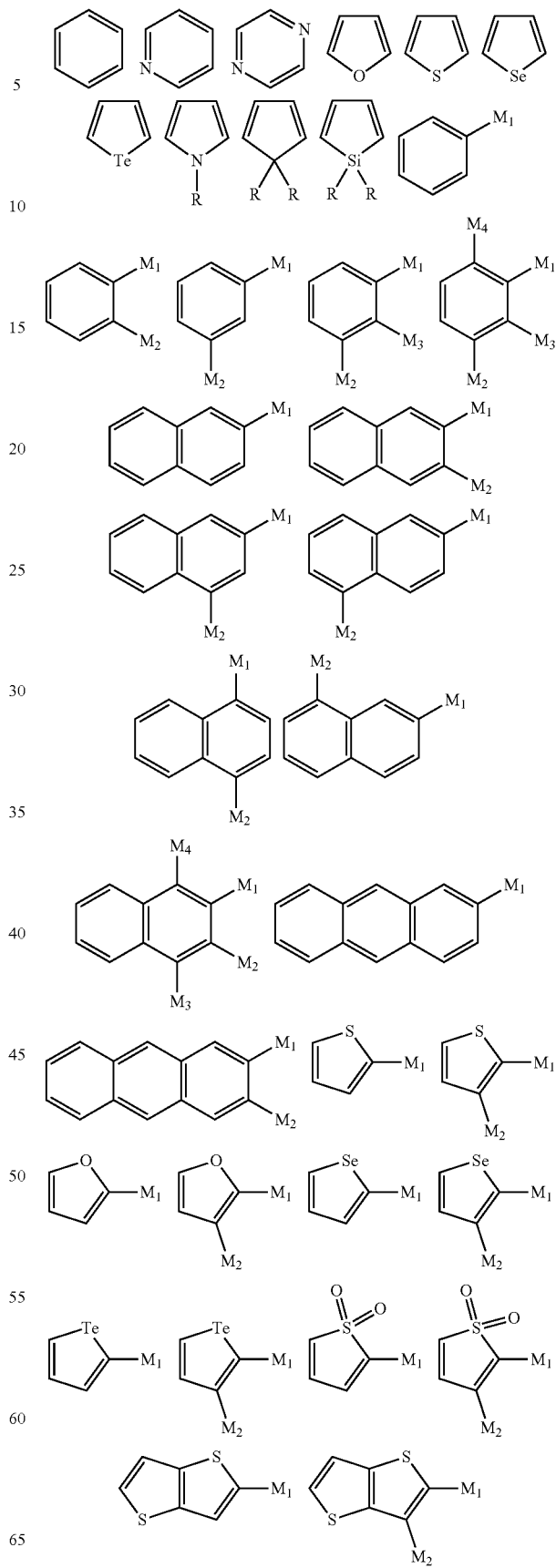

-continued

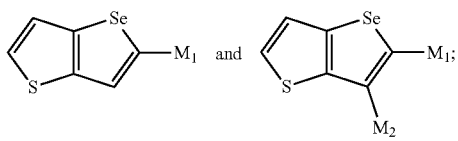

$M_1$-$M_4$ are each independently selected from the group consisting of hydrogen, fluorine, chlorine, bromine, iodine, astatine, and a cyano group, wherein at least one of $M_1$-$M_4$ is a halogen; and each R is independently a $C_1$-$C_{20}$ hydrocarbon or an aromatic hydrocarbon.

In one aspect, the disclosure provides an anode buffer material of one of:

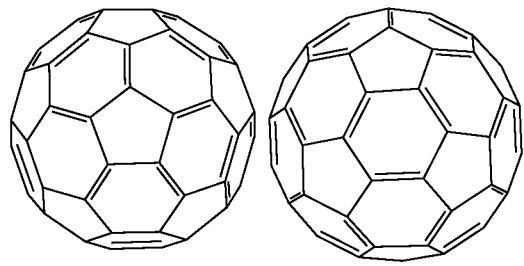

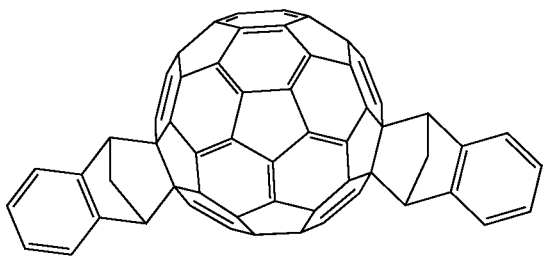

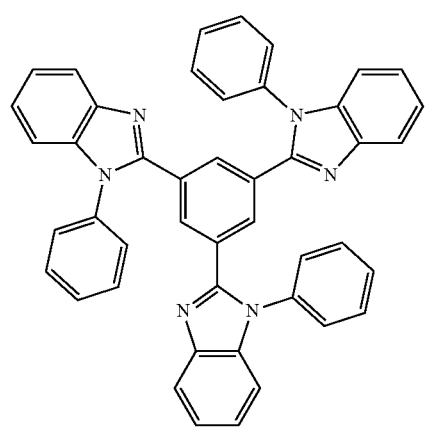

-continued

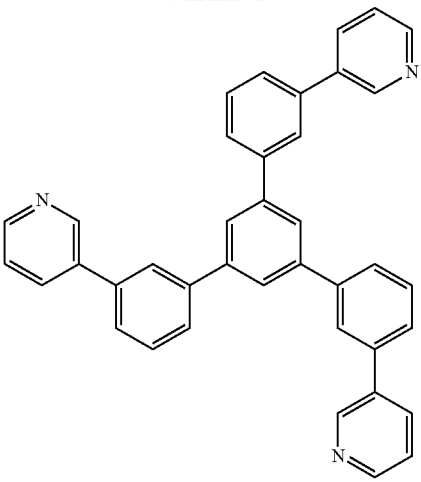

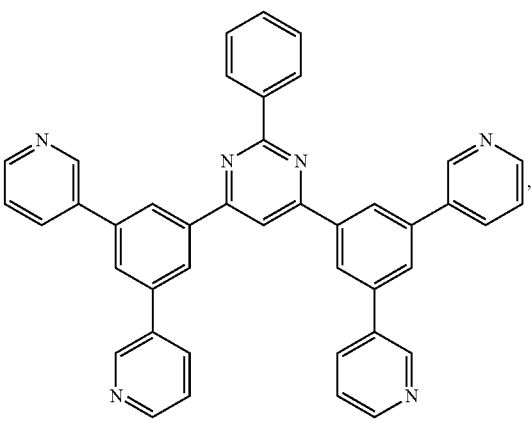

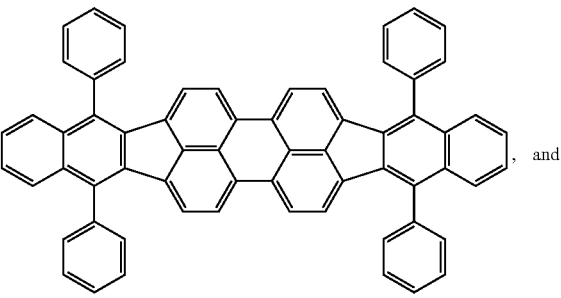, and

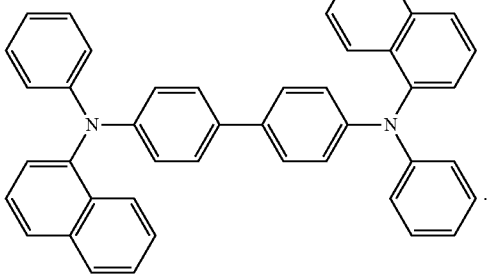.

In one aspect, the disclosure provides an organic photovoltaic device comprising an anode, cathode, an organic layer disposed between the anode and cathode, and at least one of an anode buffer of the disclosure and a cathode buffer of the disclosure, wherein the organic layer comprises an acceptor comprising one of the Formulae (I)-(VI):

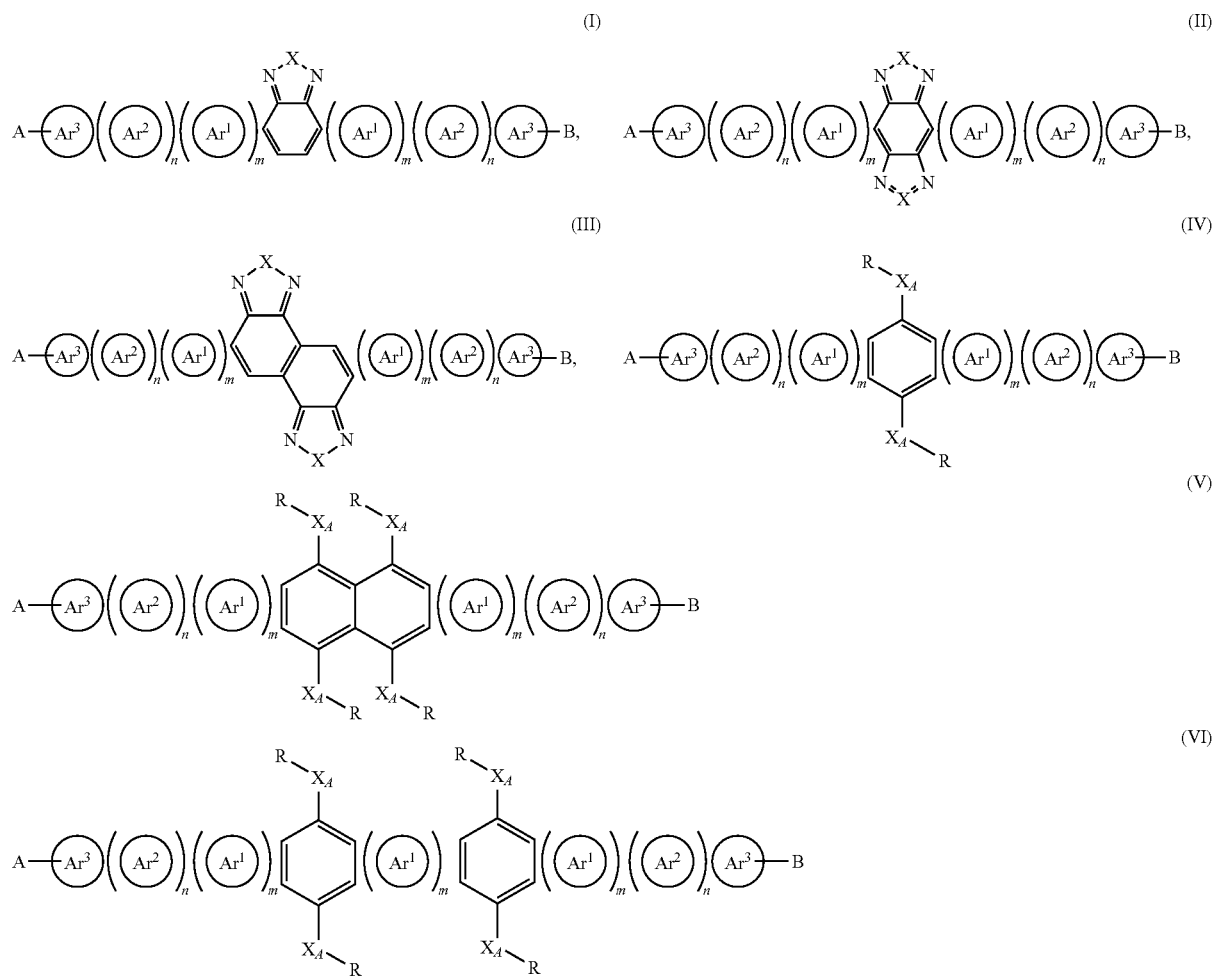
wherein:
A and B are individually selected from the group consisting of:
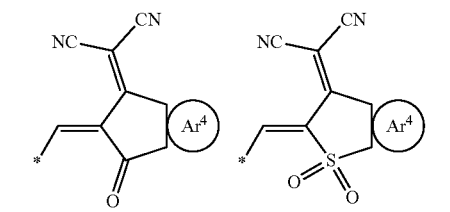
 and
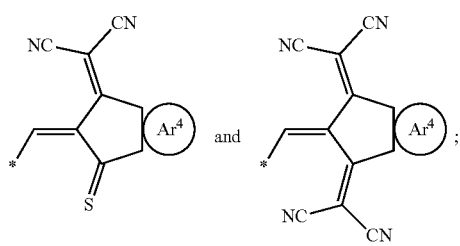
each Ar¹ is individually selected from the group consisting of:
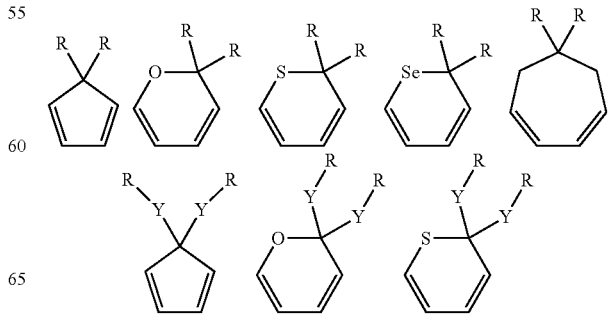
each Ar² is individually selected from the group consisting of:

-continued

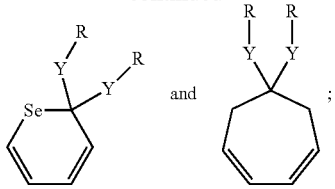

each Ar³ is individually selected from the group consisting of:

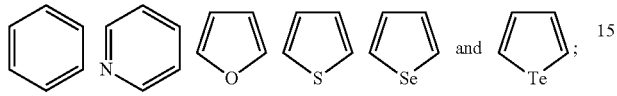

each Ar⁴ is individually selected from the group consisting of:

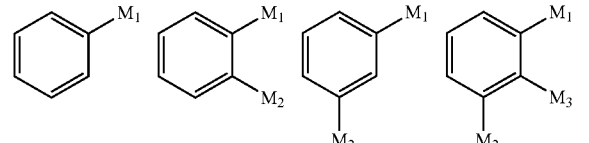

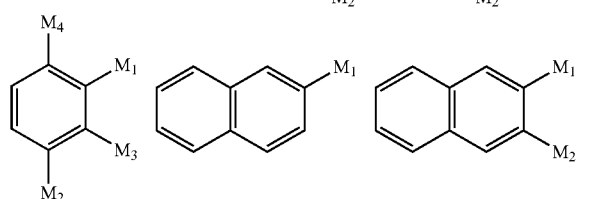

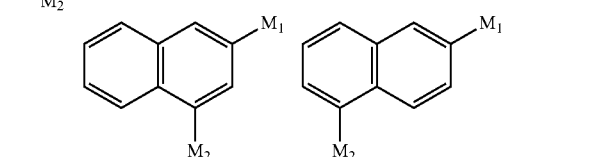

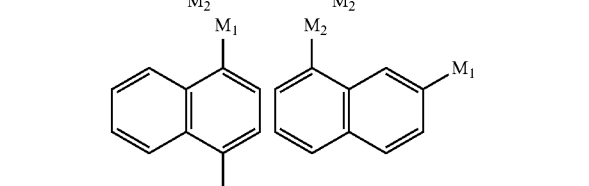

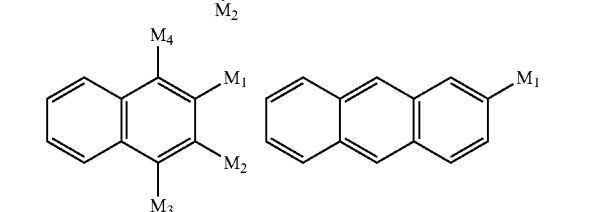

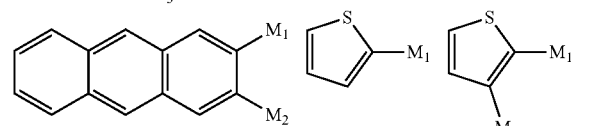

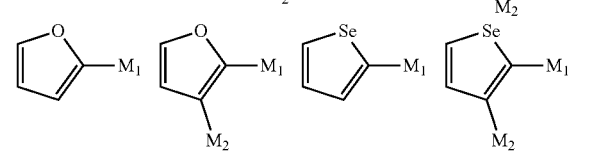

-continued

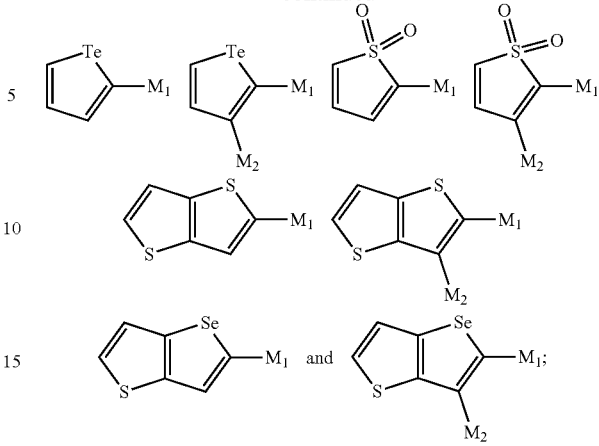

$M_1$-$M_4$ are individually selected from the group consisting of hydrogen, fluorine, chlorine, bromine, iodine, astatine, and a cyano group, wherein at least one of $M_1$-$M_4$ is a halogen;

each X is individually selected from the group consisting of S, NR, Se, Te, and O;

each $X_A$ is individually selected from the group consisting of CRR, O, S, Se and NR;

each R is individually a $C_1$-$C_{20}$ hydrocarbon or an aromatic hydrocarbon;

each Y is individually selected from the group consisting of:

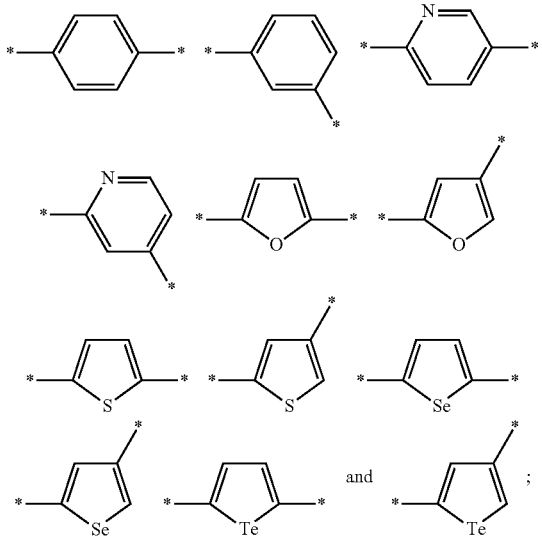

each m is an integer from 0 to 10; and
each n is an integer from 0 to 10.

An OPV comprising the compound of the present disclosure is also disclosed.

BRIEF DESCRIPTION OF THE DRAWINGS

For a more complete understanding of the disclosure, reference is made to the following detailed description and accompanying drawing figures, in which like reference numerals may be used to identify like elements in the figures.

FIG. 2 depicts an example of various layers of a tandem or multi junction OPV device.

FIG. 3, comprising FIG. 3A depicts the molecular structural formulae of BT-IC and BT-CIC. FIG. 3B depicts the UV-Vis absorption spectra of PCE-10:BT-CIC thin films with and without aging under 1 sun illumination. FIG. 3C depicts in-plane (IP, dotted line) and out-of-plane (OOP, solid line) grazing incidence x-ray diffraction patterns of PCE-10:BT-IC blend. FIG. 3D depicts in-plane (IP, dotted line) and out-of-plane (OOP, solid line) grazing incidence x-ray diffraction patterns of PCE-10:BT-CIC blend.

DETAILED DESCRIPTION

Figure 1:
FIG. 1 depicts an example of various layers of a single junction solar cell or organic photovoltaic (OPV) device.
Figure 3A:
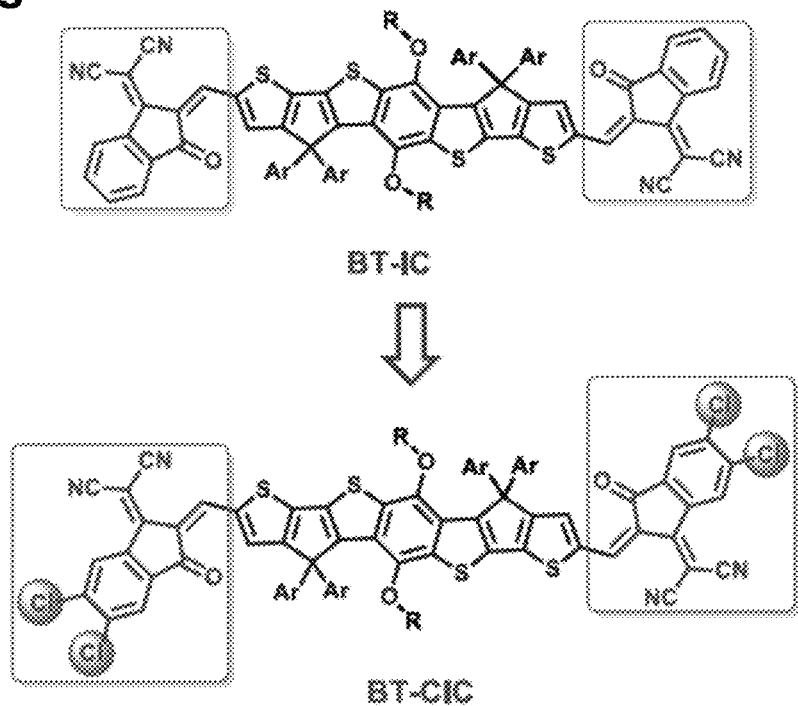
FIG. 3A through FIG. 3D, depicts experimental results of compounds BT-IC and BT-CIC.
Figure 3B:
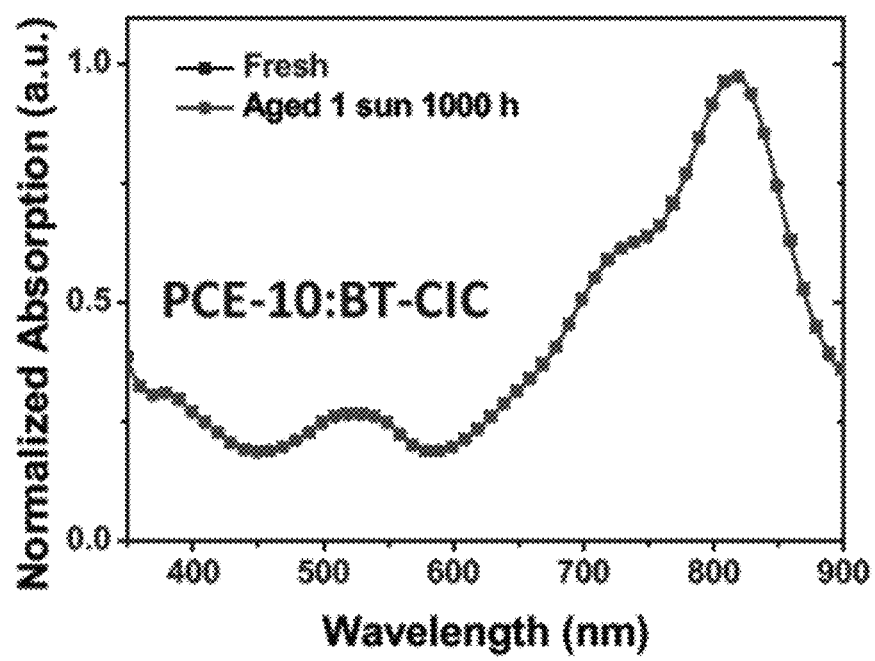
Figure 3C:
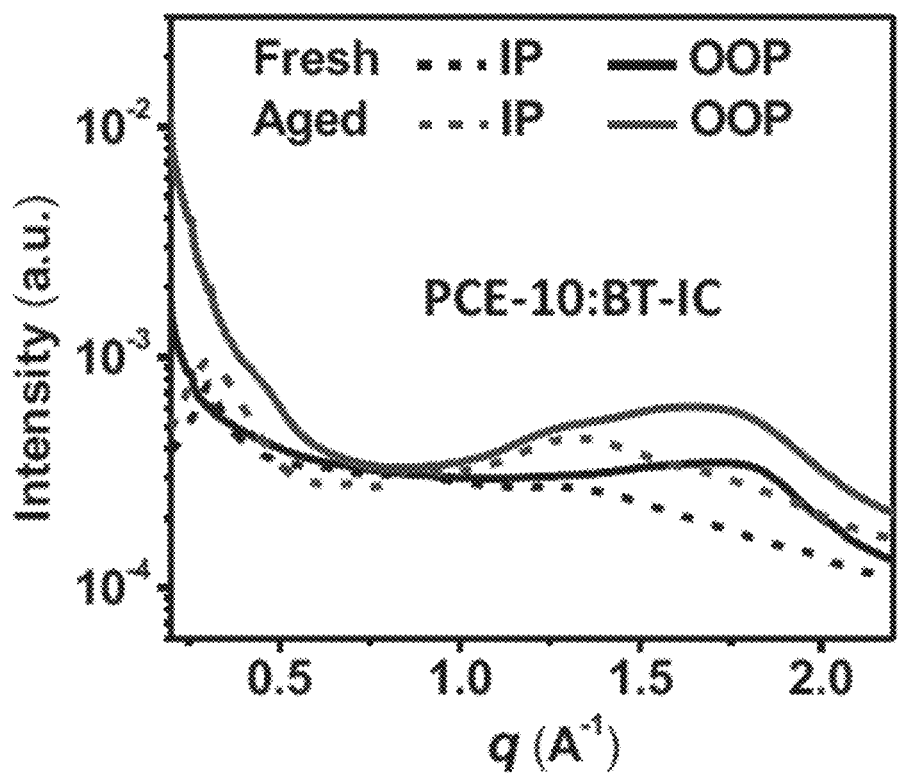
Figure 3D:
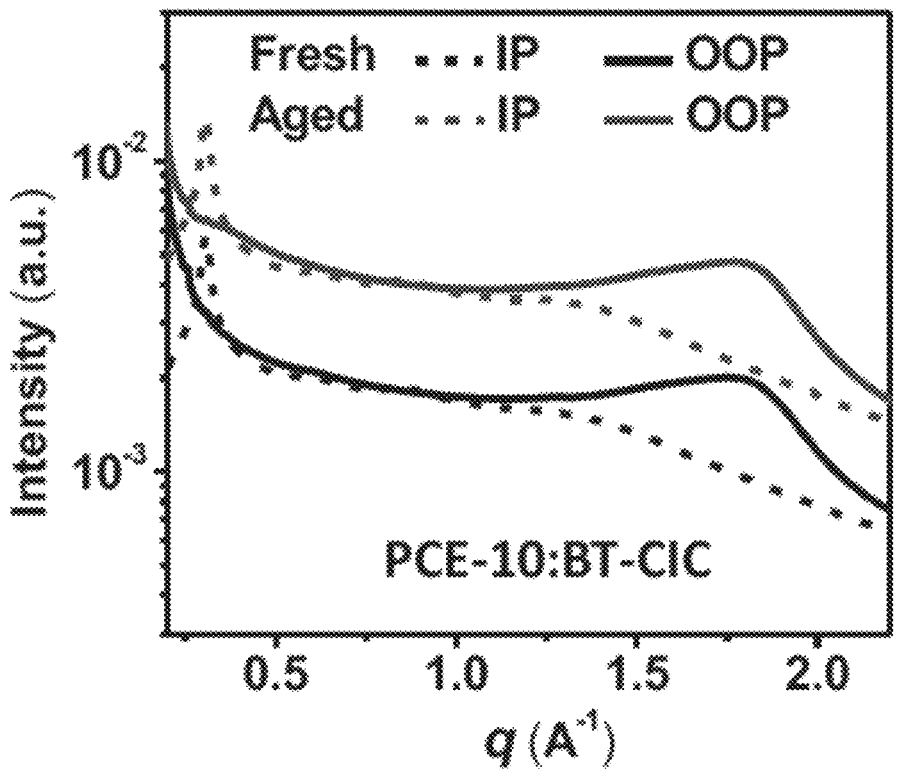

The disclosure provides non-fullerene acceptors (NFAs) with good photostability and morphological stability. In some aspects, employing these NFAs in the one or more device architectures, OPV device is achieved with improved the operational lifetime.

Various non-limiting examples of OPVs and compositions within various layers of an OPV are described in greater detail below.

Definitions

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class Small molecules may also be incorporated into polymers, for example as a pendent group on a polymer backbone or as a part of the backbone Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, the terms "electrode" and "contact" may refer to a layer that provides a medium for delivering current to an external circuit or providing a bias current or voltage to the device. For example, an electrode, or contact, may provide the interface between the active regions of an organic photosensitive optoelectronic device and a wire, lead, trace or other means for transporting the charge carriers to or from the external circuit. Examples of electrodes include anodes and cathodes, which may be used in a photosensitive optoelectronic device.

As used herein, the term "transparent" may refer to a material that permits at least 50% of the incident electromagnetic radiation in relevant wavelengths to be transmitted through it. In a photosensitive optoelectronic device, it may be desirable to allow the maximum amount of ambient electromagnetic radiation from the device exterior to be admitted to the photoconductive active interior region. That is, the electromagnetic radiation must reach a photoconductive layer(s), where it can be converted to electricity by photoconductive absorption. This often dictates that at least one of the electrical contacts or electrodes should be minimally absorbing and minimally reflecting of the incident electromagnetic radiation. In some cases, such a contact should be transparent or at least semi-transparent. In one embodiment, the transparent material may form at least part of an electrical contact or electrode.

As used herein, the term "semi-transparent" may refer to a material that permits some, but less than 50% transmission of ambient electromagnetic radiation in relevant wavelengths. Where a transparent or semi-transparent electrode is used, the opposing electrode may be a reflective material so that light which has passed through the cell without being absorbed is reflected back through the cell.

As used and depicted herein, a "layer" refers to a member or component of a device, for example an optoelectronic device, being principally defined by a thickness, for example in relation to other neighboring layers, and extending outward in length and width. It should be understood that the term "layer" is not necessarily limited to single layers or sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s) Similarly, it should also be understood that a layer may be discontinuous, such that the continuity of said layer along the length and width may be disturbed or otherwise interrupted by other layer(s) or material(s).

As used herein, a "photoactive region" refers to a region of a device that absorbs electromagnetic radiation to generate excitons. Similarly, a layer is "photoactive" if it absorbs electromagnetic radiation to generate excitons. The excitons may dissociate into an electron and a hole in order to generate an electrical current.

As used herein, the term "cathode buffer" is given its ordinary meaning in the art and generally refers to a material which is disposed between a cathode and a photoactive material. Generally, a cathode buffer material aids in reducing the work function of the cathode interface. Those of ordinary skill in the art will be able to select suitable cathode buffer materials with appropriate work functions for use in the methods and devices described herein.

As used herein, the term "anode buffer" is given its ordinary meaning in the art and generally refers to a material which is disposed between a anode and a photoactive material. Generally, a anode buffer material aids in reducing the work function of the anode interface. Those of ordinary skill in the art will be able to select suitable anode buffer materials with appropriate work functions for use in the methods and devices described herein.

As used herein, the terms "donor" and "acceptor" refer to the relative positions of the highest occupied molecular orbital ("HOMO") and lowest unoccupied molecular orbital ("LUMO") energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

As used herein, the term "band gap" ($E_g$) of a polymer may refer to the energy difference between the HOMO and the LUMO. The band gap is typically reported in electron volts (eV). The band gap may be measured from the UV-vis spectroscopy or cyclic voltammetry. A "low band gap" polymer may refer to a polymer with a band gap below 2 eV, e.g., the polymer absorbs light with wavelengths longer than 620 nm.

As used herein, the term "excitation binding energy" ($E_B$) may refer to the following formula: $E_B=(M^++M)-(M^*+M)$, where $M^+$ and $M^-$ are the total energy of a positively and negatively charged molecule, respectively; $M^*$ and $M$ are the molecular energy at the first singlet state (Si) and ground state, respectively. Excitation binding energy of acceptor or donor molecules affects the energy offset needed for efficient exciton dissociation. In certain examples, the escape yield of a hole increases as the HOMO offset increases. A decrease of exciton binding energy $E_B$ for the acceptor molecule leads to an increase of hole escape yield for the same HOMO offset between donor and acceptor molecules.

As used herein, "power conversion efficiency" (PCE) ($\eta_p$) may be expressed as:

$$\eta_p = \frac{V_{OC}*FF*J_{SC}}{P_O}$$

wherein $V_{OC}$ is the open circuit voltage, FF is the fill factor, $J_{SC}$ is the short circuit current, and Po is the input optical power.

As used herein, "spin coating" may refer to the process of solution depositing a layer or film of one material (i.e., the coating material) on a surface of an adjacent substrate or layer of material. The spin coating process may include applying a small amount of the coating material on the center of the substrate, which is either spinning at low speed or not spinning at all. The substrate is then rotated at high speed in order to spread the coating material by centrifugal force. Rotation is continued while the fluid spins off the edges of the substrate, until the desired thickness of the film is achieved. The applied solvent is usually volatile, and simultaneously evaporates. Therefore, the higher the angular speed of spinning, the thinner the film. The thickness of the film also depends on the viscosity and concentration of the solution and the solvent.

As used herein, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Because ionization potentials (IP) are measured as a negative energy relative to a vacuum level, a higher HOMO energy level corresponds to an IP having a smaller absolute value (an IP that is less negative) Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

Details on OLEDs, and the definitions described above, can be found in U.S. Pat. No. 7,279,704, which is incorporated herein by reference in its entirety.

The terms "halo," "halogen," and "halide" are used interchangeably and refer to fluorine, chlorine, bromine, and iodine.

The term "acyl" refers to a substituted carbonyl radical ($C(O)-R_s$).

The term "ester" refers to a substituted oxycarbonyl ($-O-C(O)-R_s$ or $-C(O)-O-R_s$) radical.

The term "ether" refers to an $-OR_s$ radical.

The terms "sulfanyl" or "thio-ether" are used interchangeably and refer to a $-SR_s$ radical.

The term "sulfinyl" refers to a $-S(O)-R_s$ radical.

The term "sulfonyl" refers to a $-SO_2-R_s$ radical.

The term "phosphino" refers to a $-P(R_s)_3$ radical, wherein each R can be same or different.

The term "silyl" refers to a $-Si(R_s)_3$ radical, wherein each $R_s$ can be same or different.

The term "boryl" refers to a $-B(R_s)_2$ radical or its Lewis adduct $-B(Rs)_3$ radical, wherein Rs can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group is optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo [3.1.1]heptyl, spiro[4.5]decyl, spiro[5.5]undecyl, adamantyl, and the like. Additionally, the cycloalkyl group is optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group is optionally substituted.

The term "alkenyl" refers to and includes both straight and branched chain alkene radicals. Alkenyl groups are essentially alkyl groups that include at least one carbon-carbon double bond in the alkyl chain Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group is optionally substituted.

The term "alkynyl" refers to and includes both straight and branched chain alkyne radicals. Preferred alkynyl groups are those containing two to fifteen carbon atoms. Additionally, the alkynyl group is optionally substituted.

The terms "aralkyl" or "arylalkyl" are used interchangeably and refer to an alkyl group that is substituted with an aryl group. Additionally, the aralkyl group is optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group is optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group is optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof.

In some instances, the preferred general substituents are selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof.

In some instances, the preferred general substituents are selected from the group consisting of deuterium, fluorine, alkyl, cycloalkyl, alkoxy, aryloxy, amino, silyl, aryl, heteroaryl, sulfanyl, and combinations thereof.

In yet other instances, the more preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon or nitrogen. For example, when R' represents mono-substitution, then one R' must be other than H (i.e., a substitution) Similarly, when R' represents di-substitution, then two of R' must be other than H Similarly, when R' represents no substitution, R', for example, can be a hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective aromatic ring can be replaced by a nitrogen atom, for example, and without any limitation, azatriphenylene encompasses both dibenzo[f,h]quinoxaline and dibenzo quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., *Tetrahedron* 2015, 71, 1425-30 and Atzrodt et al., *Angew. Chem. Int. Ed.* (Reviews) 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In some instance, a pair of adjacent substituents can be optionally joined or fused into a ring. The preferred ring is a five, six, or seven-membered carbocyclic or heterocyclic ring, includes both instances where the portion of the ring formed by the pair of substituents is saturated and where the portion of the ring formed by the pair of substituents is unsaturated. As used herein, "adjacent" means that the two substituents involved can be on the same ring next to each other, or on two neighboring rings having the two closest available substitutable positions, such as 2, 2' positions in a biphenyl, or 1, 8 position in a naphthalene, as long as they can form a stable fused ring system.

Non-Fullerene Acceptors

In one embodiment, the disclosure provides a non-fullerene acceptor (NFA). In one embodiment, the NFA comprises one of Formulae (I)-(III):

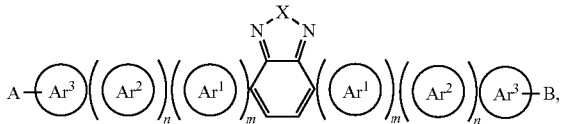

(I)

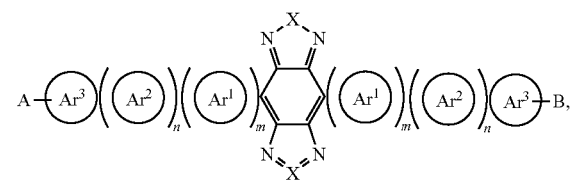

(II)

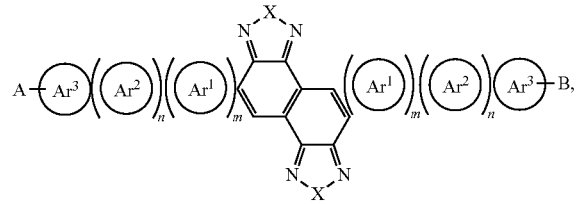

(III)

wherein:

A and B are individually selected from the group consisting of:

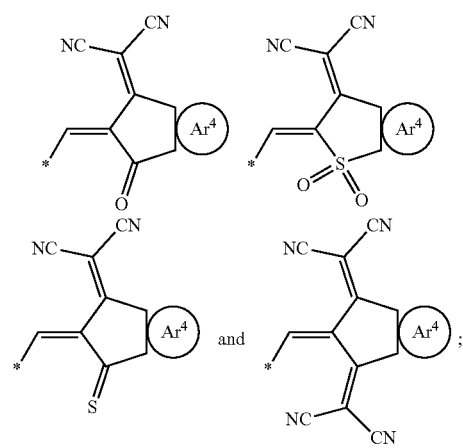

each $Ar^1$ is individually selected from the group consisting of:

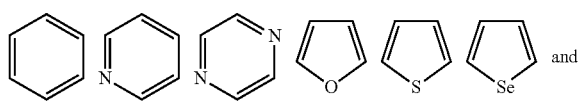

-continued

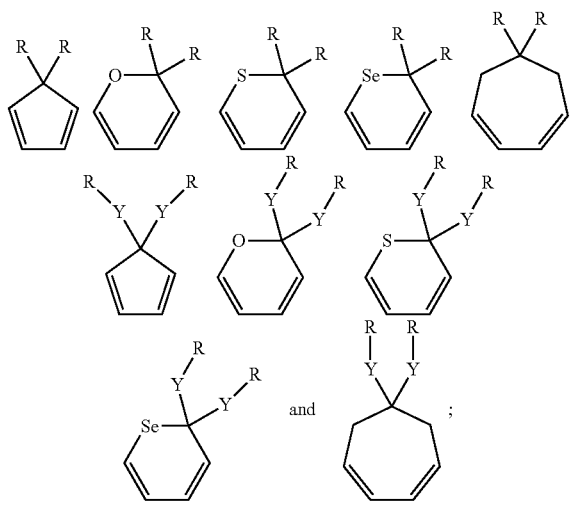

each Ar² is individually selected from the group consisting of:

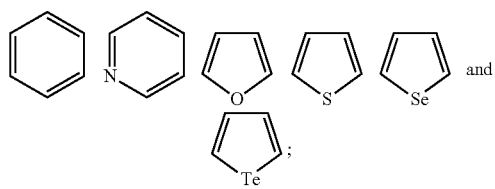

each Ar³ is individually selected from the group consisting of:

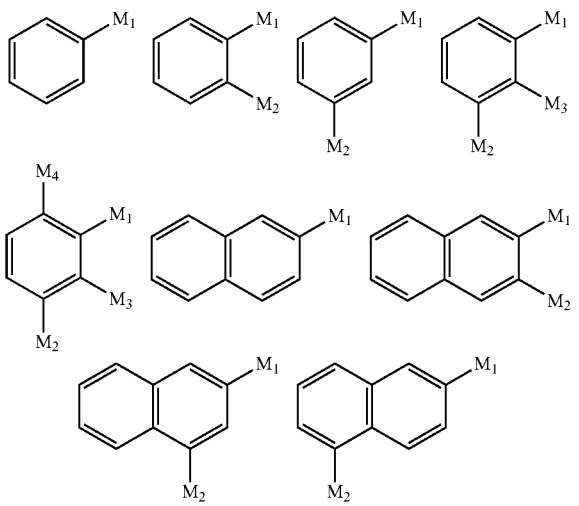

each Ar⁴ is individually selected from the group consisting of:

-continued

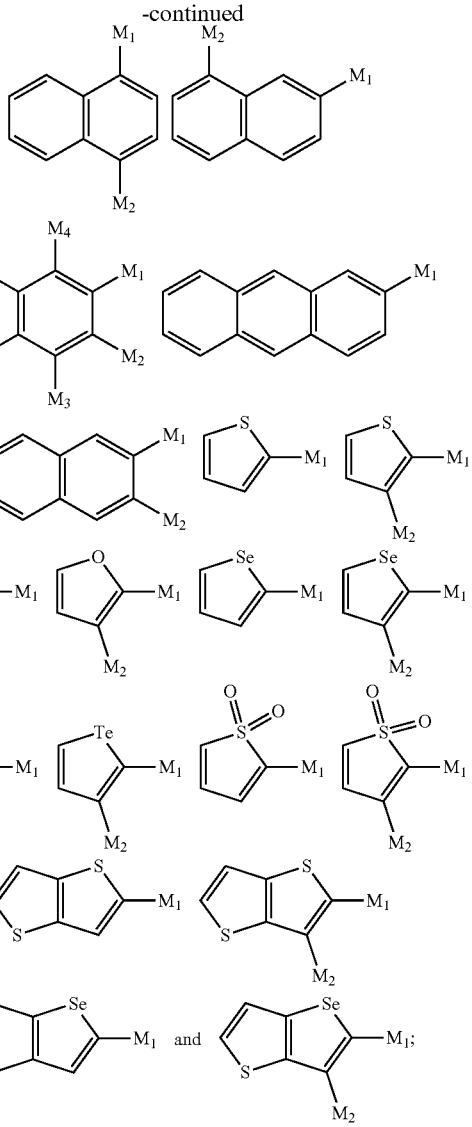

$M_1$-$M_4$ are individually selected from the group consisting of hydrogen, fluorine, chlorine, bromine, iodine, astatine, and a cyano group, wherein at least one of $M_1$-$M_4$ is a halogen;

each X is individually selected from the group consisting of S, NR, Se, Te, and O;

each R is individually a $C_1$-$C_{20}$ hydrocarbon or an aromatic hydrocarbon;

each Y is individually selected from the group consisting of:

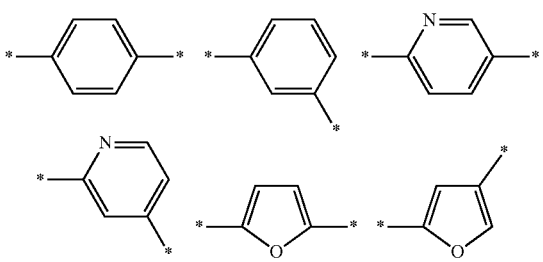

-continued

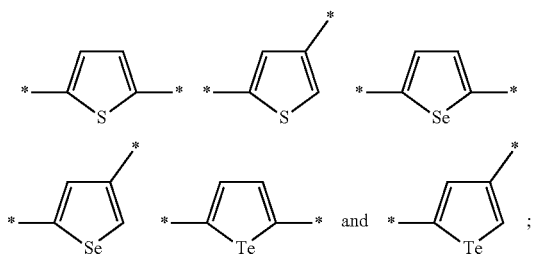

each m is an integer from 0 to 10; and
each n is an integer from 0 to 10.

In one embodiment, each $Ar^1$ is

In one embodiment, each $Ar^3$ is

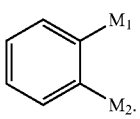

In one embodiment, $Ar^4$ is:

In one embodiment, at least one of $M_1$-$M_4$ is chloride.

In one embodiment, each R is selected from the group consisting of:

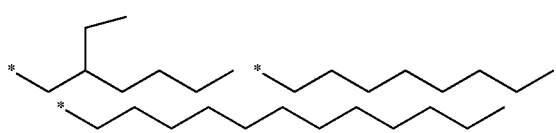

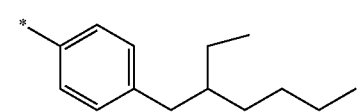

and

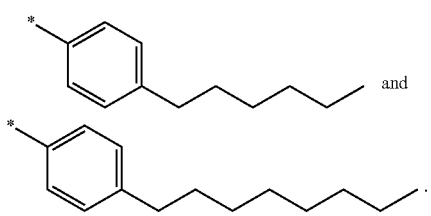

In one embodiment, each R is 2-ethylhexyl.
In one embodiment, each Y is

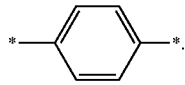

In one embodiment, the aromatic groups $Ar^1$ and $Ar^2$ may be repeated (or may not present at all). For example, each m may be an integer from 0 to 10, from 0 to 5, from 0 to 3, from 1 to 3, from 1 to 2, or 1; and each n may be an integer from 0 to 10, from 0 to 5, from 0 to 3, from 1 to 3, from 1 to 2, or 1. In certain examples, the aromatic groups $Ar^1$, $Ar^2$, and $Ar^3$, in combination with benzene ring(s) within the non-fullerene acceptor may provide a coplanar ring structure having a conjugation length of seven to fifteen rings. In other terms, the overall length of the non-fullerene acceptor may be at least 20 angstroms, 25 angstroms, 30 angstroms, 35 angstroms, 40 angstroms, 50 angstroms, or between 20-50 angstroms, 25-40 angstroms, or 25-35 angstroms.

In one embodiment, each X substituent may individually be selected from the group consisting of: oxygen, carbon, hydrogen, sulfur, selenium, and nitrogen.

In one embodiment, Y may include an aryl group or an aromatic hydrocarbon. For example, in one embodiment, Y may include benzene attached to a R substituent (e.g., a hydrocarbon chain at the para position). Alternatively, in one embodiment, Y may include a five-membered cyclic ring attached to a R substituent (e.g., a hydrocarbon chain), wherein one carbon atom of the cyclic ring has been replaced by a chalcogen such as oxygen, sulfur, selenium, or tellurium.

In one embodiment, Y—R is selected from the group consisting of

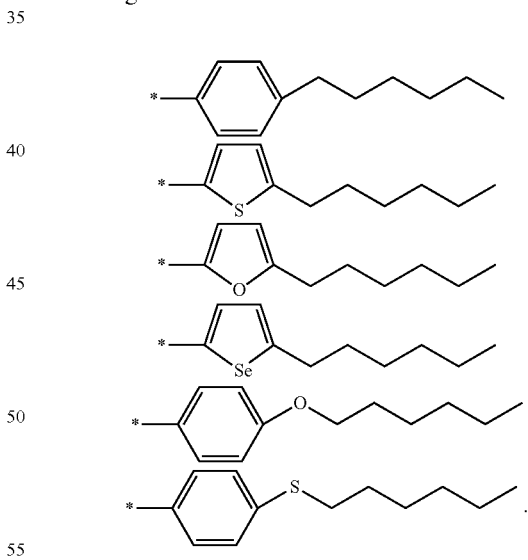

In one embodiment, each R substituent (attached to X or Y within the non-fullerene acceptor compounds) may individually be a linear or branched saturated or unsaturated non-aromatic hydrocarbon in the $C_1$-$C_{20}$ range. Non-limiting examples include methyl, ethyl, n-propyl, isopropyl, isobutyl, n-butyl, sec-butyl, tert-butyl, isopentyl, n-pentyl, neopentyl, n-hexyl, and 2-ethylhexyl. In one particular example, R represents 2-ethylhexyl. In one embodiment, each R substituent may be a substituted hydrocarbon wherein the carbon at the 1-position is replaced with oxygen or sulfur, for example.

In one embodiment, R includes an unsaturated 5- or 6-membered ring (substituted or not-substituted) (e.g., thiophene or benzene) attached to a hydrocarbon (e.g., at the para position of benzene). In one embodiment, R includes an aryl group or an aromatic hydrocarbon In one embodiment, each A and B is individually selected from the group consisting of:

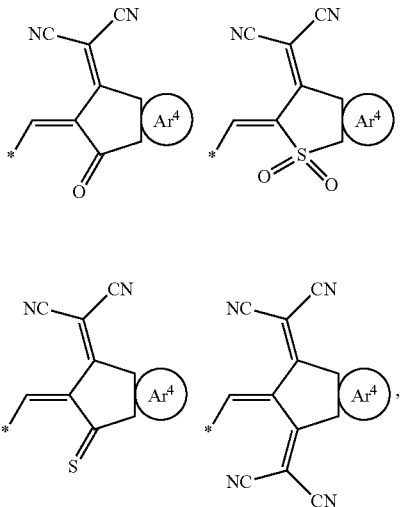

wherein $Ar^4$ is an aromatic group.

In one embodiment, A, B, or both A and B is

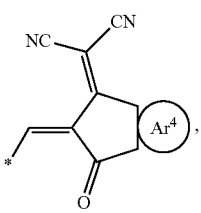

wherein $Ar^4$ is an aromatic group. In one embodiment, A, B, or both A and B is wherein $Ar^4$ is an aromatic group.

In one embodiment, $Ar^4$ is an aromatic group having at least one halogen (e.g., fluorine, chlorine, bromine, iodine, or astatine) substituent attached to the aromatic ring.

In the possible substituents for A or B, $M_1$-$M_4$ may individually be selected from the group consisting of hydrogen, fluorine, chlorine, bromine, iodine, astatine, and cyano groups. In certain examples, at least one M substituent is a halogen (e.g., fluorine, chlorine, bromine, iodine, or astatine). In other examples, each M substituent is a halogen. In certain examples, at least one M substituent is chlorine. In other examples, each M substituent is chlorine.

The electron-withdrawing halogen (e.g., Cl) atoms are advantageous as they effectively lower the energy gap by enhancing the intramolecular charge transfer and delocalization of π-electrons into the unoccupied, atomic 3d orbitals. Moreover, the intermolecular interactions of Cl—S and Cl—Cl result in ordered molecular stacks in the donor-acceptor blend films.

In one embodiment, the acceptor of formula (I) is an acceptor of formula (Ia), (Ib), (IIIa) or (IIIb):

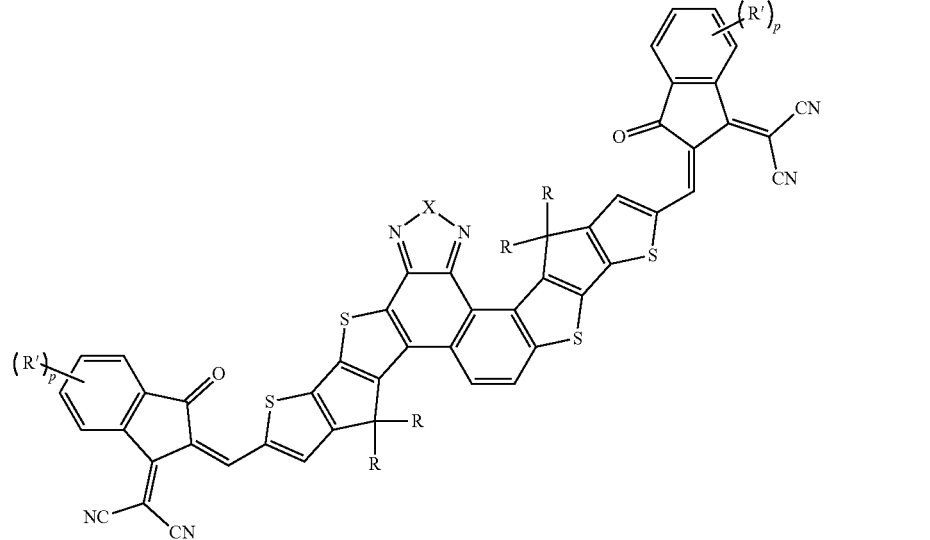

(Ia)

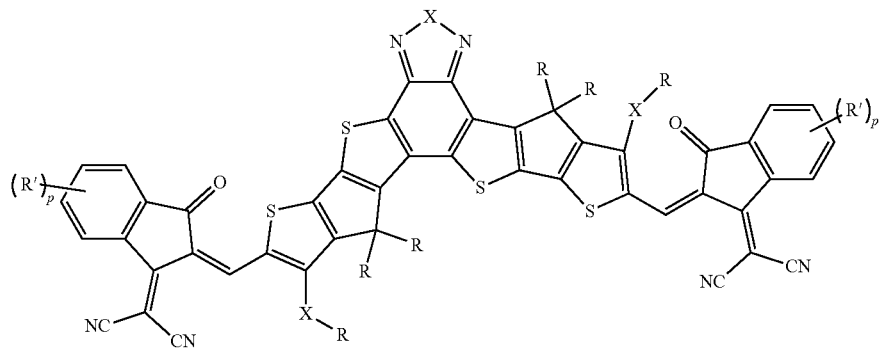
(Ib)
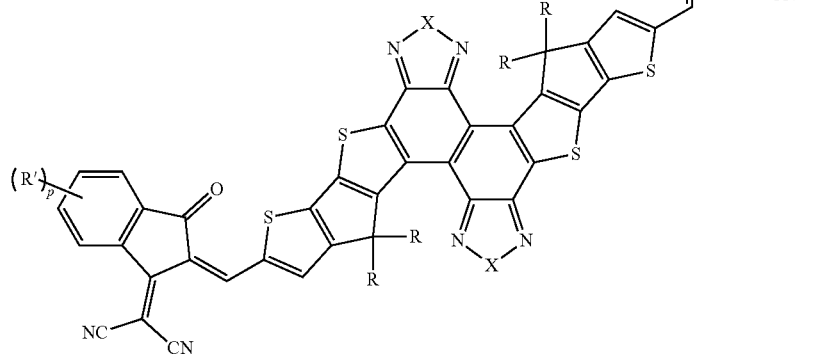
(IIIa)
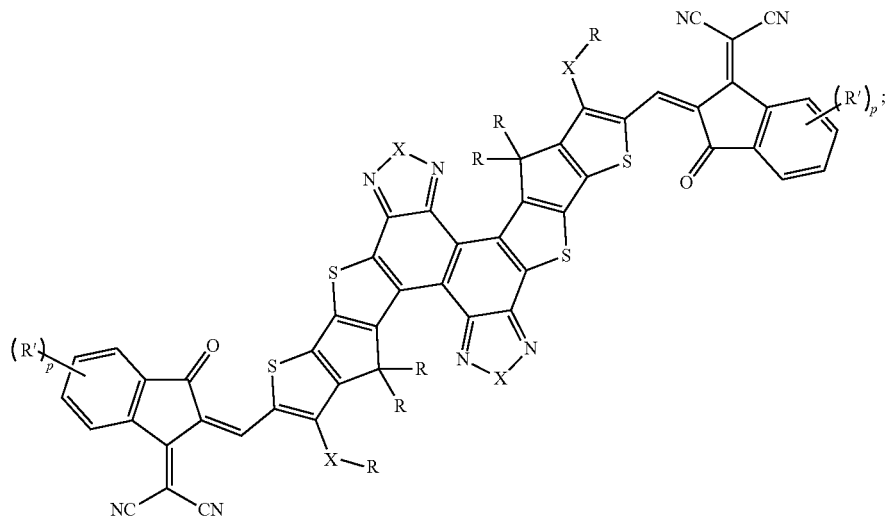
(IIIb)
wherein:
  each X is independently selected from the group consisting of S, NR, Se, Te, and O;
  each R is independently selected from a $C_1$-$C_{20}$ hydrocarbon, an aromatic hydrocarbon wherein the hydrocarbon, and aromatic hydrocarbon are each optionally substituted;
  each R' is independently a halogen; and
  each p is independently an integer from 0-4.

In one embodiment, the acceptor is selected from the group consisting of:
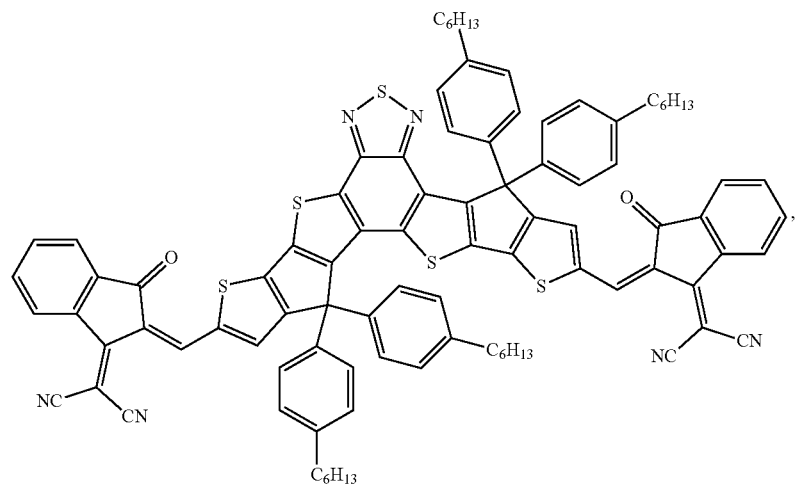
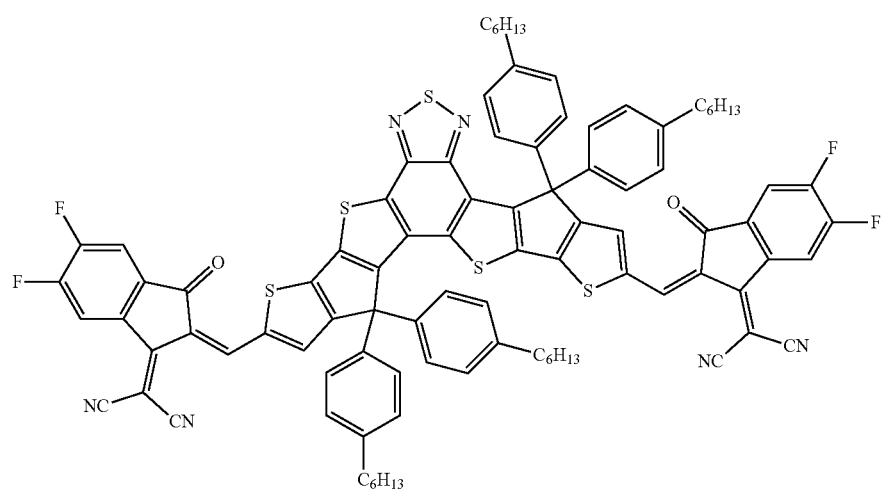
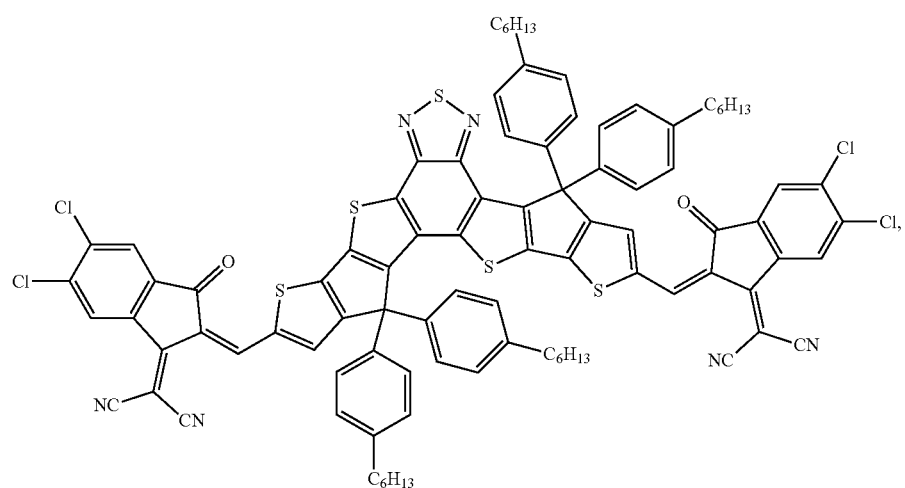

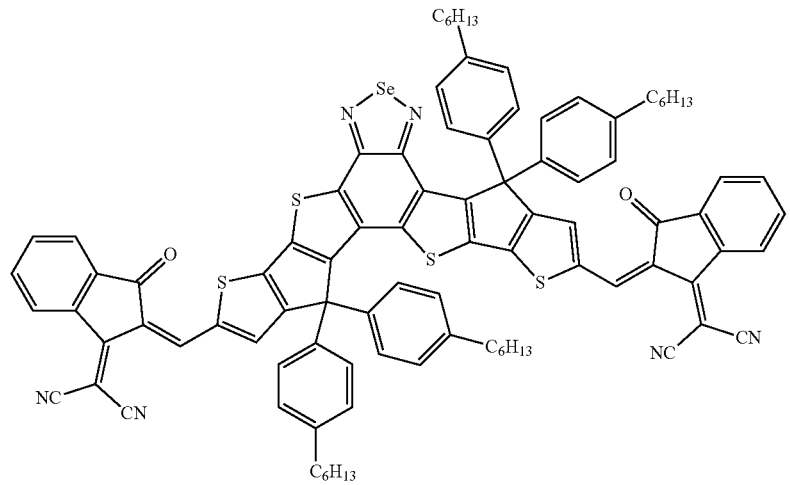
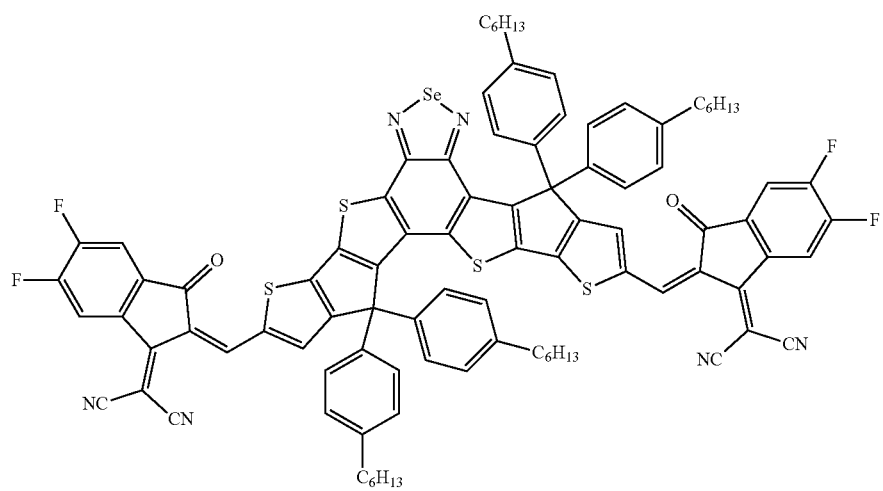
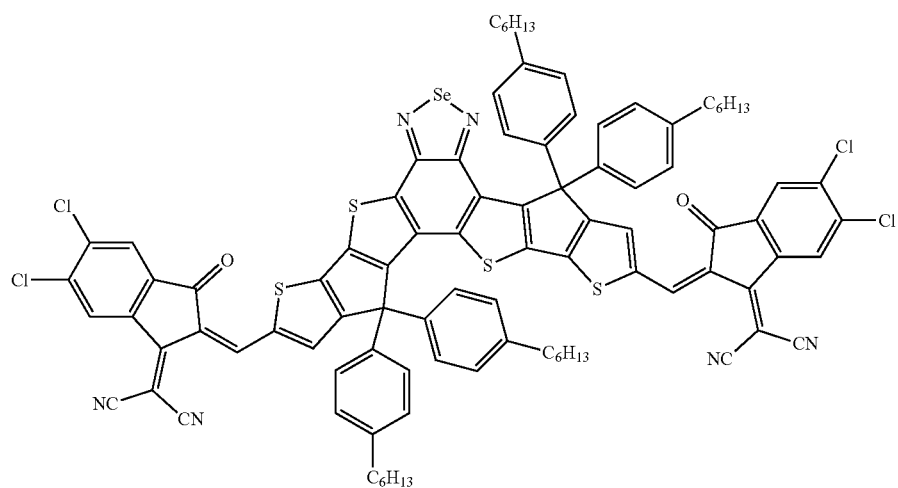

-continued
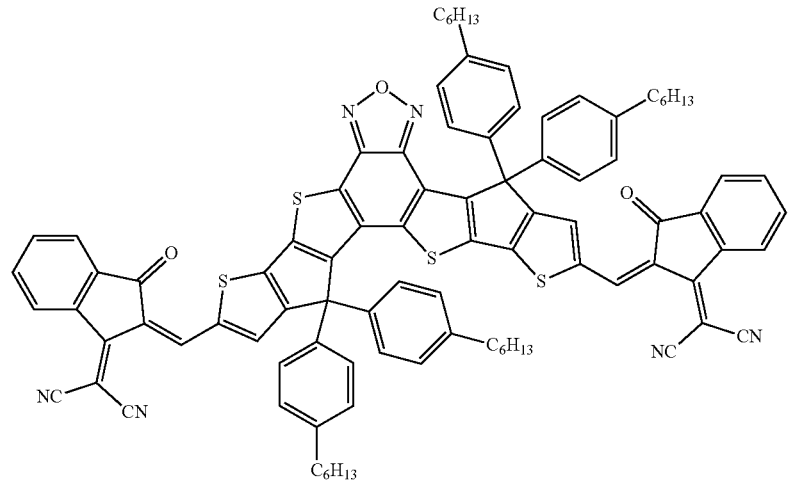
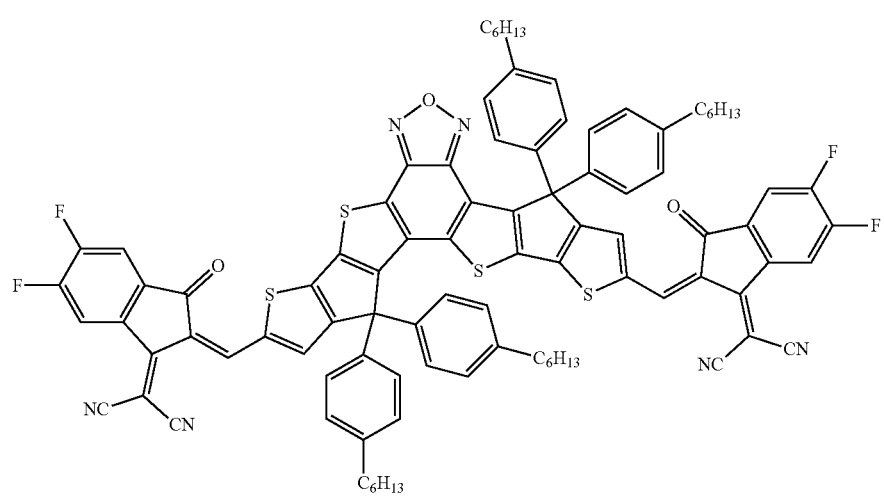
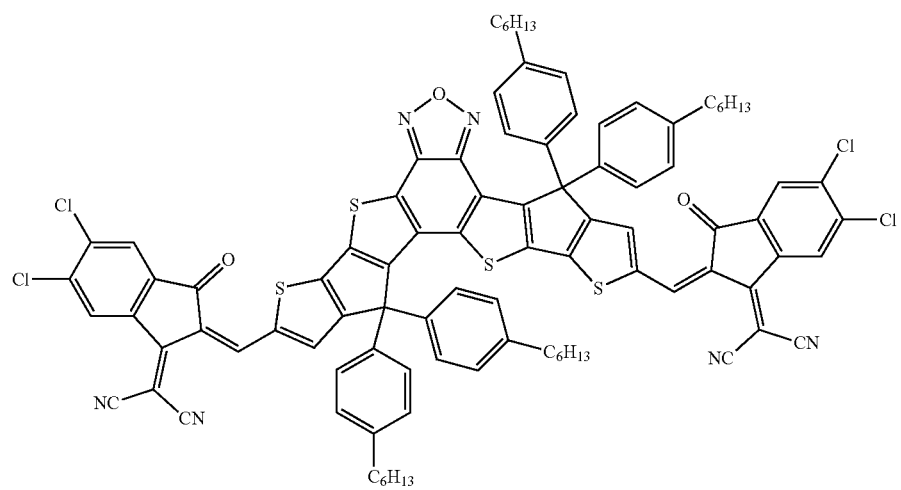

-continued
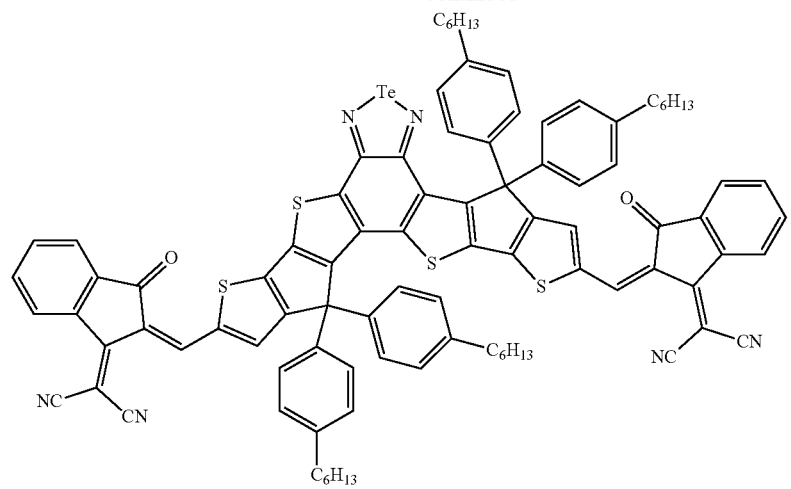
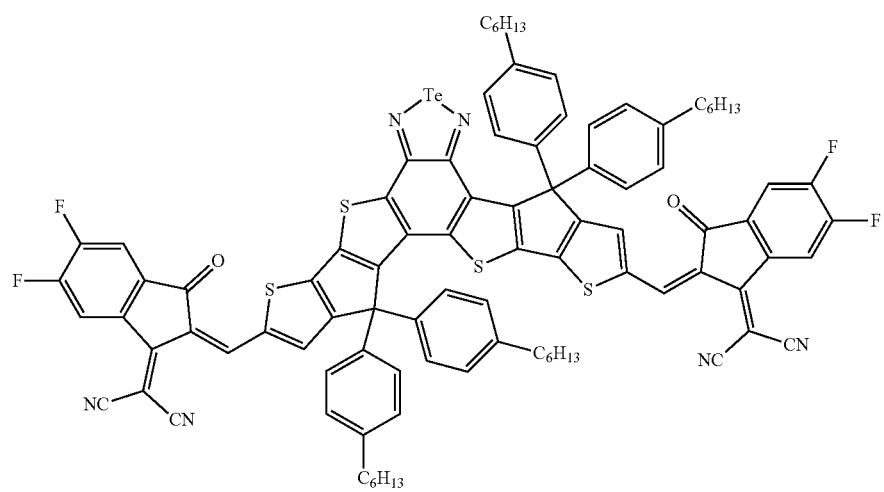
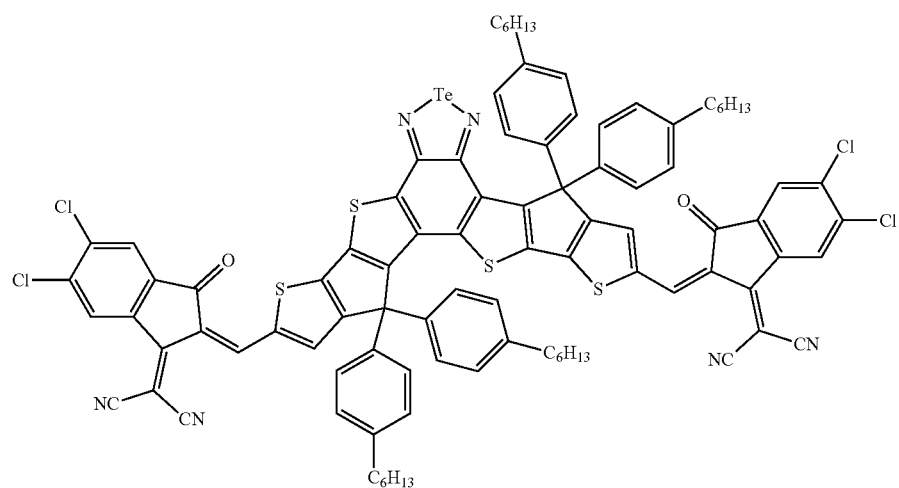

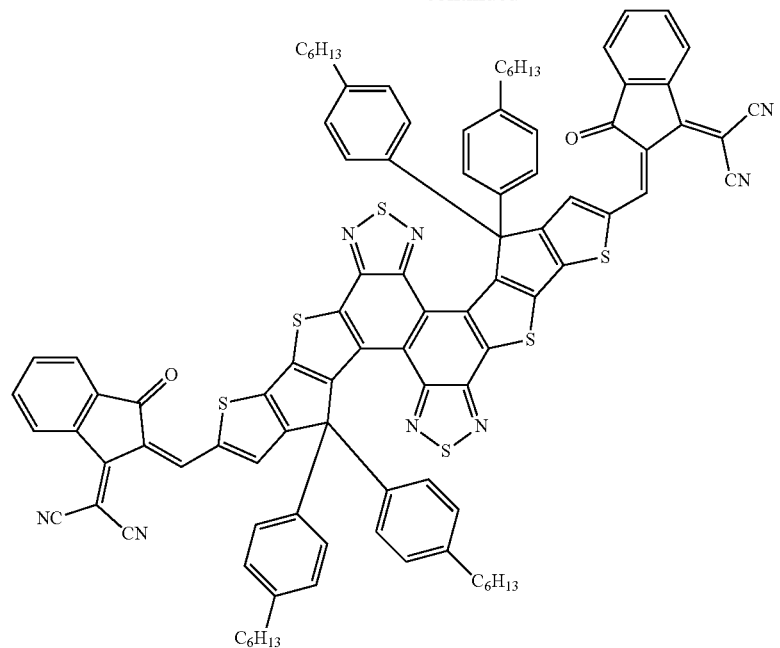
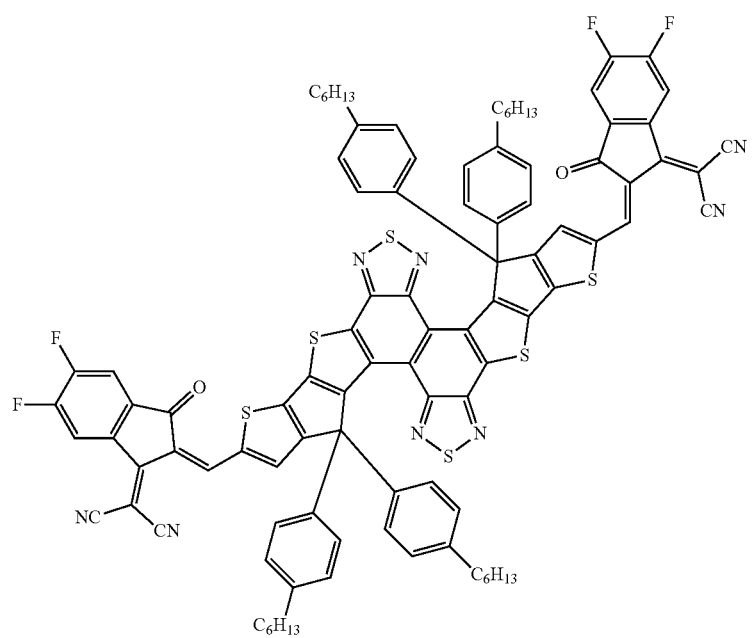

-continued
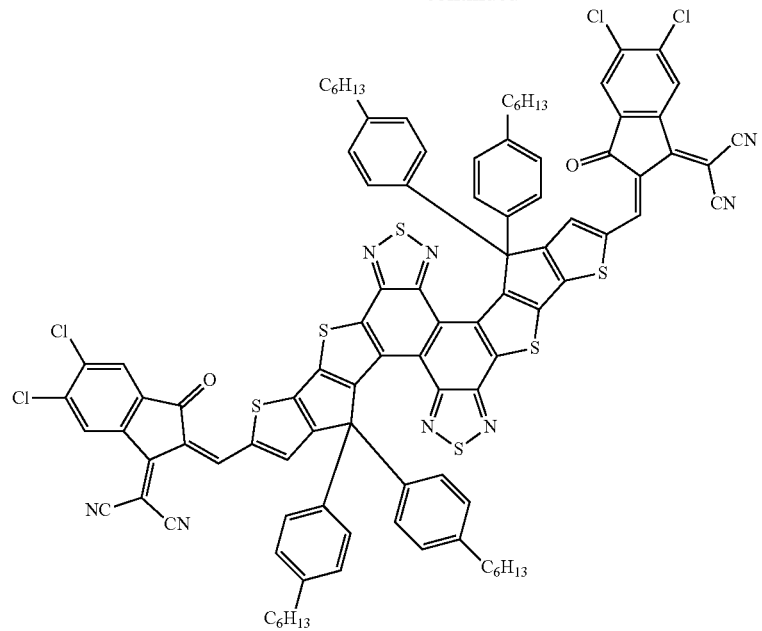
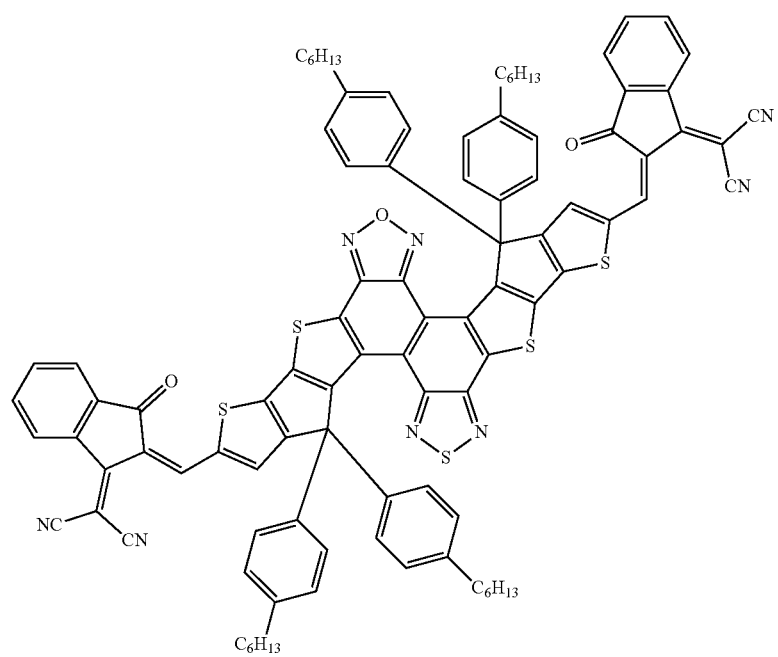

-continued
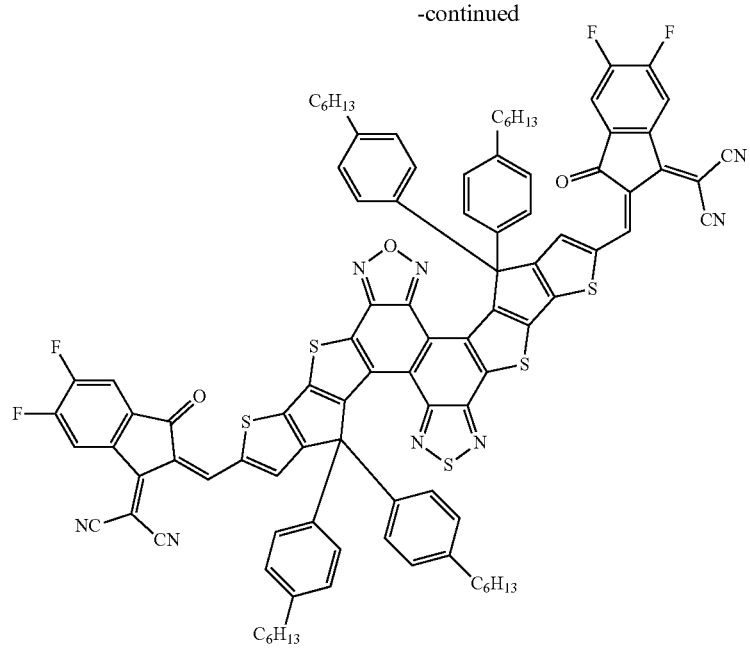
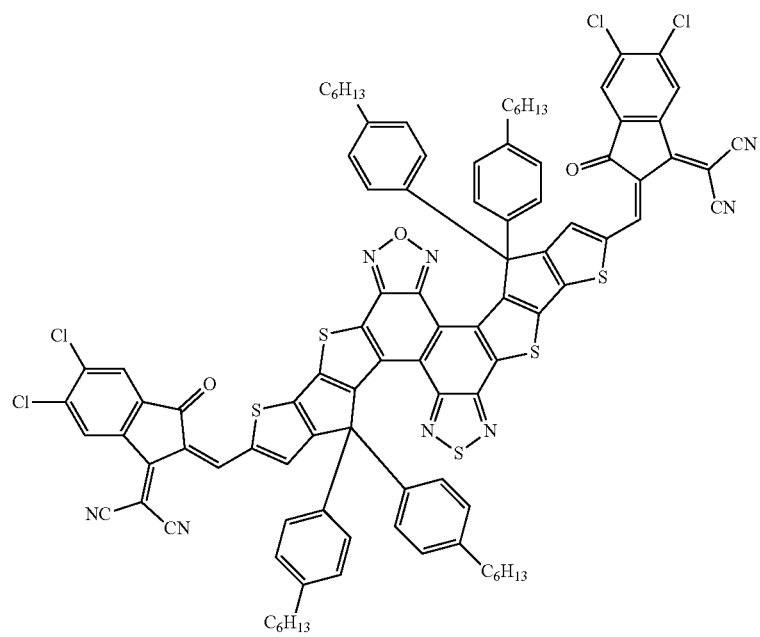

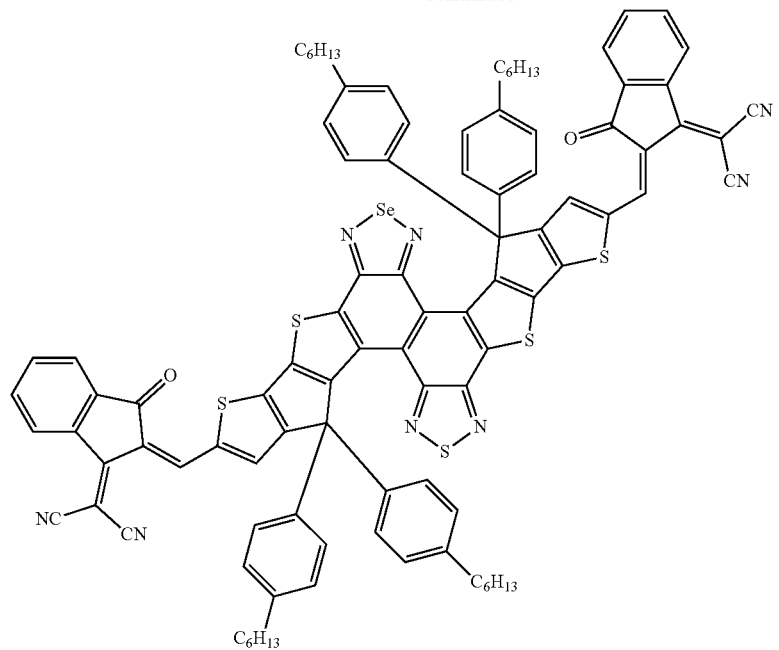
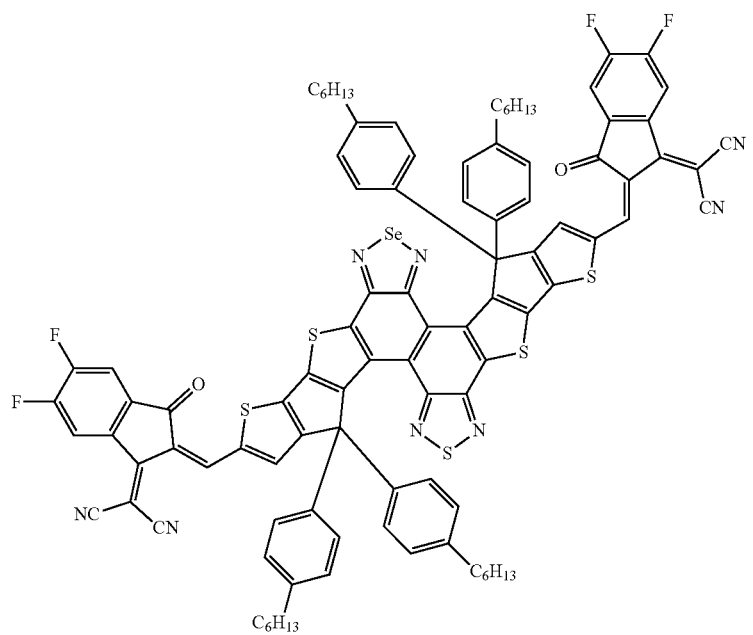

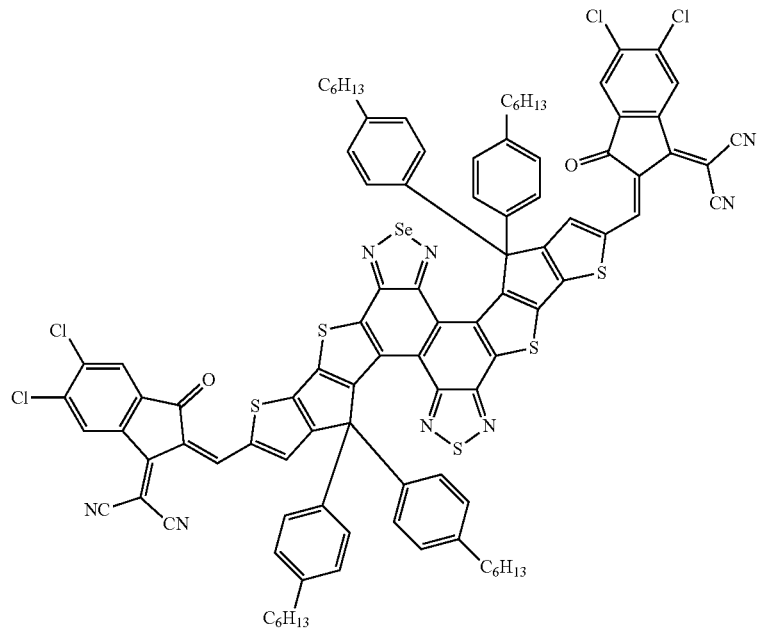
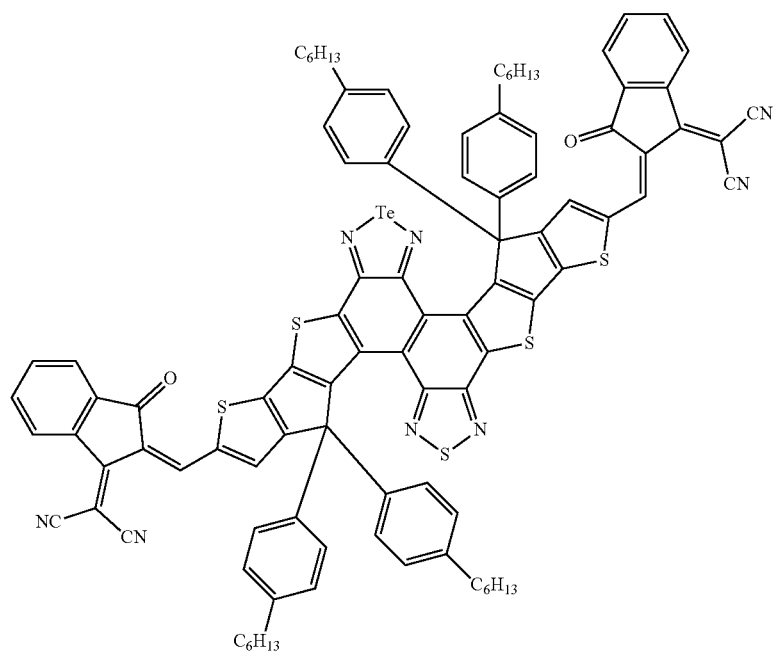

-continued

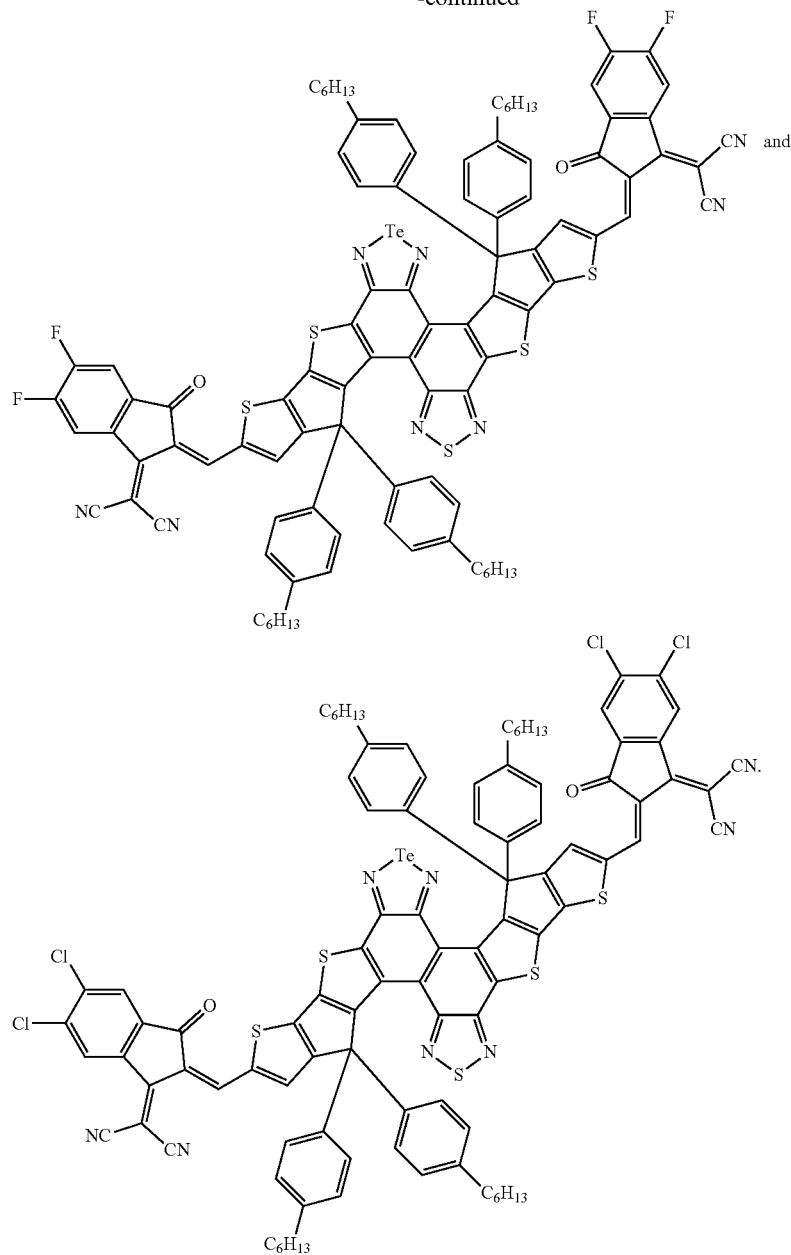

Such non-fullerene acceptor compositions disclosed herein provide certain improved characteristics over conventional acceptor compositions. For example, the NFAs disclosed herein may provide an increased electron density for the donor molecule; a reduced electron density for the acceptor molecule, and an increased conjugation length of the A-D-A molecule.

The electron-withdrawing halogen (e.g., Cl) atoms effectively lower the energy gap by enhancing the intramolecular charge transfer and delocalization of π-electrons into the unoccupied, atomic 3d orbitals. Moreover, the intermolecular interactions of Cl—S and Cl—Cl result in ordered molecular stacks in the donor-acceptor blend films.

In certain examples, the length of the non-fullerene acceptor may be at least 20 angstroms, 25 angstroms, 30 angstroms, 35 angstroms, 40 angstroms, 50 angstroms, or between 20-50 angstroms, 25-40 angstroms, or 25-35 angstroms.

NFAs as disclosed herein may have an energy gap of less than 2 eV, less than 1.5 eV, less than 1.4 eV, less than 1.3 eV, less than 1.2 eV, less than 1.1 eV, less than 1 eV, between 1-2 eV, between 1-1.5 eV, between 1.1-1.4 eV, or between 1.2-1.3 eV.

NFAs as disclosed herein may also provide a solar cell with a high open circuit voltage (Voc). The Voc may be at least 0.5 V, at least 0.6 V, at least 0.7 V, at least 0.8 V, at least 0.9 V, at least 1 V, at least 1.1 V, at least 1.2 V, between 0.5-1.2 V, between 0.6-0.9 V, or between 0.7-0.8 V.

NFAs as disclosed herein may also provide a solar cell with an improved fill factor (FF). The FF may be at least 50%, at least 60%, at least 65%, at least 70%, at least 75%, at least 80%, between 50-80%, between 60-80%, between 65-75%, or approximately 70%.

NFAs as disclosed herein may also provide a solar cell with a high short circuit current (Jsc). The Jsc may be between 10-30 mA/cm2, 20-25 mA/cm2, or 22-23 mA/cm2.

NFAs as disclosed herein may also provide a solar cell with an improved external quantum efficiency (EQE). The EQE may at least 50%, at least 60%, at least 65%, at least 70%, at least 75%, at least 80%, at least 85%, between 65-85%, between 70-80%, or approximately 75%, as measured between wavelengths of 650-850 nm and providing a transparency window between wavelengths of 400-650 nm.

Anode and Cathode Buffers

In one aspect, the disclosure provides anode buffers for use in Organic Photovoltaic (OPV) devices. In one embodiment, the anode buffer comprises a material selected from:

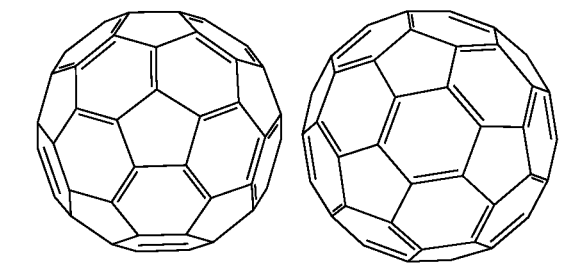

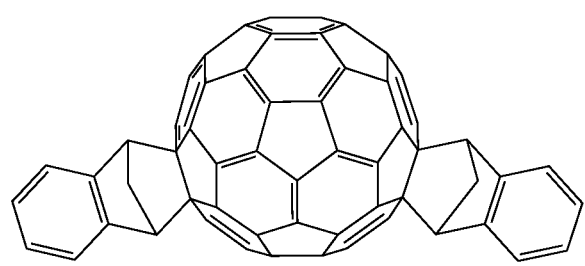

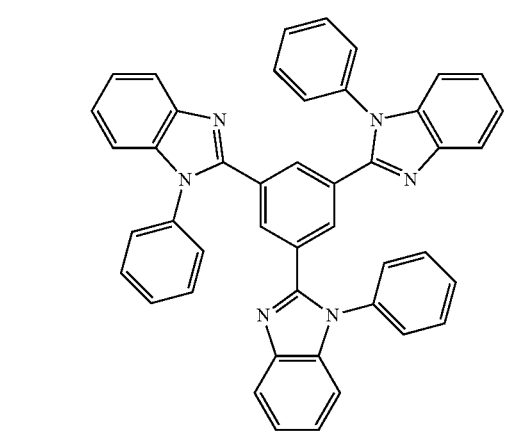

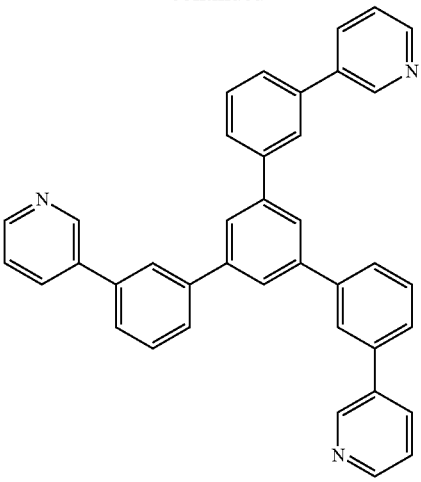

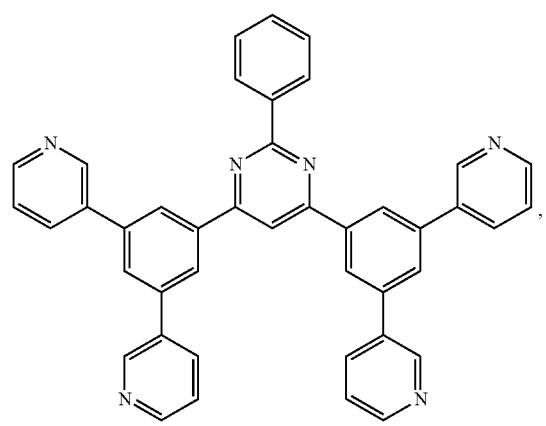

, and

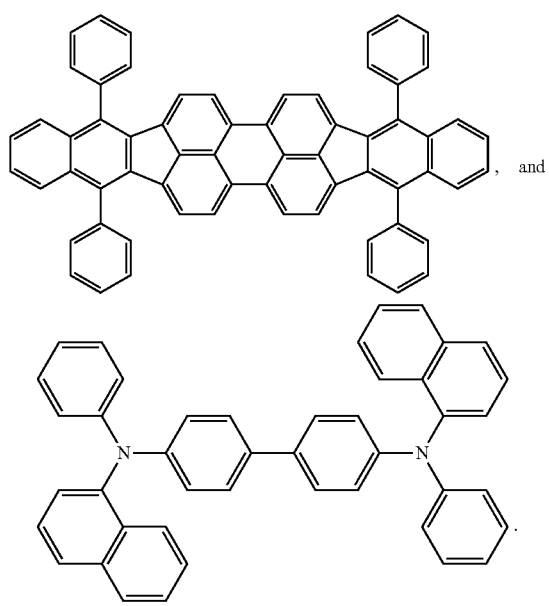

.

In one aspect, the disclosure provides cathode buffers for use in Organic Photovoltaic (OPV) devices. In one embodiment, the cathode buffer comprises a material selected from:

55
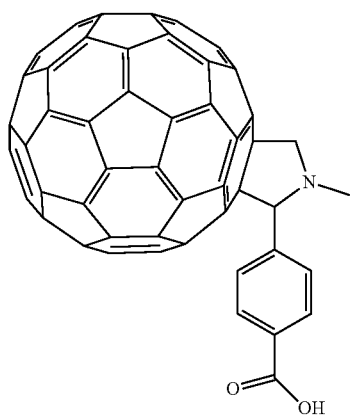
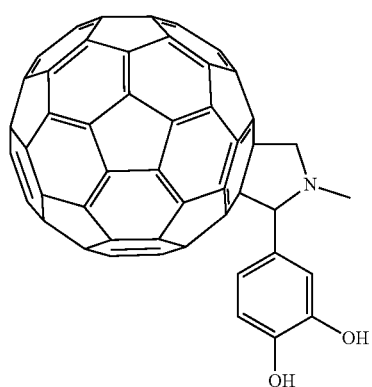
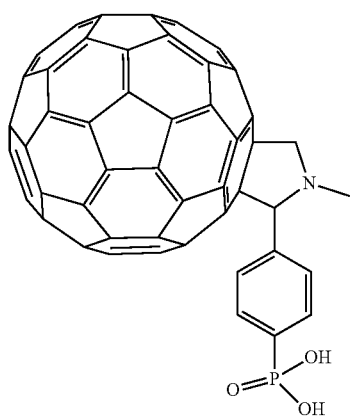
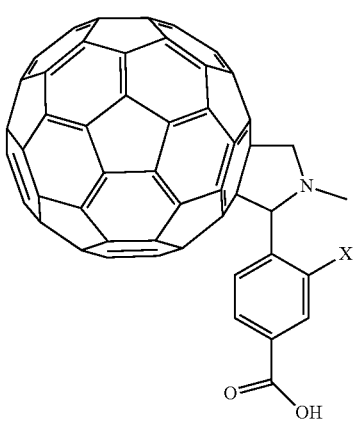
56
-continued
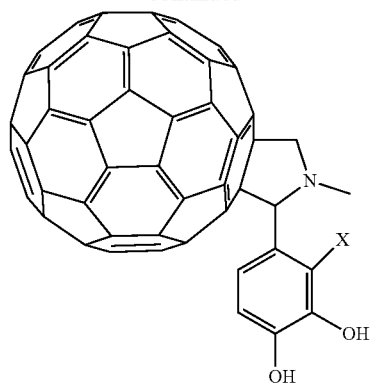
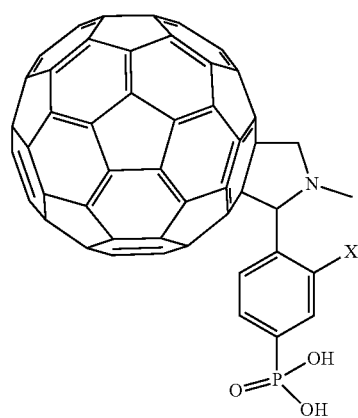
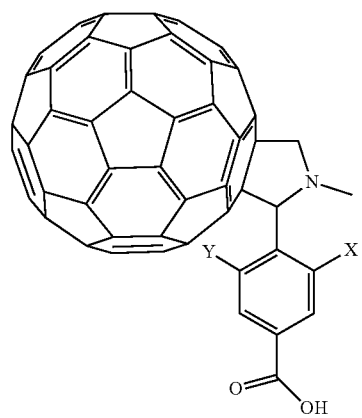
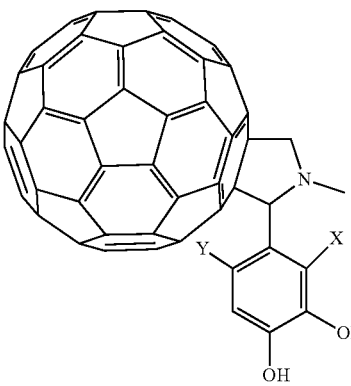, and -continued
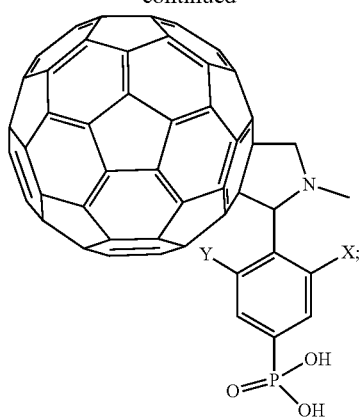
wherein each X is individually selected from the group consisting of oxygen, carbon, hydrogen, sulfur, selenium, and nitrogen;
each Y is individually selected from the group consisting of:
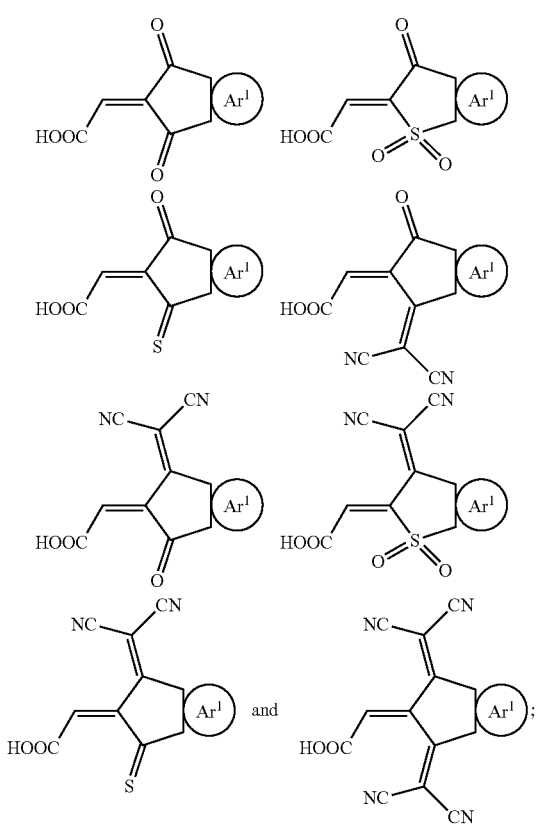 and
each Ar$^1$ is independently selected from the group consisting of:
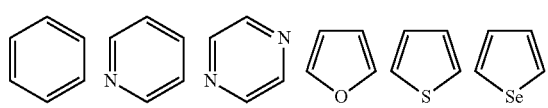
-continued
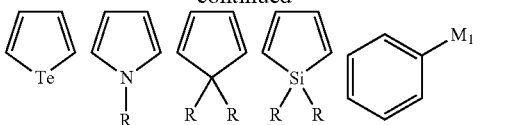
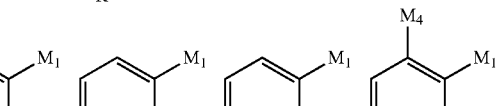
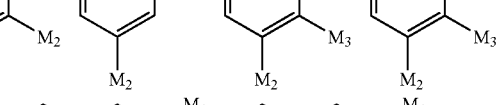
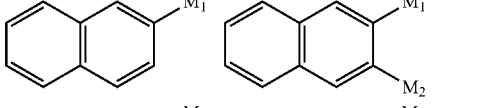
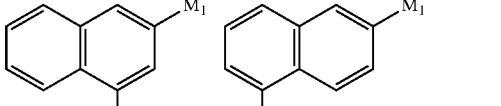
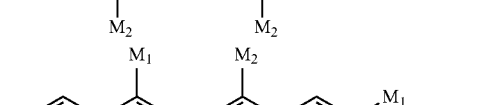
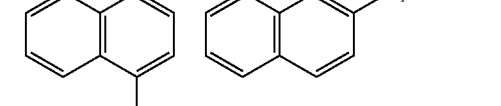
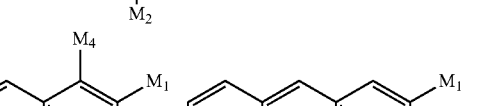
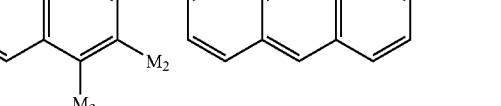
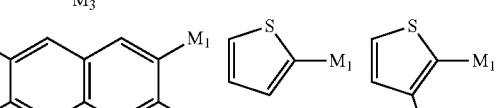
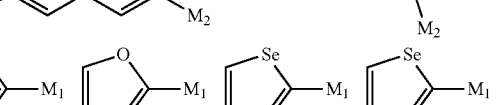
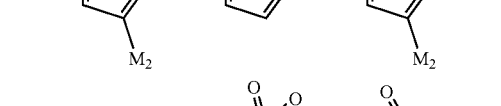
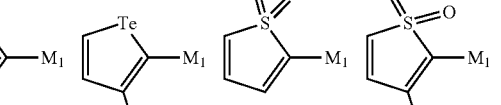
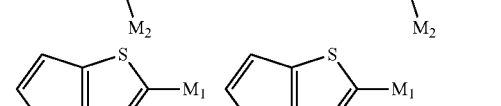
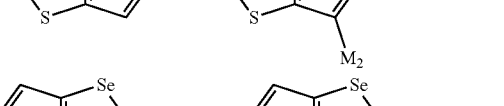
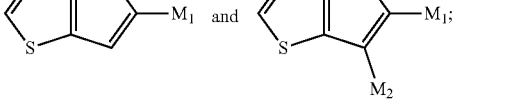

$M_1$-$M_4$ are each independently selected from the group consisting of hydrogen, fluorine, chlorine, bromine, iodine, astatine, and a cyano group, wherein at least one of $M_1$-$M_4$ is a halogen; and each R is independently a $C_1$-$C_{20}$ hydrocarbon or an aromatic hydrocarbon.

In one embodiment, the cathode buffer comprises a material selected from

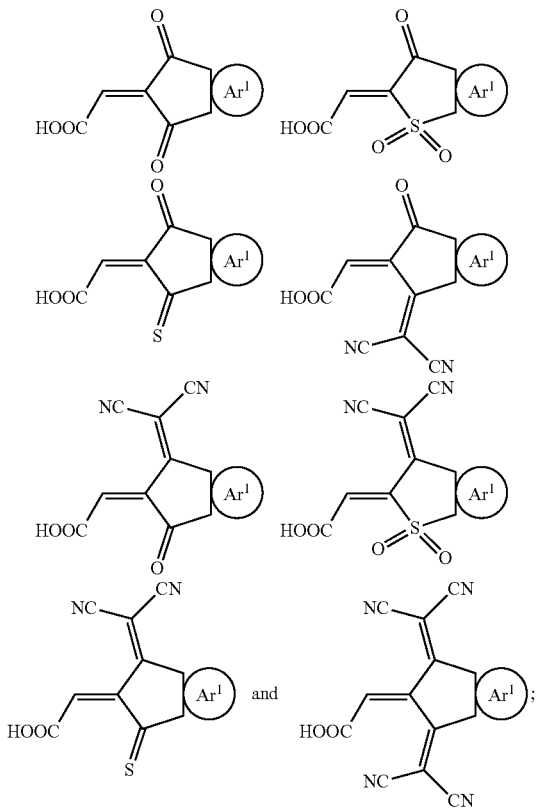

wherein each $Ar^1$ is independently selected from the group consisting of:

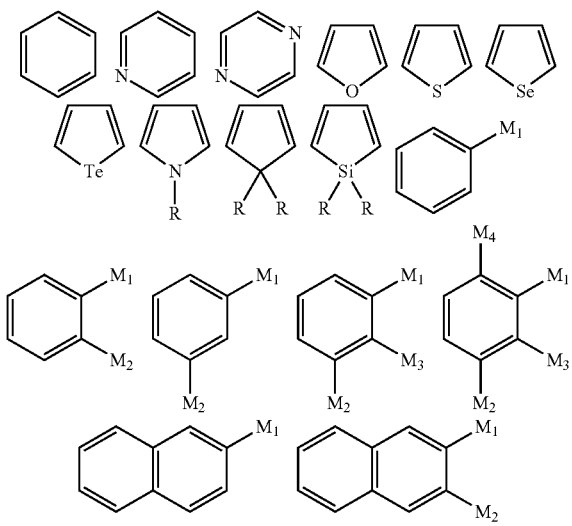

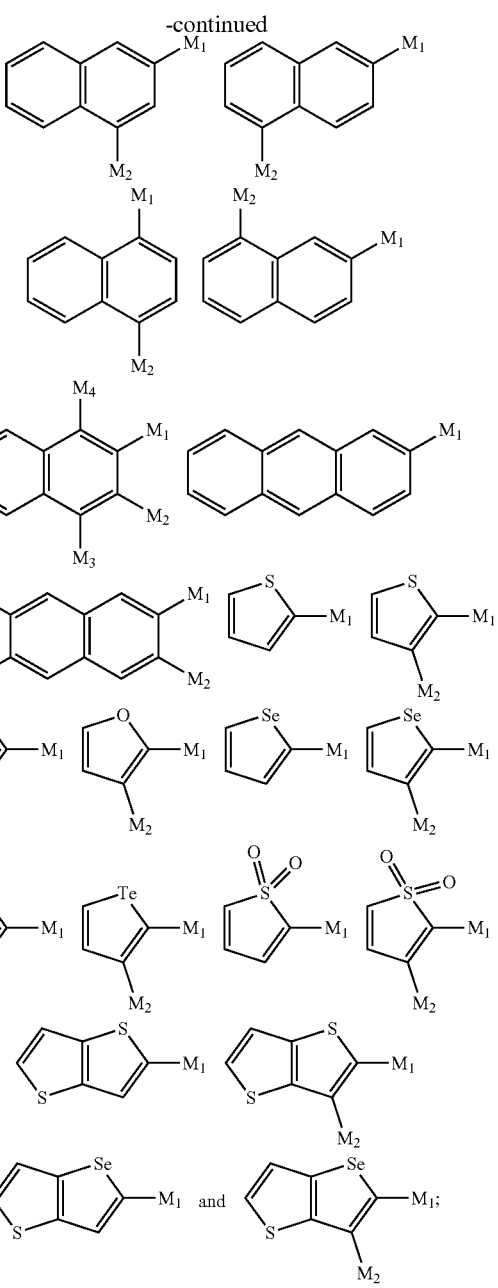

$M_1$-$M_4$ are each independently selected from the group consisting of hydrogen, fluorine, chlorine, bromine, iodine, astatine, and a cyano group, wherein at least one of $M_1$-$M_4$ is a halogen; and each R is independently a $C_1$-$C_{20}$ hydrocarbon or an aromatic hydrocarbon.

Compositions

In one aspect, the disclosure provides compositions comprising an acceptor of one of formulae (I)-(III). In one embodiment, the composition further comprises an anode buffer, a cathode buffer, or both.

In one aspect, the disclosure provides compositions comprising an acceptor of one of formulae (I)-(VI), and a cathode buffer, an anode buffer, or an anode buffer and cathode buffer:

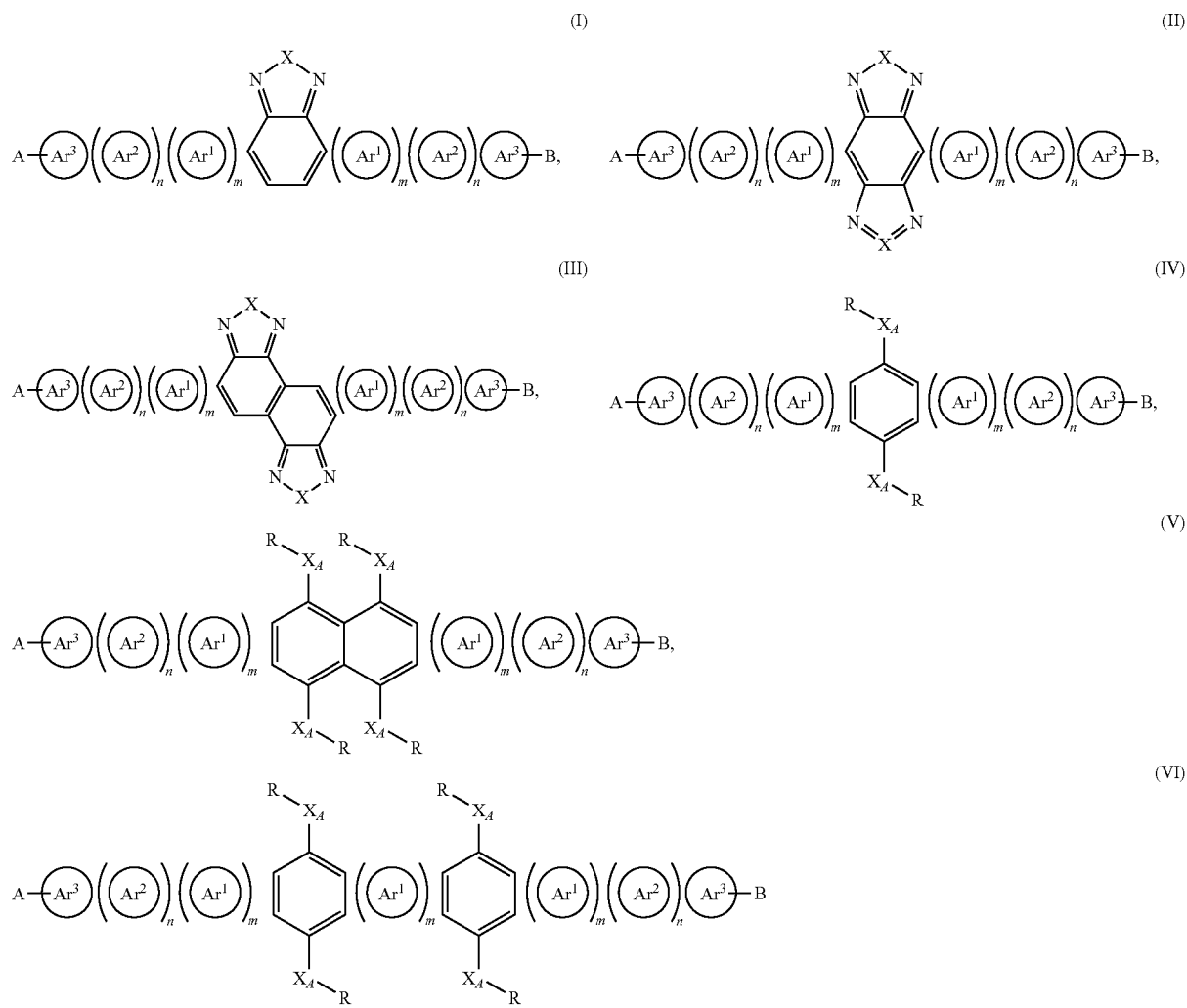
wherein:
A and B are individually selected from the group consisting of:
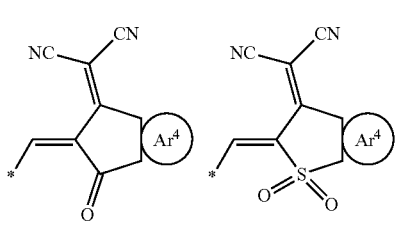
and
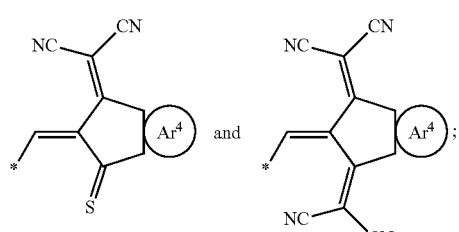
each Ar¹ is individually selected from the group consisting of:
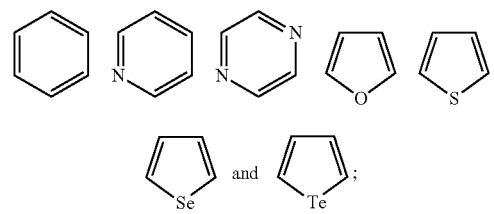
each Ar² is individually selected from the group consisting of:
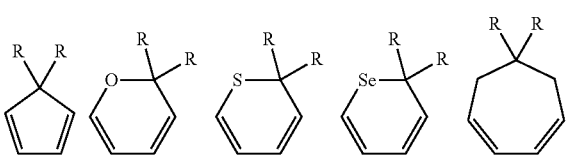

-continued

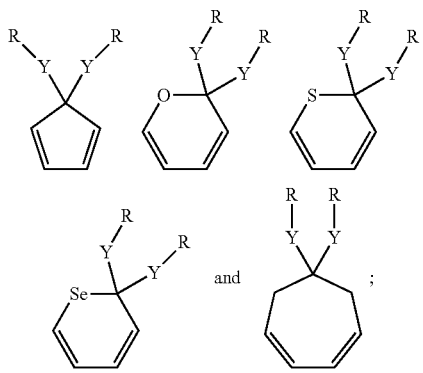

each Ar³ is individually selected from the group consisting of:

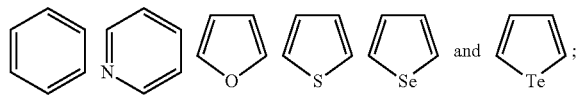

each Ar⁴ is individually selected from the group consisting of:

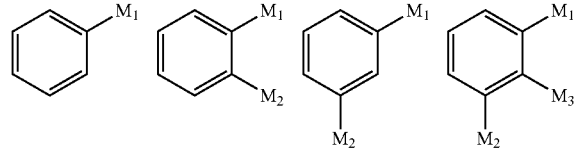

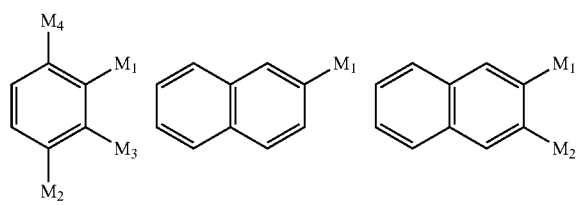

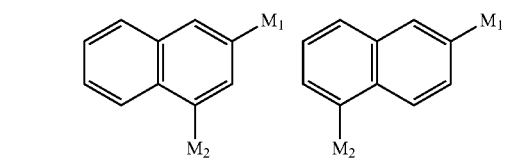

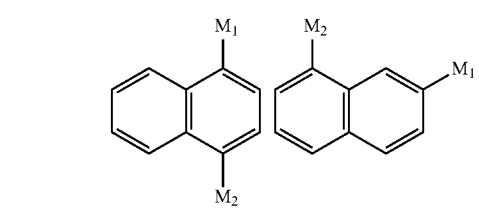

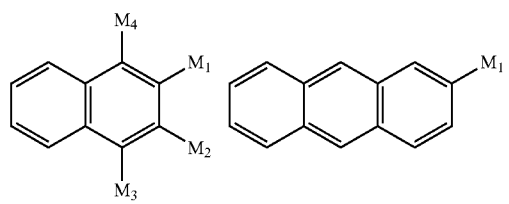

-continued

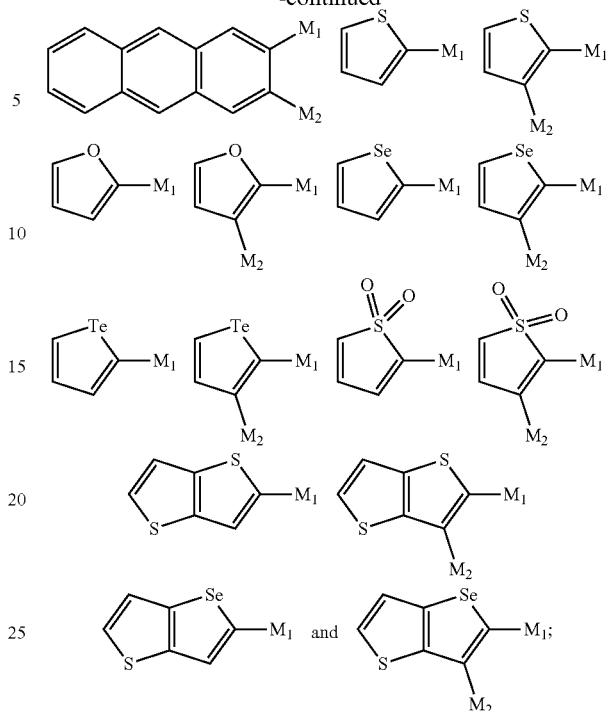

$M_1$-$M_4$ are individually selected from the group consisting of hydrogen, fluorine, chlorine, bromine, iodine, astatine, and a cyano group, wherein at least one of $M_1$-$M_4$ is a halogen;
each X is individually selected from the group consisting of S, NR, Se, Te, and O;
each $X_A$ is individually selected from the group consisting of CRR, O, S, Se and NR;
each R is individually a $C_1$-$C_{20}$ hydrocarbon or an aromatic hydrocarbon;
each Y is individually selected from the group consisting of:

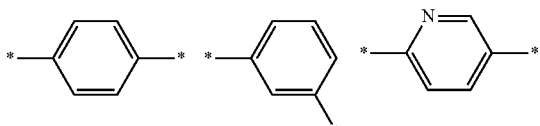

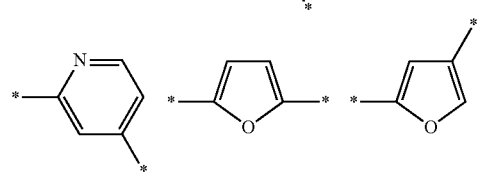

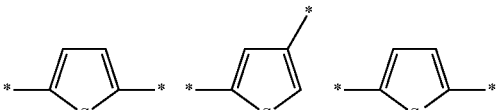

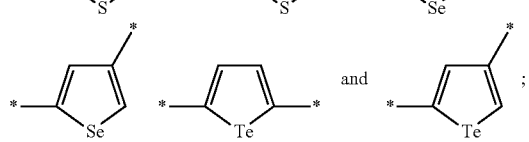

each m is an integer from 0 to 10; and
each n is an integer from 0 to 10.

In one embodiment, the anode buffer is selected from:
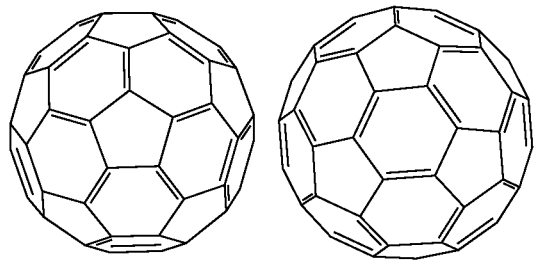
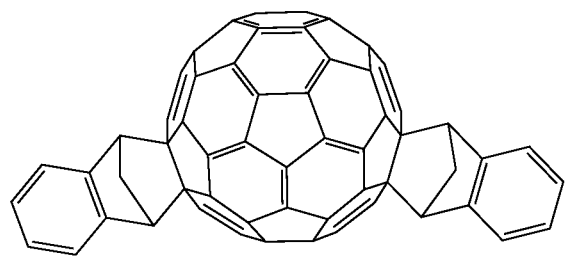
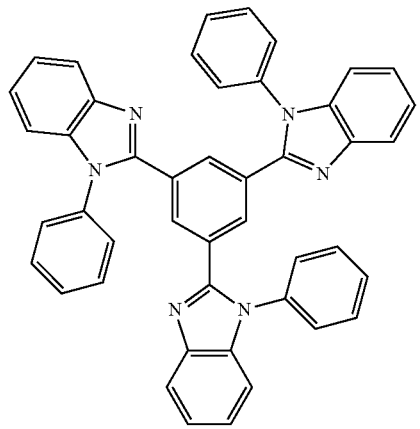
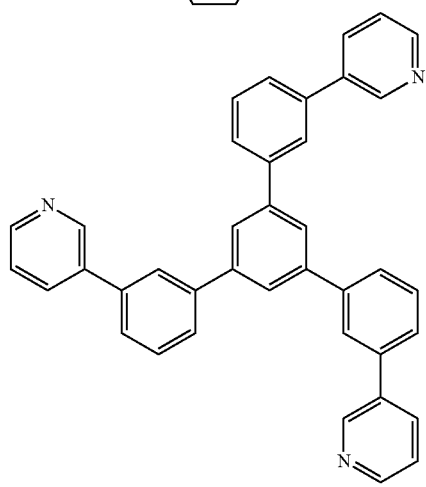
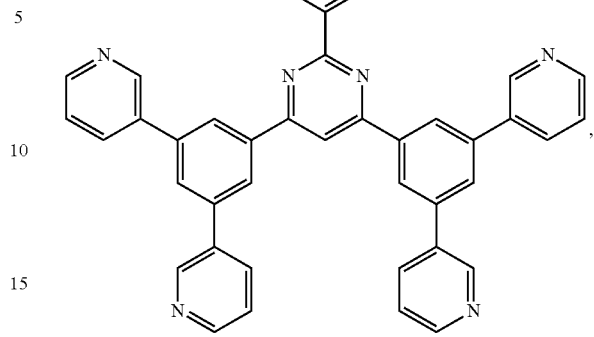
,
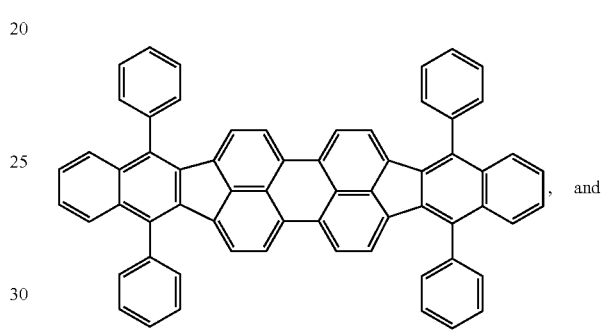
, and
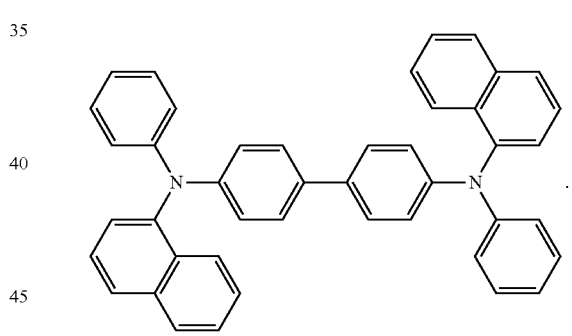
.
In one embodiment, the cathode buffer is selected from:
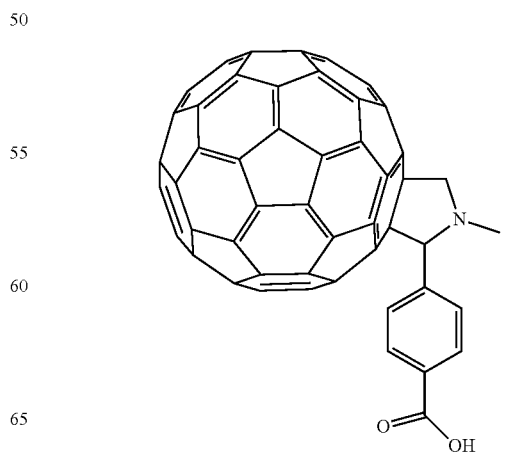

67
-continued
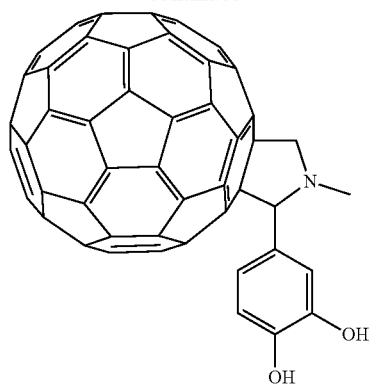
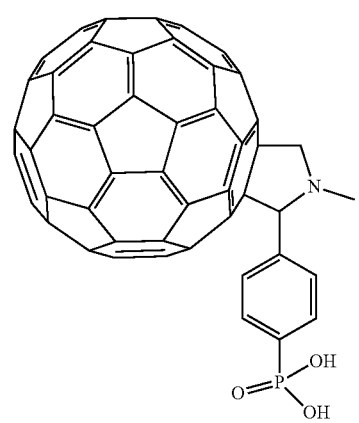
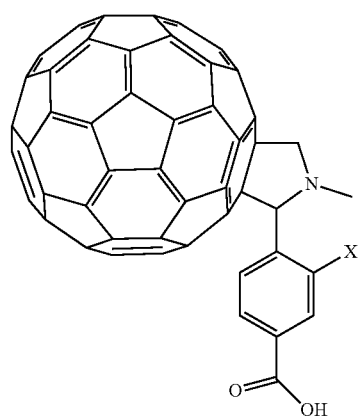
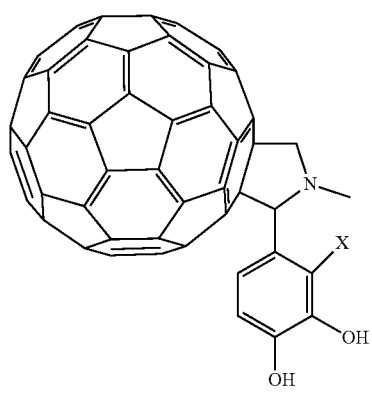
68
-continued
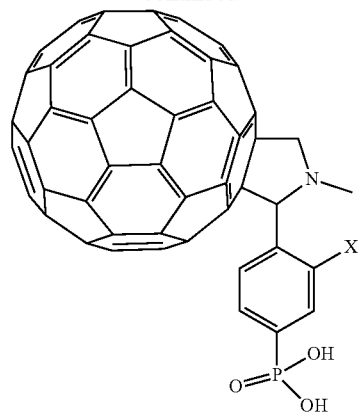
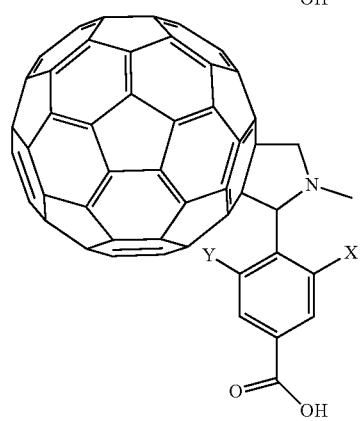
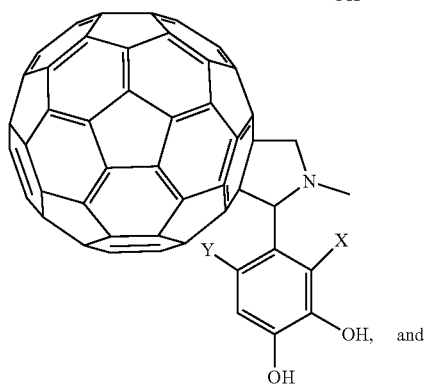
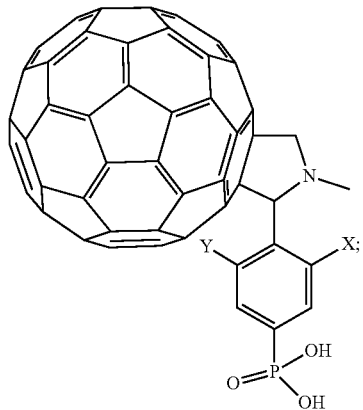
wherein each X is individually selected from the group consisting of oxygen, carbon, hydrogen, sulfur, selenium, and nitrogen;

each Y is individually selected from the group consisting of:

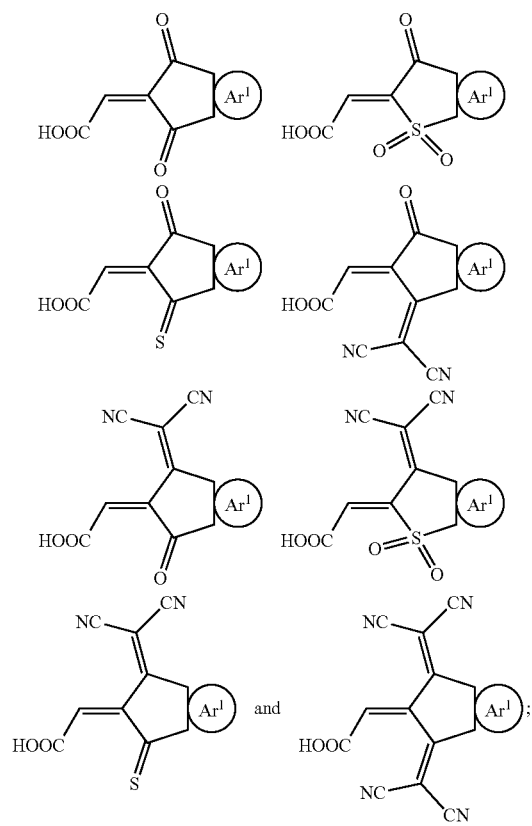

and each Ar¹ is independently selected from the group consisting of:

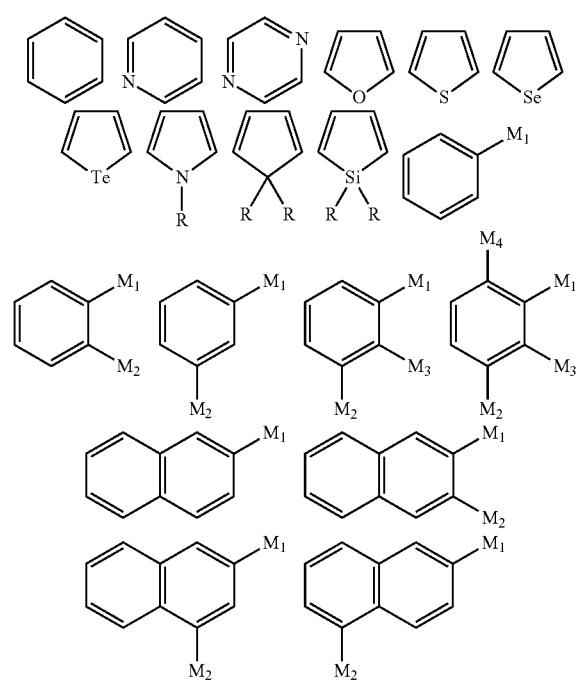

-continued

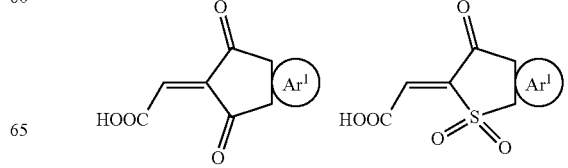

$M_1$-$M_4$ are each independently selected from the group consisting of hydrogen, fluorine, chlorine, bromine, iodine, astatine, and a cyano group, wherein at least one of $M_1$-$M_4$ is a halogen; and each R is independently a $C_1$-$C_{20}$ hydrocarbon or an aromatic hydrocarbon.

In one embodiment, the cathode buffer comprises a group selected from:

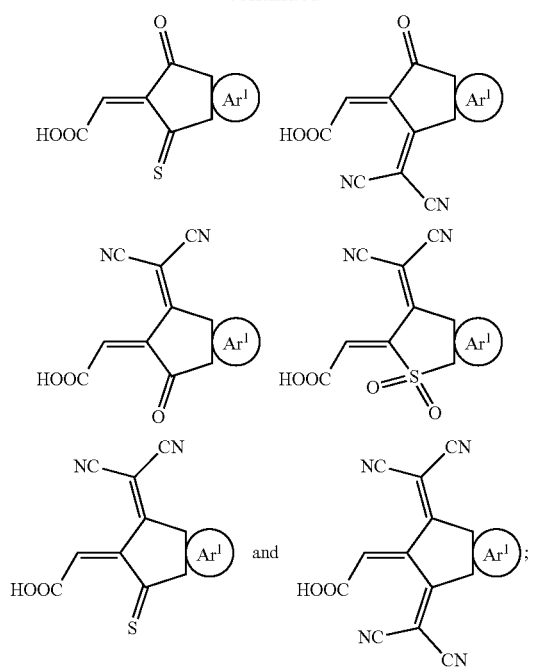

wherein each Ar¹ is independently selected from the group consisting of:

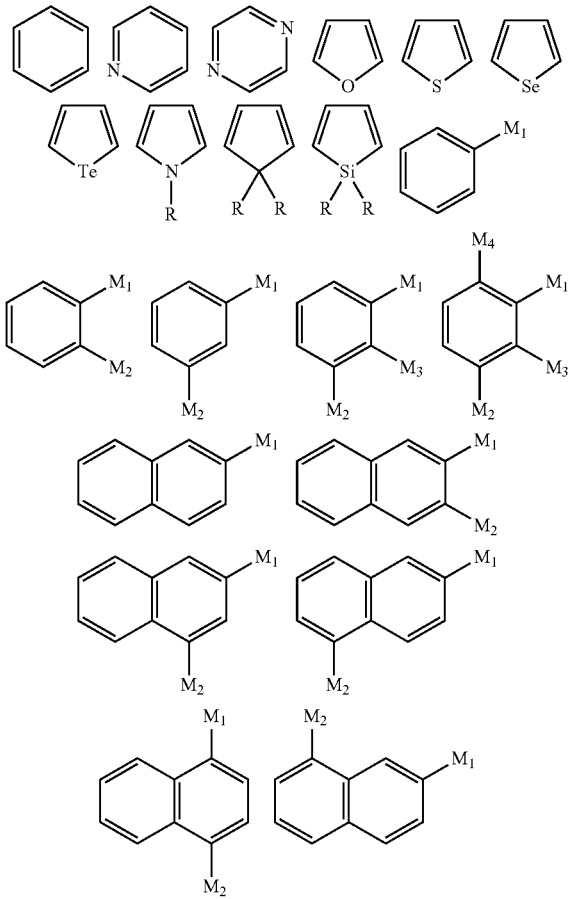

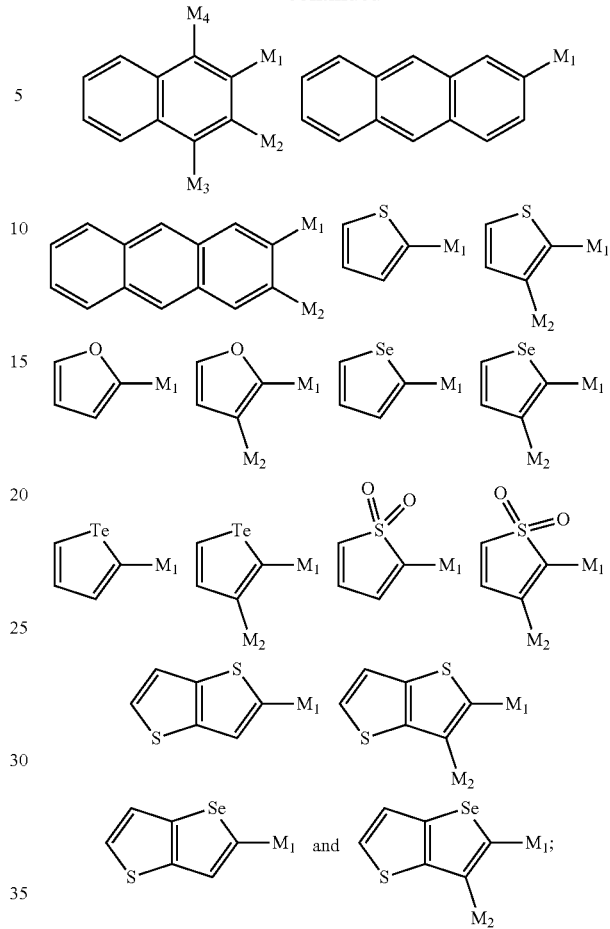

$M_1$-$M_4$ are each independently selected from the group consisting of hydrogen, fluorine, chlorine, bromine, iodine, astatine, and a cyano group, wherein at least one of $M_1$-$M_4$ is a halogen; and each R is independently a $C_1$-$C_{20}$ hydrocarbon or an aromatic hydrocarbon.

In one embodiment, each R is independently selected from:

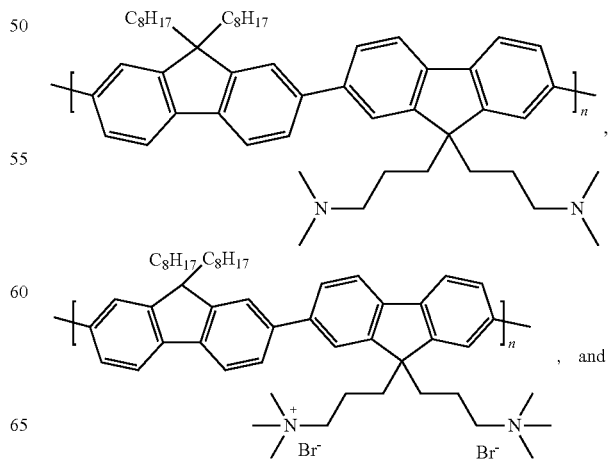

-continued

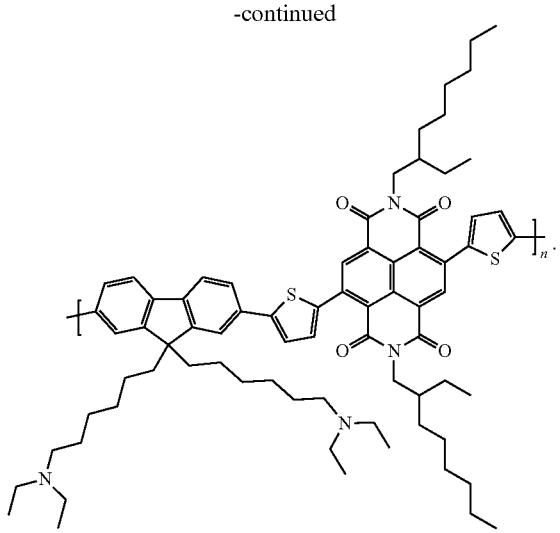

Organic Photovoltaic Cells

In one aspect, the disclosure provides Organic Photovoltaic (OPV) device. In one embodiment the OPV device is an OPV cell. In one embodiment, the OPV comprises various compositions or molecules of the disclosure within an active region or layer of the OPV. In one embodiment, the OPV is a single junction solar cell or a tandem or multi junction solar cell.

FIG. 1A depicts an example of various layers of a single junction solar cell or organic photovoltaic cell (OPV) 100 having a NIR non-fullerene acceptor composition. The OPV cell may include two electrodes having an anode 102 and a cathode 104 in superposed relation, at least one donor composition, and at least one acceptor composition, wherein the donor-acceptor material or active layer 106 is positioned between the two electrodes 102, 104. At least one intermediate layer 108 may be positioned between the anode 102 and the active layer 106. Additionally, or alternatively, at least one intermediate layer 110 may be positioned between the active layer 106 and cathode 104.

The anode 102 may include a conducting oxide, thin metal layer, or conducting polymer. In some examples, the anode 102 includes a (e.g., transparent) conductive metal oxide such as indium tin oxide (ITO), tin oxide (TO), gallium indium tin oxide (GITO), zinc oxide (ZO), or zinc indium tin oxide (ZITO). In other examples, the anode 102 includes a thin metal layer, wherein the metal is selected from the group consisting of Ag, Au, Pd, Pt, Ti, V, Zn, Sn, Al, Co, Ni, Cu, Cr, or combinations thereof. In yet other examples, the anode 102 includes a (e.g., transparent) conductive polymer such as polyaniline (PANT), or 3,4-polyethyl-enedioxythiophene:polystyrenesulfonate (PEDOT: PSS).

The thickness of the anode 102 may be 0.1-100 nm, 1-10 nm, 0.1-10 nm, or 10-100 nm.

The cathode 104 may be a conducting oxide, thin metal layer, or conducting polymer similar or different from the materials discussed above for the anode 102. In certain examples, the cathode 104 may include a metal or metal alloy. The cathode 104 may include Ca, Al, Mg, Ti, W, Ag, Au, or another appropriate metal, or an alloy thereof.

The thickness of the cathode 104 may be 0.1-100 nm, 1-10 nm, 0.1-10 nm, or 10-100 nm.

As noted above, the OPV may include one or more charge collecting/transporting intermediate layers positioned between an electrode 102, 104 and the active region or layer 106. The intermediate layer 108, 110 may be a metal oxide. In certain examples, the intermediate layer 108, 110 includes $MoO_3$, $V_2O_5$, ZnO, or $TiO_2$. In some examples, the first intermediate layer 108 has a similar composition as the second intermediate layer 110. In other examples, the first and second intermediate layers 108, 110 have different compositions.

The thickness of each intermediate layer may be 0.1-100 nm, 1-10 nm, 0.1-10 nm, or 10-100 nm.

The active region or layer 106 positioned between the electrodes 102, 104 includes a composition or molecule having an acceptor. In one embodiment, the acceptor comprises a non-fullerene acceptor. In one embodiment, the non-fullerene acceptor comprises a compound of formula (I)-(III). In one embodiment, 104 includes a composition or molecule having an acceptor and a donor. The composition may be arranged as an acceptor-donor-acceptor (A-D-A).

FIG. 1B depicts an example of various layers of a tandem or multi junction solar cell or organic photovoltaic cell (OPV) 200 having a NIR non-fullerene acceptor composition. The OPV cell may include two electrodes having an anode 202 and a cathode 204 in superposed relation, at least one donor composition, and at least one acceptor composition positioned within a plurality of active layers or regions 206A, 206B between the two electrodes 202, 204. While only two active layers or regions 206A, 206B are depicted in FIG. 1B, additional active layers or regions are also possible.

At least one intermediate layer 208 may be positioned between the anode 202 and a first active layer 206A. Additionally, or alternatively, at least one intermediate layer 210 may be positioned between the second active layer 206B and cathode 204.

At least one intermediate layer 212 may be positioned between the first active layer 206A and the second active layer 206B.

The compositions, thicknesses, etc. of each layer may be the same as those discussed with reference to FIG. 1A.

In certain examples, the donor material or composition within the active layer or region 106 is a low energy band gap polymer composition. For example, in one embodiment, the donor composition is a polymer having a band gap of less than 2 eV. In one embodiment, the donor material or composition within each active layer or region 206A and 206B independently comprises a low energy band gap polymer composition. In one embodiment, the donor composition comprises a polymer having a band gap of less than 2 eV. In one embodiment, the low band gap polymer donor comprises poly[4,8-bis(5-(2-ethylhexyl)thiophen-2-yl) benzo [1,2-b:4,5-b']dithiophene-co-3-fluorothieno [3,4-b] thiophene-2-carboxylate, or a derivative thereof. In one embodiment, the low band gap polymer donor comprises poly(3-hexylthiophene) or a derivative thereof. In one embodiment, the low band gap polymer donor comprises poly [N-9'-heptadecanyl-2,7-carbazole-alt-5,5-(4',7'-di-2-thienyl-2',1',3'-benzothiadazole)] (i.e. PCDTBT), or a derivative thereof.

In one embodiment, the low energy band gap polymer is selected from the group consisting of:
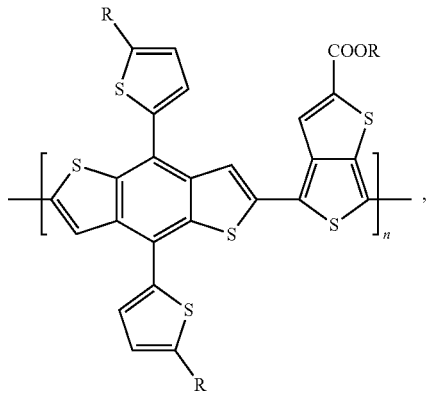
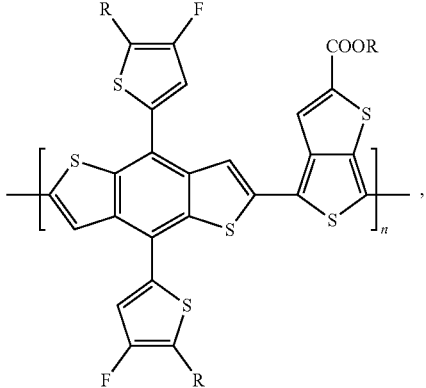
-continued
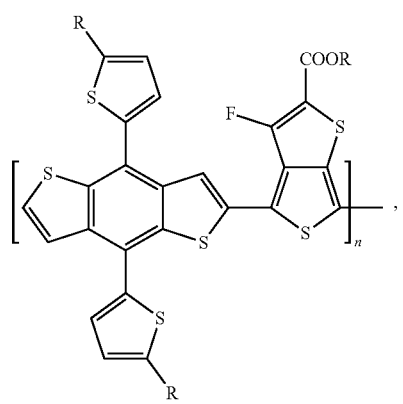
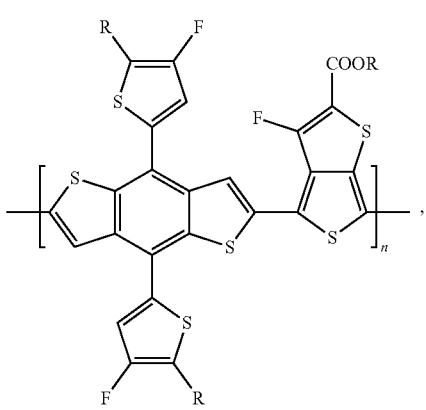
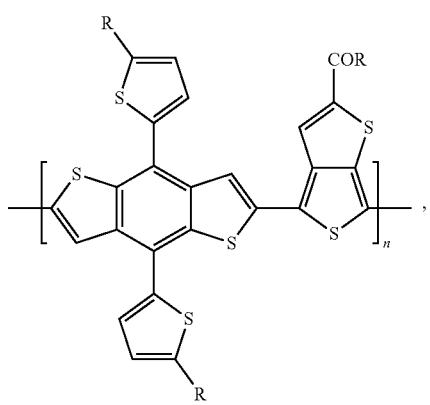
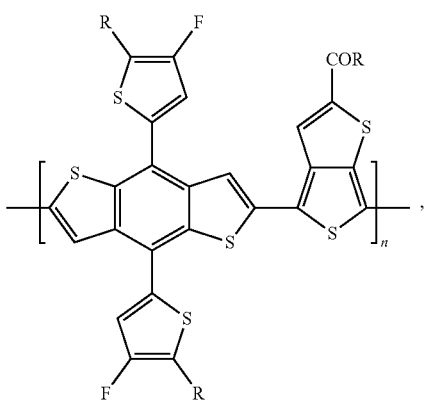
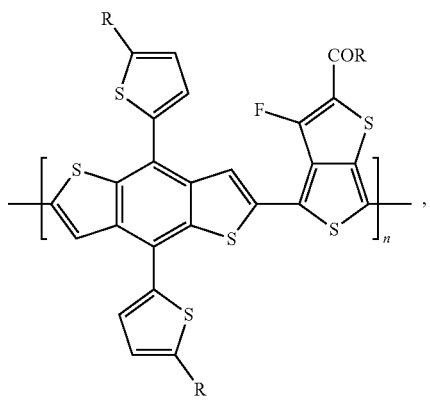
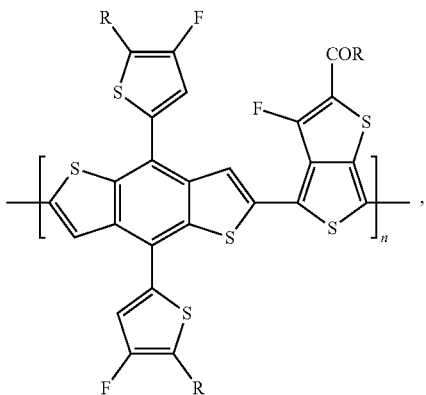

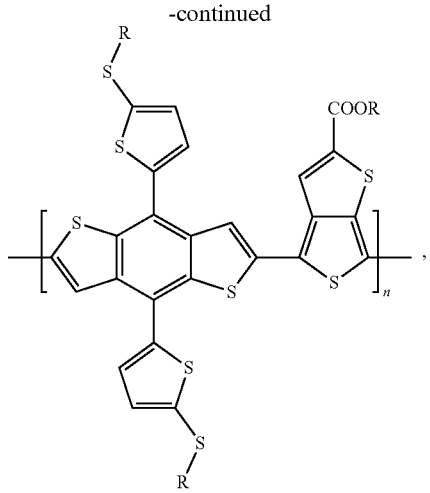

,

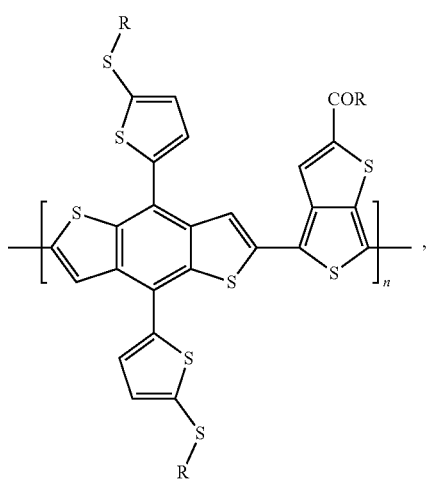

,

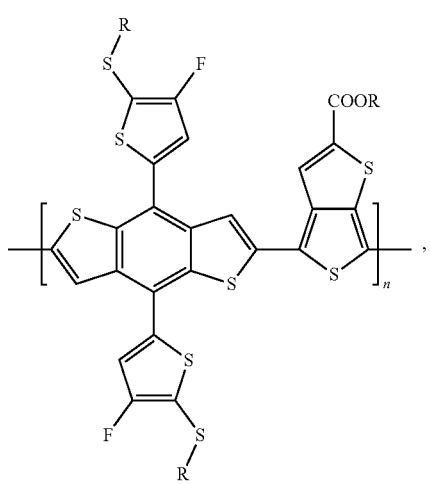

,

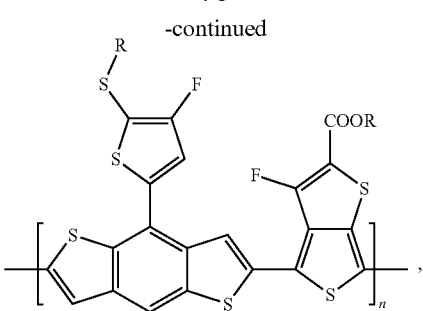

,

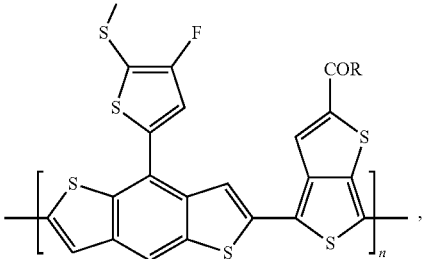

,

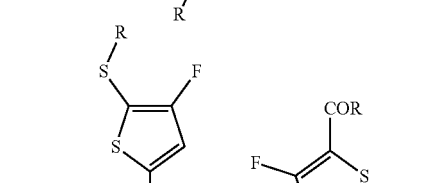

,

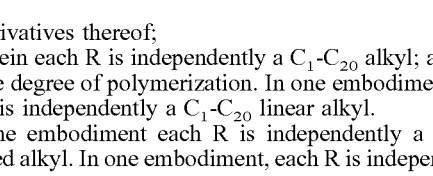

, and derivatives thereof;
  wherein each R is independently a $C_1$-$C_{20}$ alkyl; and n is the degree of polymerization. In one embodiment each R is independently a $C_1$-$C_{20}$ linear alkyl.

In one embodiment each R is independently a $C_1$-$C_{20}$ branched alkyl. In one embodiment, each R is independently selected from the group consisting of methyl, ethyl, n-propyl, isopropyl, isobutyl, n-butyl, sec-butyl, tert-butyl, isopentyl, n-pentyl, neopentyl, n-hexyl, 2-ethylhexyl, and octyl. In one embodiment, each R represents 2-ethylhexyl.

In one embodiment, n refers to the degree of polymerization. In one embodiment, n is between about 1-1000. In one embodiment, n is between about 1-100. In one embodiment, n is between about 10-1000.

In one embodiment, the donor is:

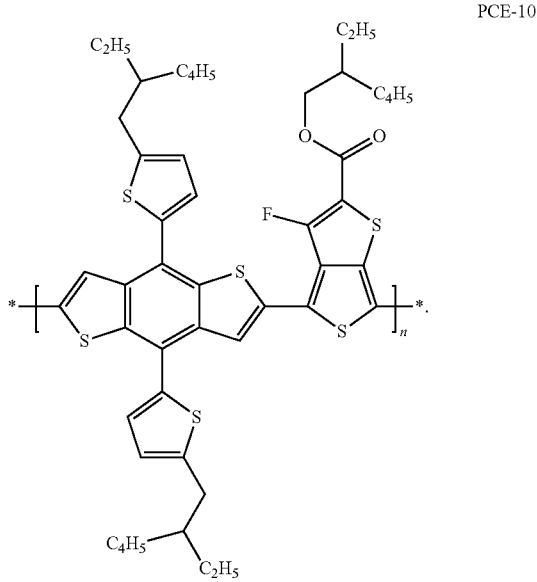

PCE-10

Additionally, R may represent a linear or branched saturated or unsaturated non-aromatic hydrocarbon, e.g., within the $C_2$-$C_{20}$ range. In certain examples, R represents a saturated hydrocarbon or alkyl group. Examples of linear or branched alkyl groups in the $C_2$-$C_{20}$ range include methyl, ethyl, n-propyl, isopropyl, isobutyl, n-butyl, sec-butyl, tert-butyl, isopentyl, n-pentyl, neopentyl, n-hexyl, and 2-ethylhexyl. In one particular example, R represents 2-ethylhexyl.

In one embodiment, the OPV comprises an anode, a cathode and an organic layer disposed between the anode and cathode. In one embodiment the organic layer comprises an acceptor comprising one of formulae (I)-(VI). In one embodiment, the OPV further comprise an anode buffer of the disclosure, a cathode buffer of the disclosure, or both. In one embodiment, the OPV further comprise a hole transporting layer, an electron transporting layer, or both.

In one embodiment, the OPV further comprises a layer disposed between the anode and the organic layer, wherein the layer disposed between the anode and the organic layer comprises an anode buffer of the disclosure.

In one embodiment the OPV further comprises a layer disposed between the cathode and the organic layer, wherein the layer disposed between the cathode and the organic layer comprises a cathode buffer of the disclosure.

In one embodiment the OPV further comprises a hole transporting layer. In one embodiment, the hole transporting layer comprises PEDOT:PSS, $MoO_3$, $NiO_x$, graphene, CuSCN, or Poly [bis(4-phenyl)(2,5,6-trimethylphenyl) amine.

In one embodiment the OPV further comprises an electron transporting layer. In one embodiment, the electron transporting layer comprises ZnO, $SnO_2$, $TiO_2$, $WO_3$, C60, or PCBM.

In one embodiment, an OPV device comprising a non-fullerene acceptor of formula (I)-(III) or a non-fullerene acceptor of formula (I)-(VI) and a anode buffer and/or cathode buffer of the disclosure has a high open circuit voltage (Voc). In one embodiment, the Voc is at least about 0.5 V, at least about 0.6 V, at least about 0.7 V, at least about 0.8 V, at least about 0.9 V, or at least about 1 V. In one embodiment, the Voc is between about 0.1 V and 5 V. In one embodiment, the Voc is between about 0.1 V and 4.5 V. In one embodiment, the Voc is between about 0.1 V and 4 V. In one embodiment, the Voc is between about 0.1 V and 3.5 V. In one embodiment, the Voc is between about 0.1 V and 3 V. In one embodiment, the Voc is between about 0.1 V and 2.5 V. In one embodiment, the Voc is between about 0.1 V and 2 V. In one embodiment, the Voc is between about 0.1 V and 1.5 V. In one embodiment, the Voc is between about 0.1 V and 1 V. In one embodiment, the Voc is between about 0.5 V and 1 V.

In one embodiment, an OPV device comprising a non-fullerene acceptor of formula (I)-(III) or a non-fullerene acceptor of formula (I)-(VI) and a anode buffer and/or cathode buffer of the disclosure has a high short circuit current ($J_{sc}$). In one embodiment, the $J_{sc}$ is between about 5 mA/cm$^2$ and about 70 mA/cm$^2$. In one embodiment, the Jsc is between about 5 mA/cm$^2$ and about 60 mA/cm$^2$. In one embodiment, the Jsc is between about 5 mA/cm$^2$ and about 50 mA/cm$^2$. In one embodiment, the Jsc is between about 5 mA/cm$^2$ and about 40 mA/cm$^2$. In one embodiment, the $J_{sc}$ is between about 5 mA/cm$^2$ and about 30 mA/cm$^2$. In one embodiment, the Jsc is between about 10 mA/cm$^2$ and about 30 mA/cm$^2$. In one embodiment, the Jsc is between about 15 mA/cm$^2$ and about 30 mA/cm$^2$. In one embodiment, the Jsc is between about 15 mA/cm$^2$ and about 25 mA/cm$^2$.

In one embodiment, an OPV device comprising a non-fullerene acceptor of formula (I)-(III) or a non-fullerene acceptor of formula (I)-(VI) and a anode buffer and/or cathode buffer of the disclosure has a high external quantum efficiency (EQE). In one embodiment, the EQE is between about 10% and 90%. In one embodiment, the EQE is between about 10% and 80%. In one embodiment, the EQE is between about 20% and 80%. In one embodiment, the EQE is between about 30% and 80%. In one embodiment, the EQE is between about 40% and 80%. In one embodiment, the EQE is between about 50% and 80%. In one embodiment, the EQE is between about 60% and 80%. In one embodiment, the EQE is between about 65% and 80%.

Experimental Examples

Described herein are series of non-fullerene acceptors with good photostability and morphological stability. By employing these NFAs in the certain device architecture, an OPV device is provided with improved the operational lifetime.

While there are several sources for the decrease of OPV performance over time, none is more fundamental than the degradation of the organic molecules comprising the layer structure itself. It is well known that fullerene derivatives are vulnerable to photo-oxidative reactions that cause bleaching of their absorption bands and changing of their morphology after exposure to light and air. we designed the NFA, BT-CIC with four chloride atoms at peripheral molecular sites that exhibits strong electronic coupling and increased crystalline order, thus reducing morphology variations over time compared to the less rigid, conventional BT-IC (see FIG. 1).

Molecular rigidification of the NFAs of the disclosure provides examples of the molecular design strategies to be used in this systematic process of increasing both PCE and T80 to meet the objectives.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A compound having a structure represented by one of the Formulae (I)-(VI):

(I)
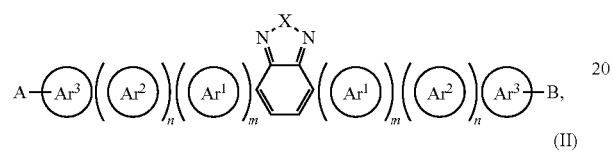

(II)
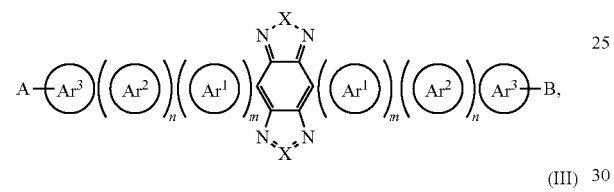

(III)
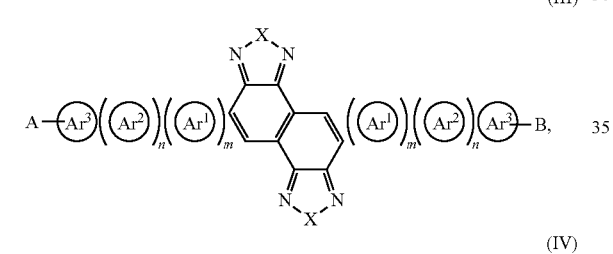

(IV)
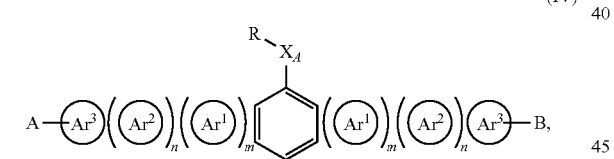

(V)
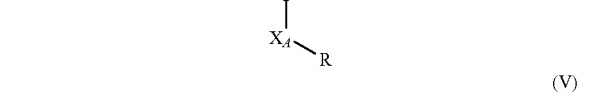

(V)
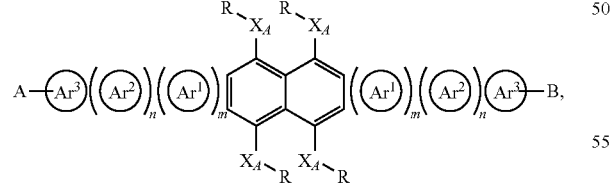

(V)
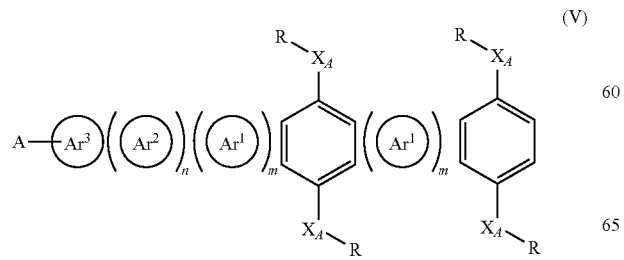

-continued

wherein:
A and B are individually selected from the group consisting of:

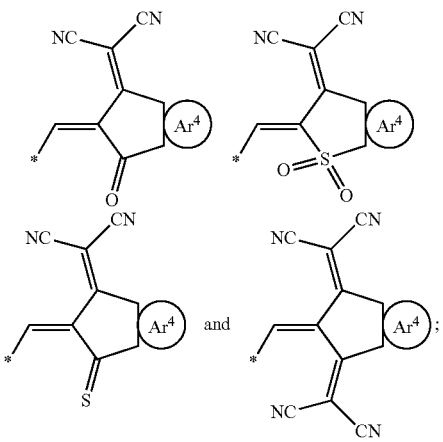

each $Ar^1$ is individually selected from the group consisting of:

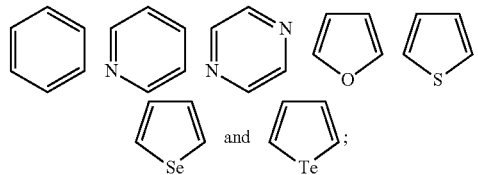

each $Ar^2$ is individually selected from the group consisting of:

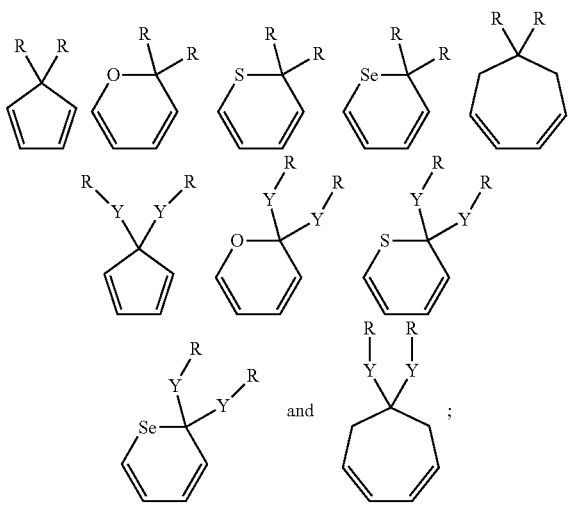

each $Ar^3$ is individually selected from the group consisting of:

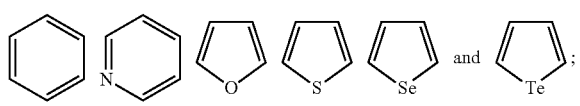;

each Ar⁴ is individually selected from the group consisting of:

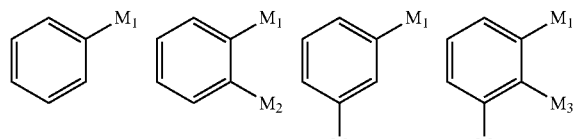
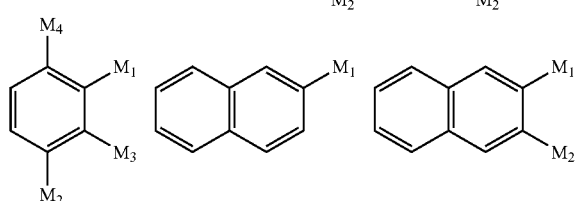
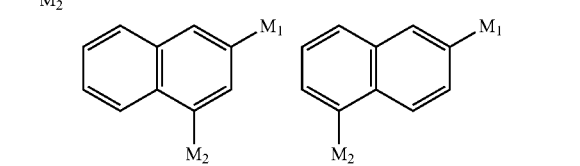
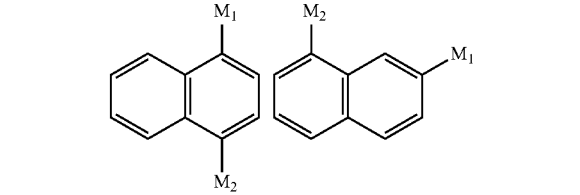
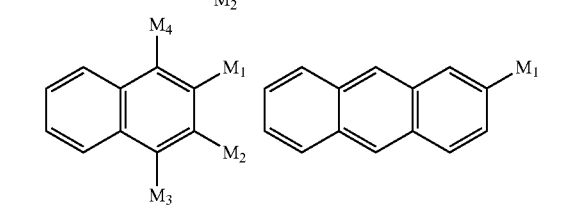
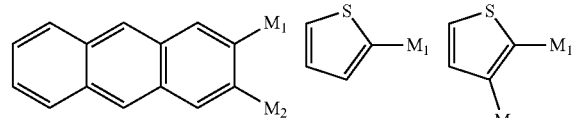
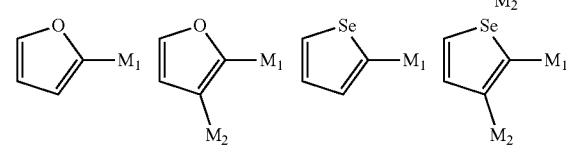
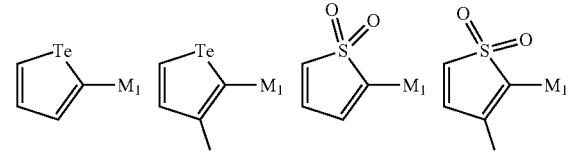
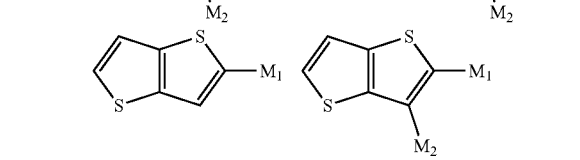

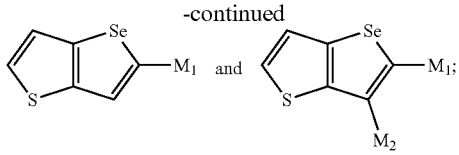

$M_1$-$M_4$ are individually selected from the group consisting of hydrogen, fluorine, chlorine, bromine, iodine, astatine, and a cyano group, wherein at least one of $M_1$-$M_4$ is a halogen;

each X is individually selected from the group consisting of S, NR, Se, Te, and O;

each R is individually a $C_1$-$C_{20}$ hydrocarbon or an aromatic hydrocarbon;

each Y is individually selected from the group consisting of:

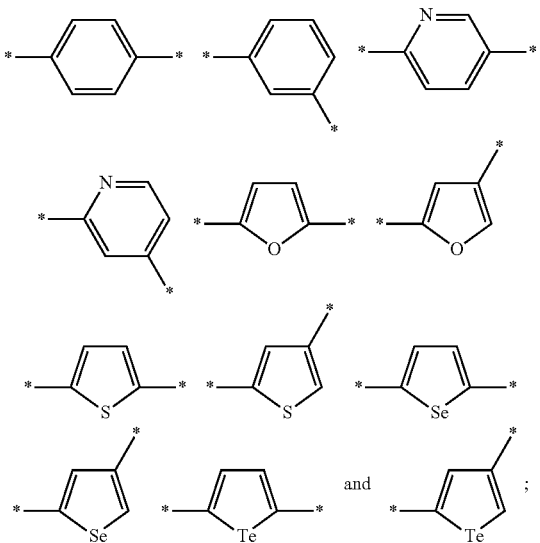

each m is an integer from 0 to 10; and each n is an integer from 0 to 10.

2. The compound of claim 1, wherein each Ar¹, each Ar³ or each Ar¹ and Ar³ is:

.

3. The compound of claim 1, wherein A or B is:

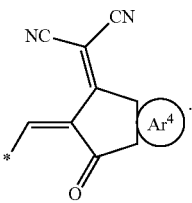 [SMILES: */C=C1\C(=O)CCC1=C(C#N)C#N].

4. The compound of claim 1, wherein $Ar^4$ is:

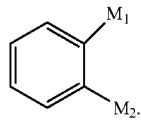

5. The compound of claim 1, wherein A or B is:

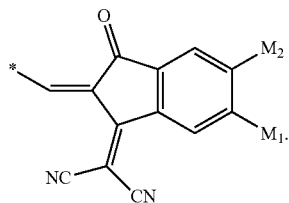

6. The compound of claim 1, wherein at least one of $M_1$-$M_4$ is chloride.

7. The compound of claim 1, wherein each R is selected from the group consisting of:

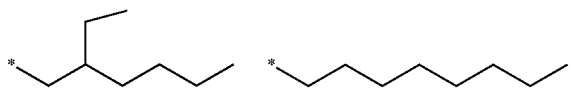

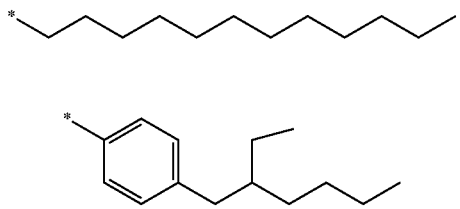

-continued

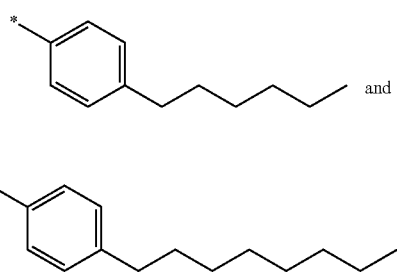

and

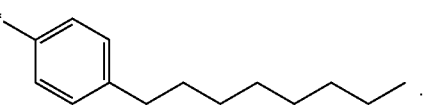

8. The compound of claim 1, wherein each R is 2-ethylhexyl.

9. The compound of claim 1, wherein each Y is:

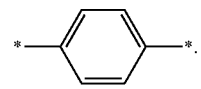

10. The compound of claim 1, wherein the compound has one of formulae (Ia), (Ib), (IIIa) and (IIIb):

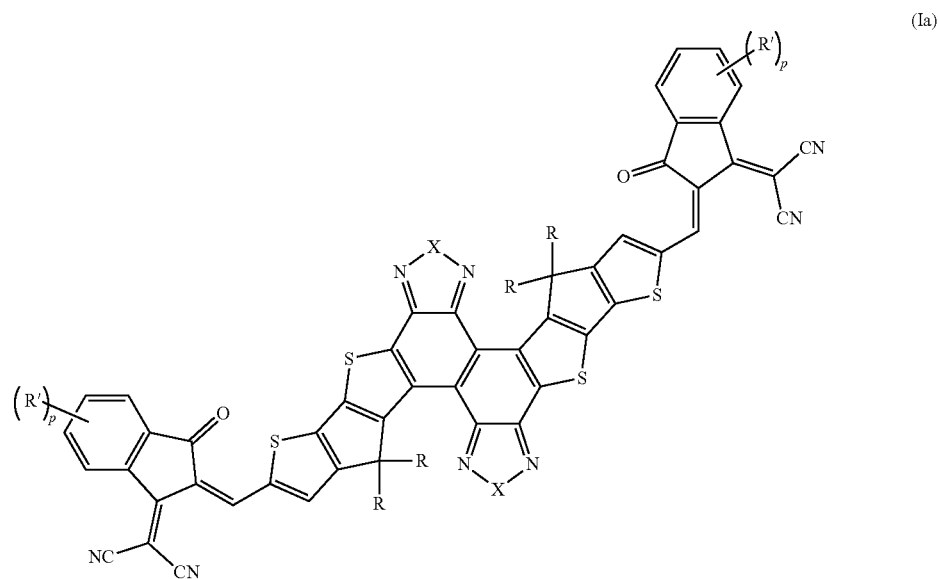

(Ia)

-continued
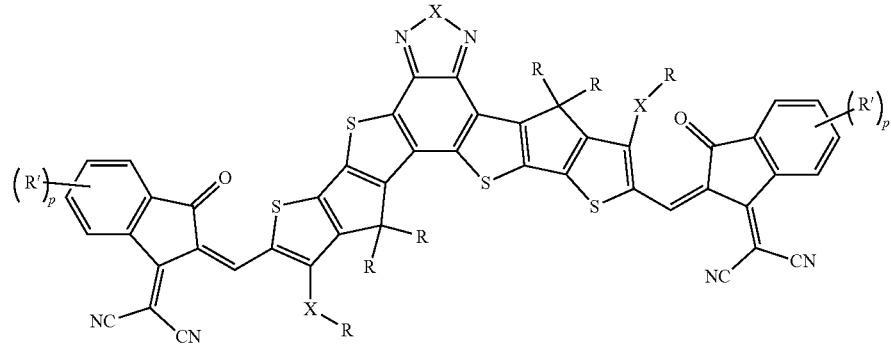
(Ib)
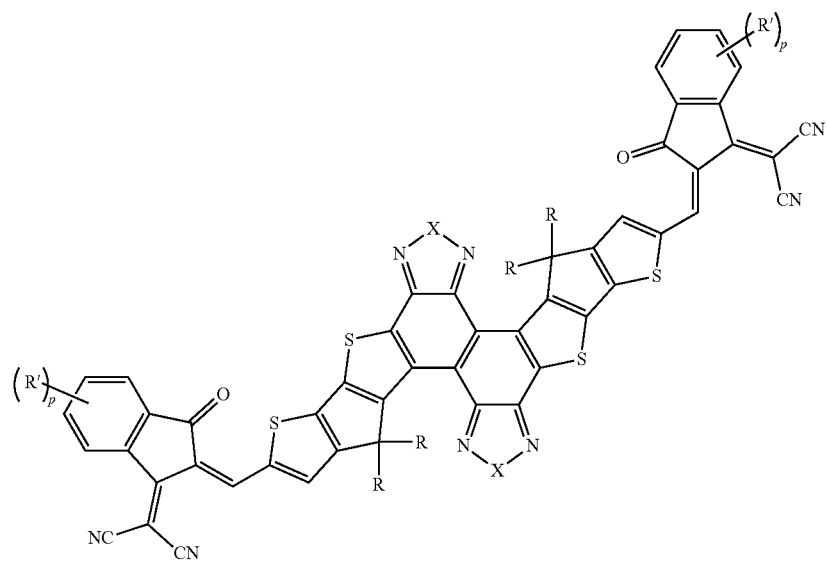
(IIIa)
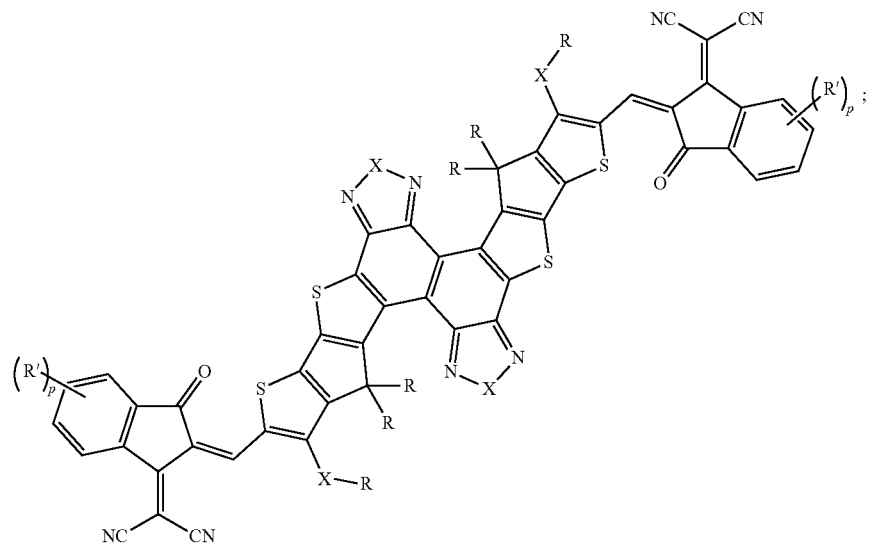
(IIIb);

wherein:
each X is independently selected from the group consisting of S, NR, Se, Te, and O;
each R is independently selected from a $C_1$-$C_{20}$ hydrocarbon, an aromatic hydrocarbon wherein the hydrocarbon, and aromatic hydrocarbon are each optionally substituted;
each R' is independently a halogen; and
each p is independently an integer from 0-4.

11. The compound of claim 1, wherein the compound is selected from the group consisting of:

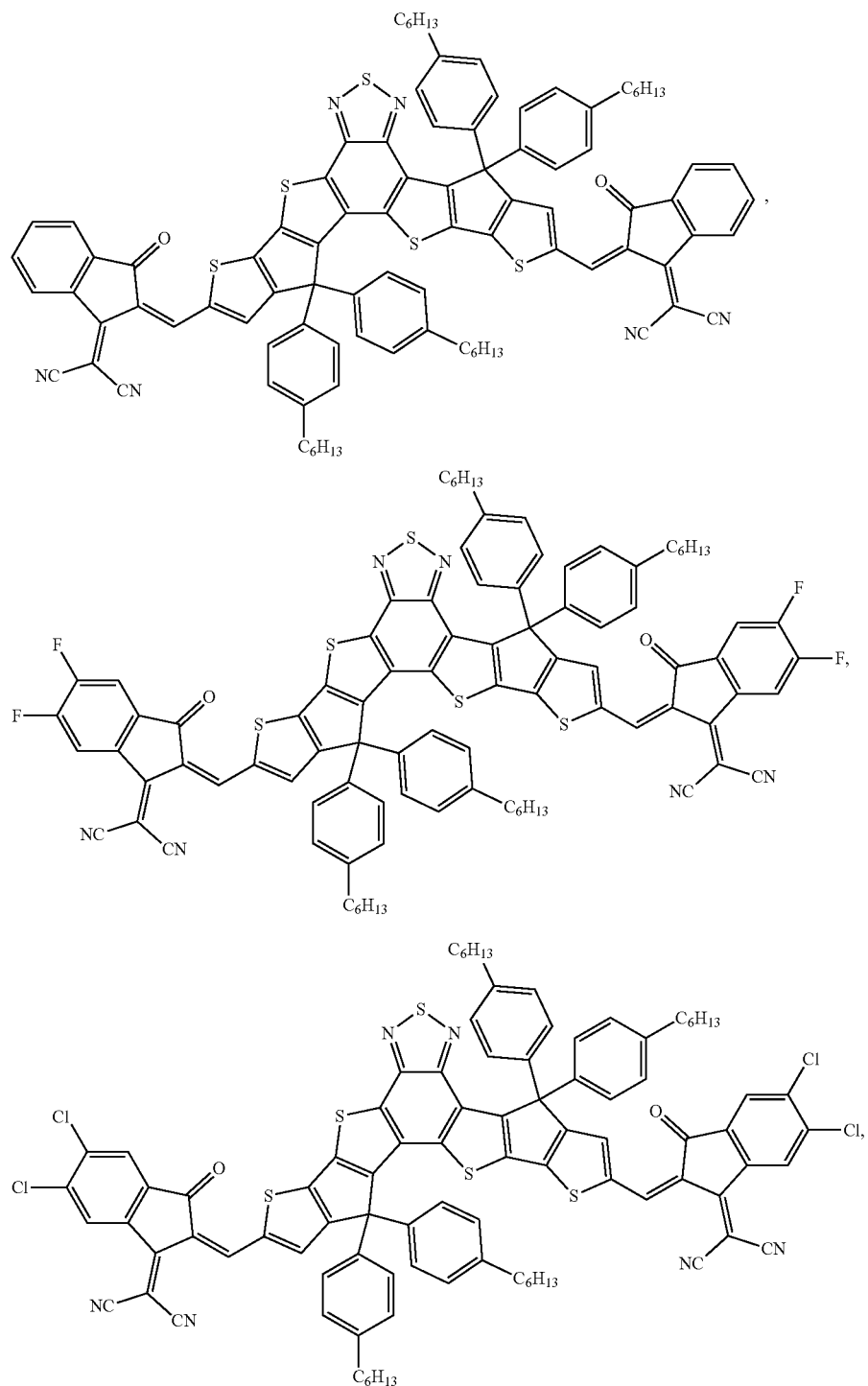

-continued
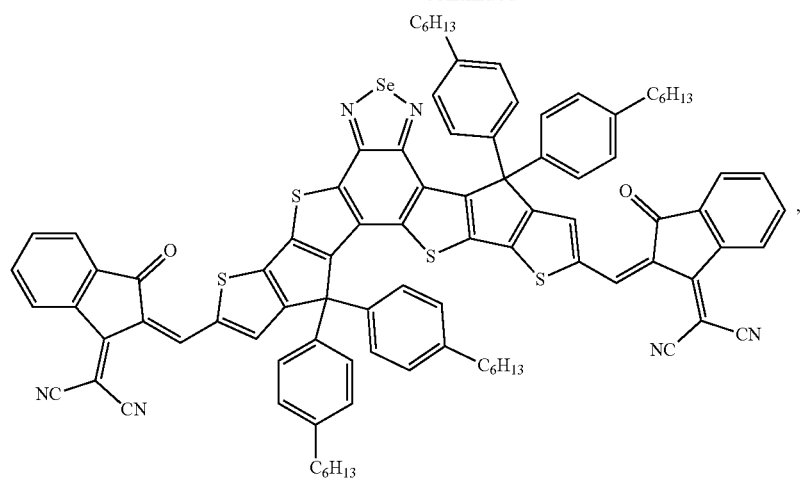
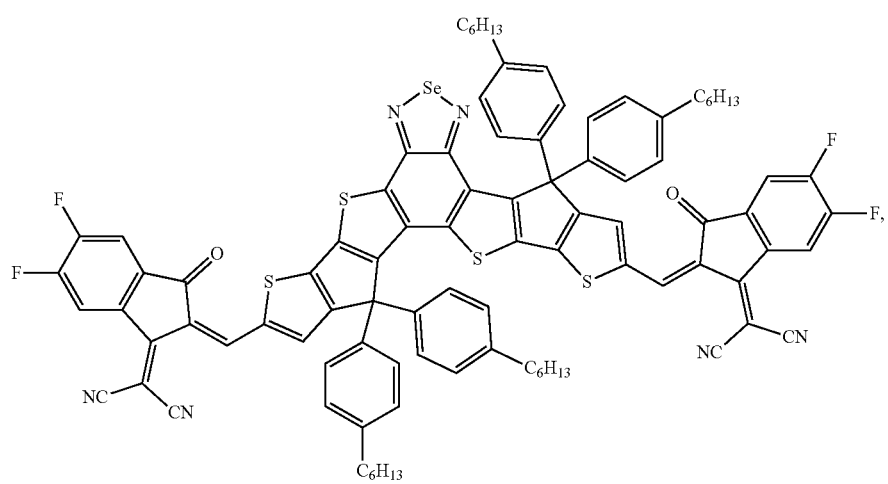
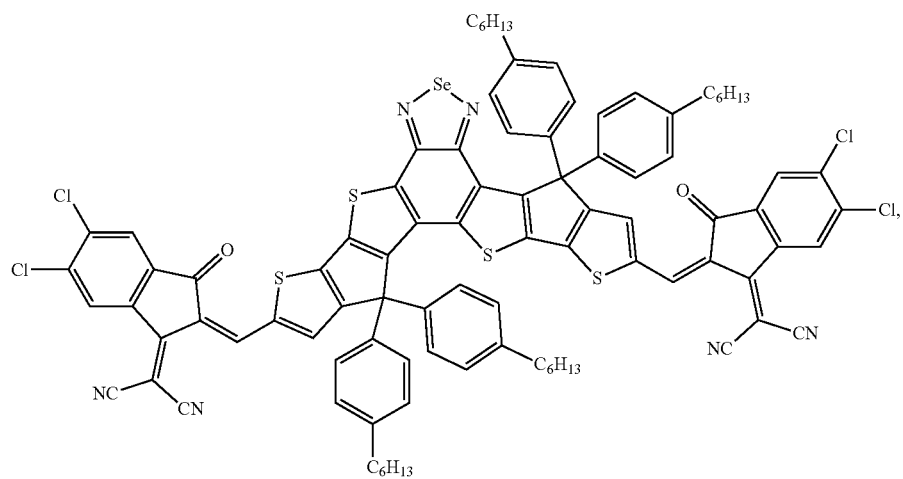

-continued
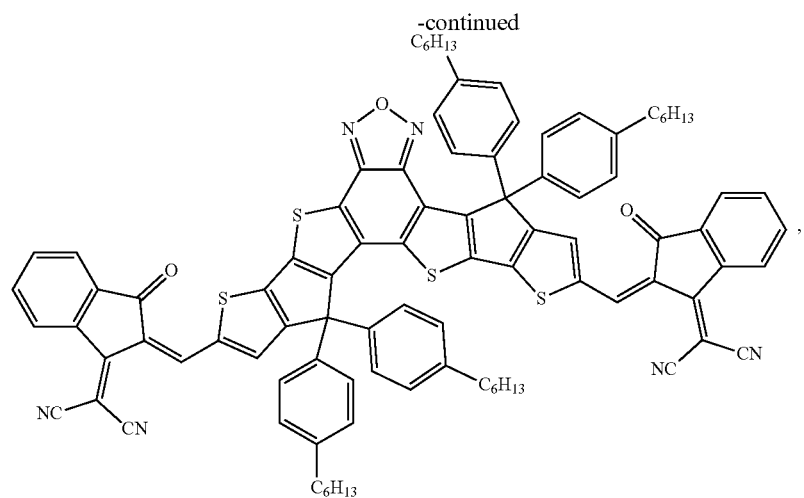
,
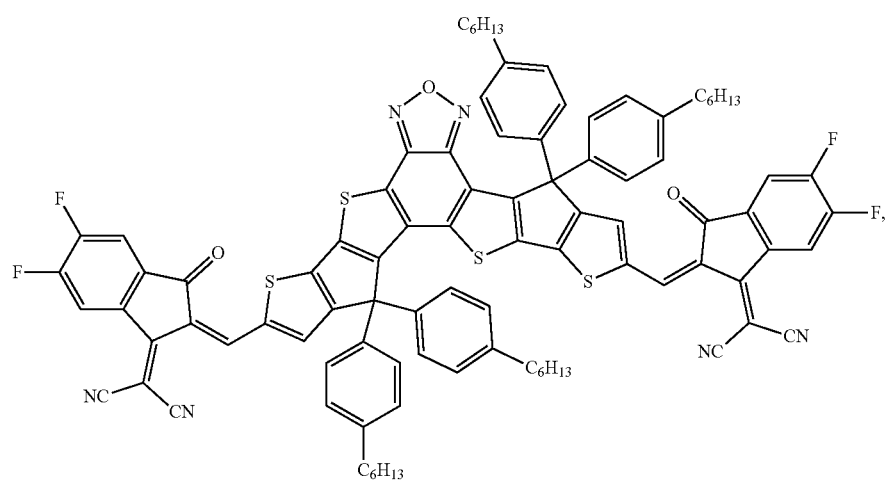
,
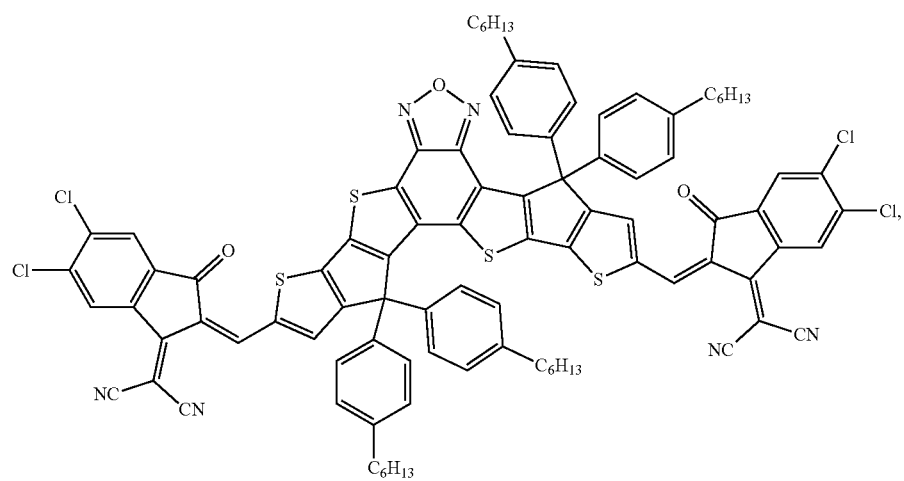

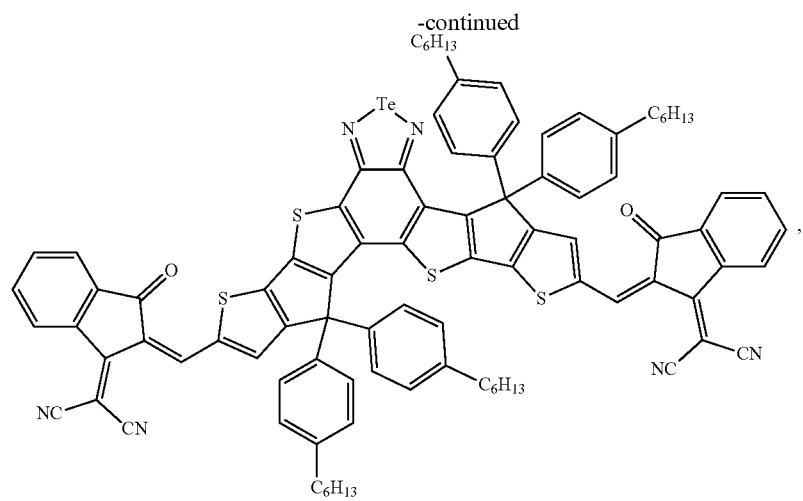
,
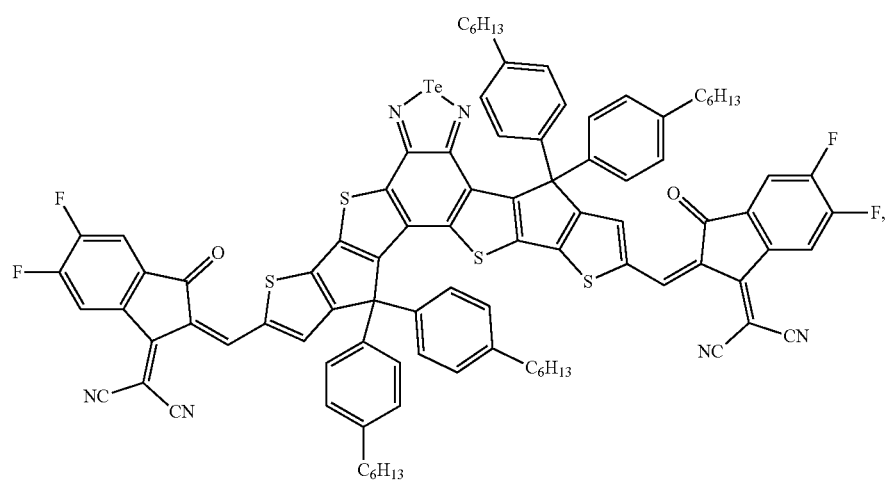
,
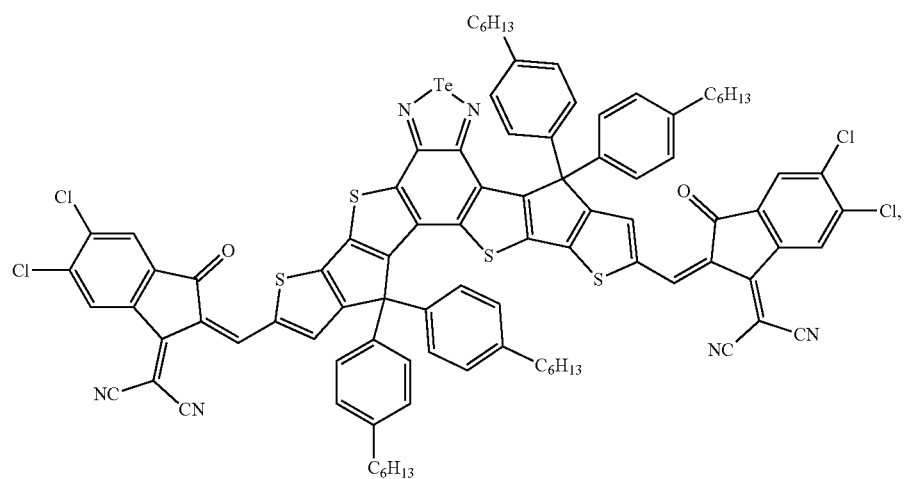

-continued
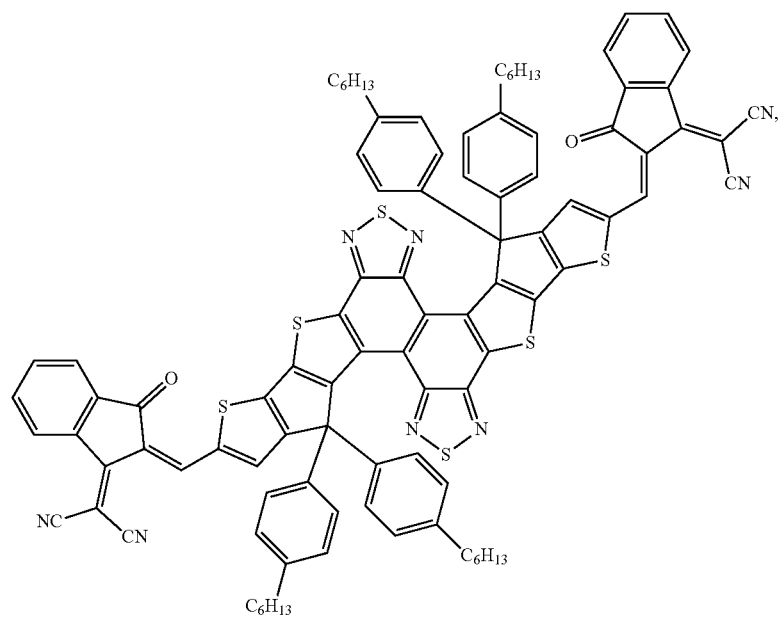
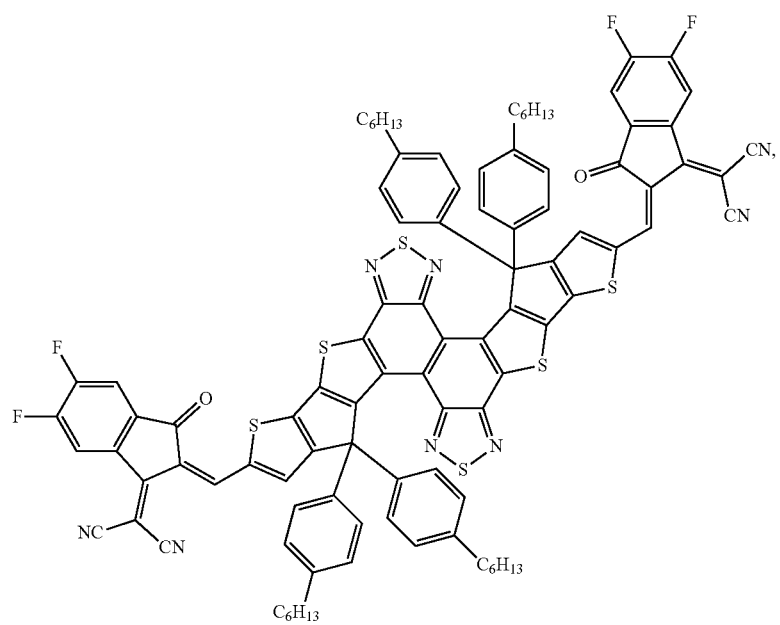

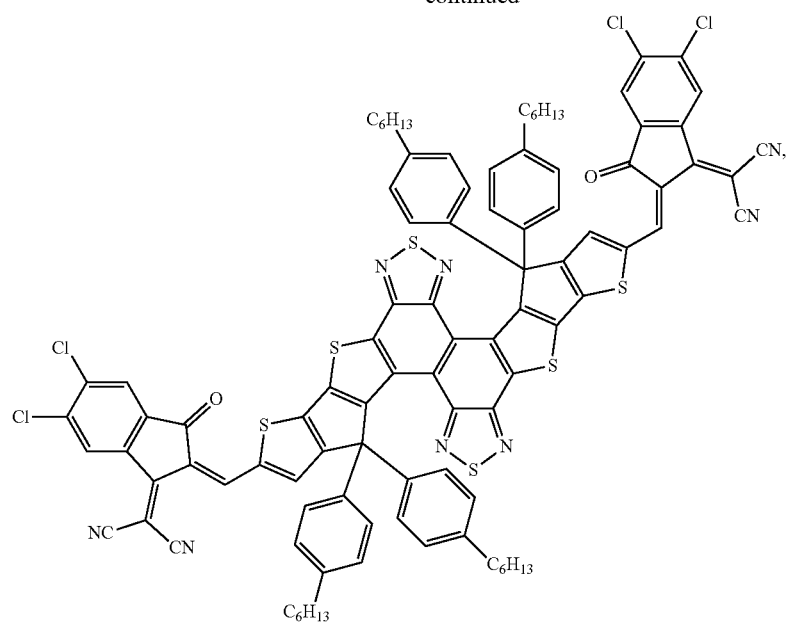
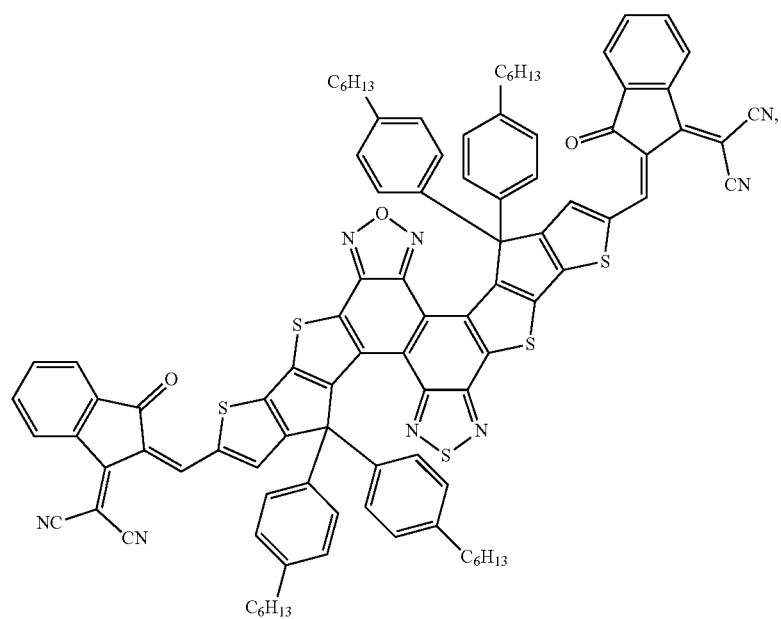

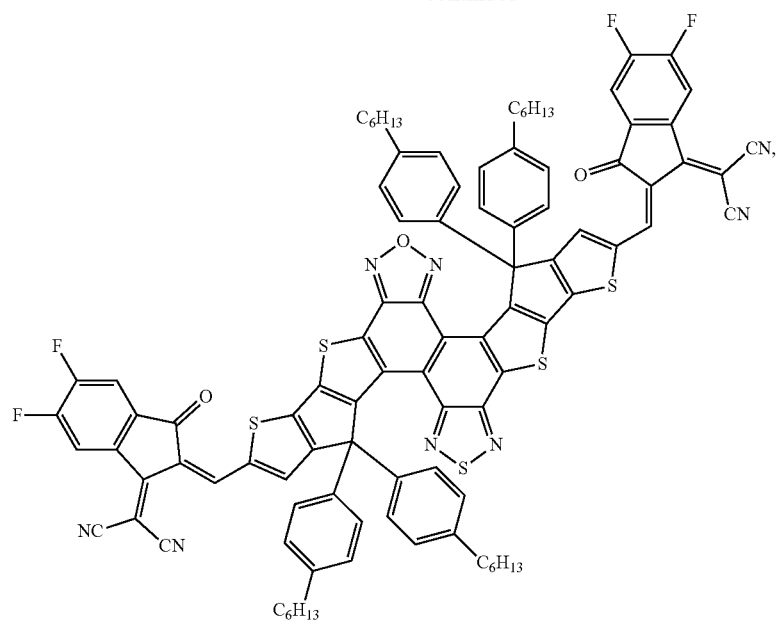
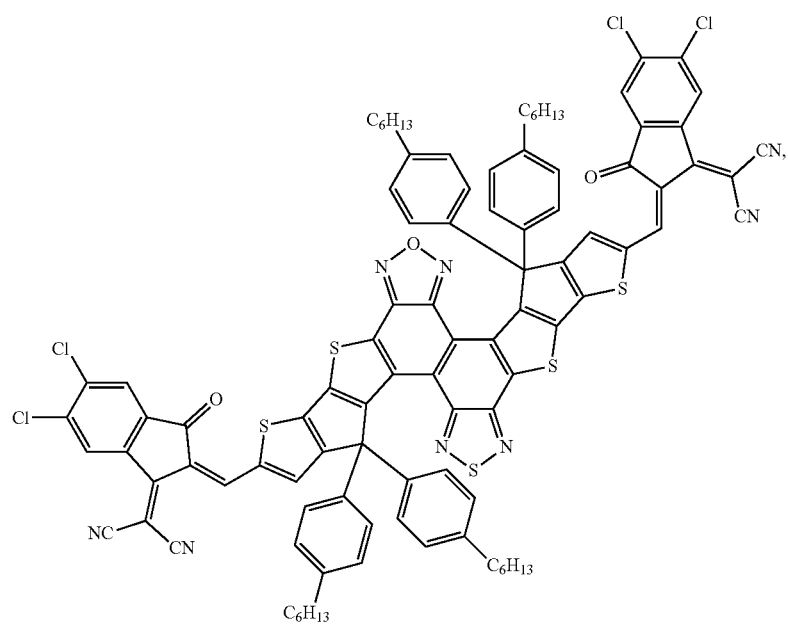

-continued
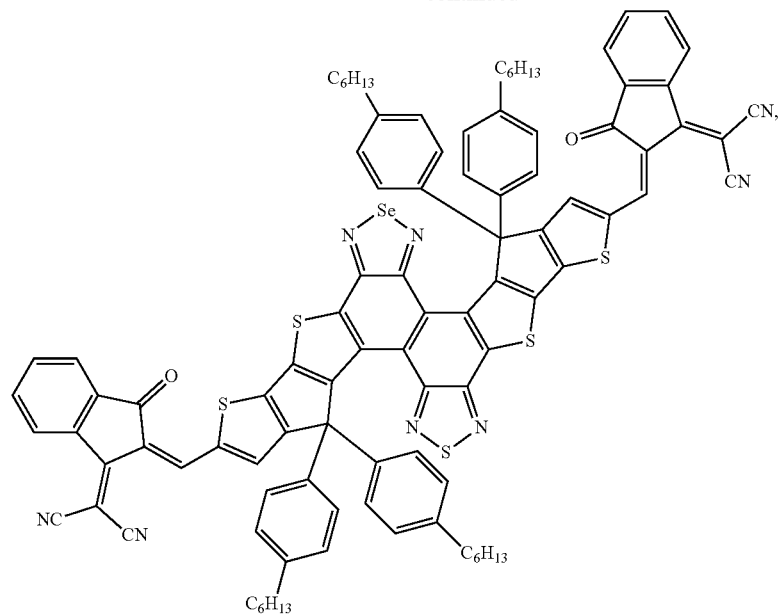
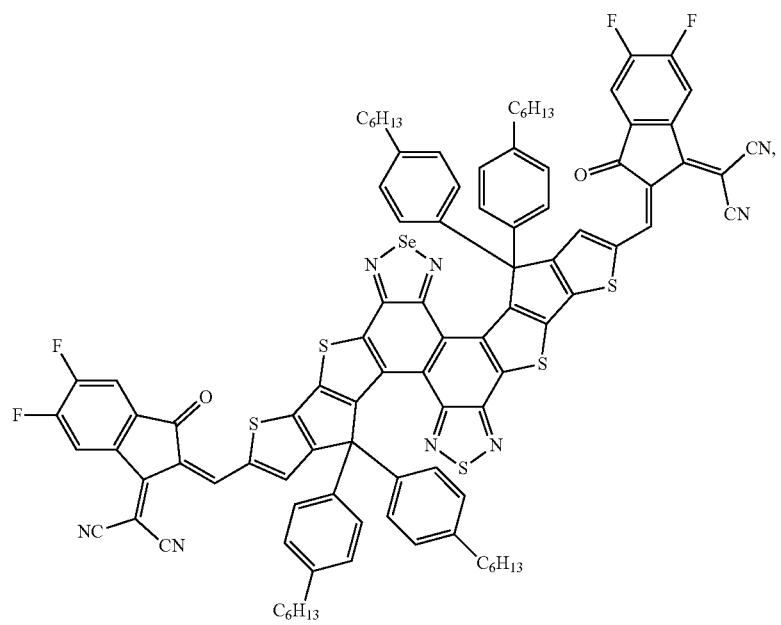

-continued
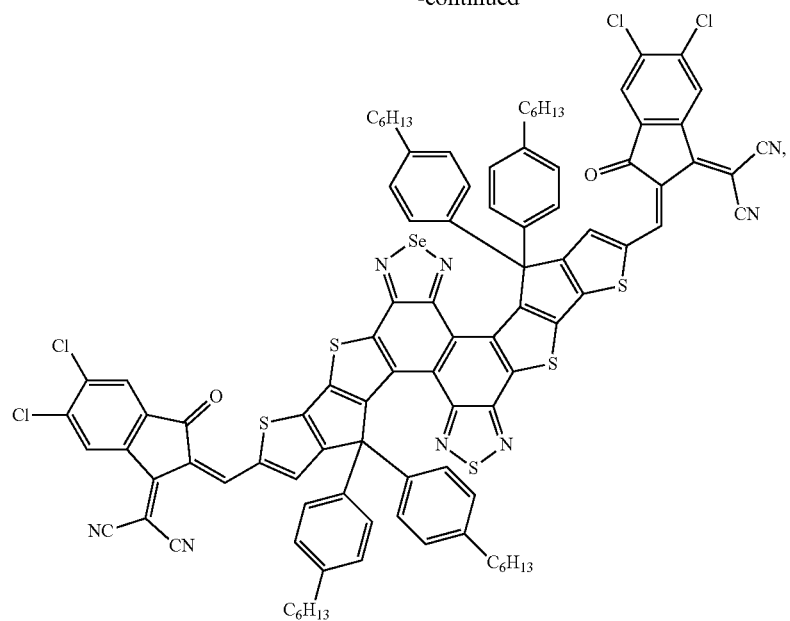
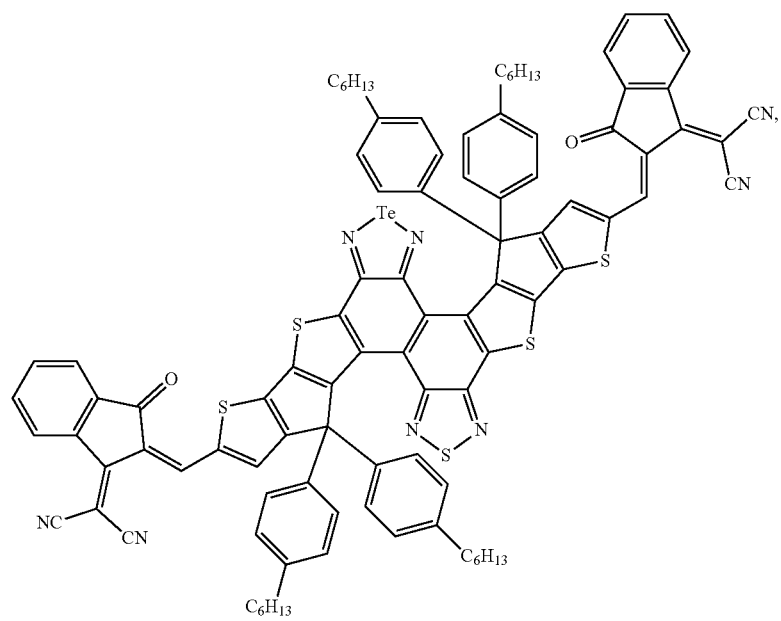

-continued
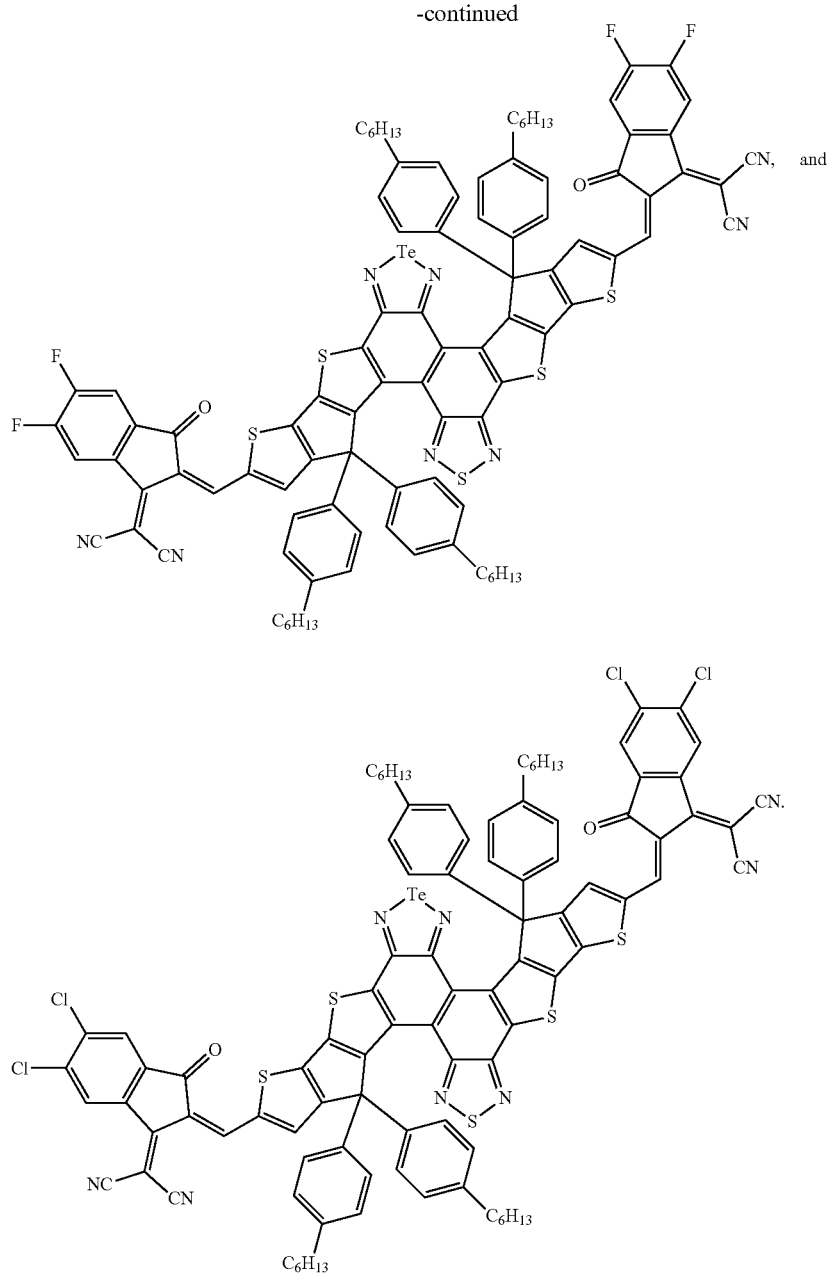
12. An organic photovoltaic device comprising:
an anode;
a cathode; and
an organic layer, disposed between the anode and the cathode, comprising a compound having a structure represented by one of the Formulae (I)-(VI):
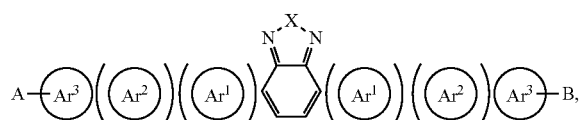
(I)
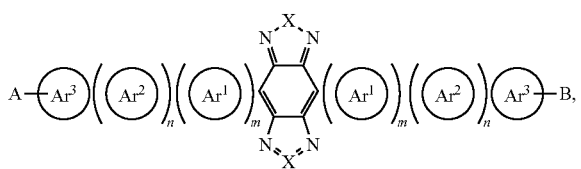
(II)

(III)
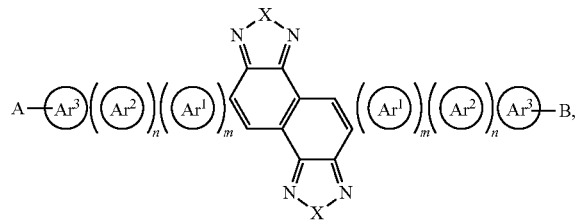
(IV)
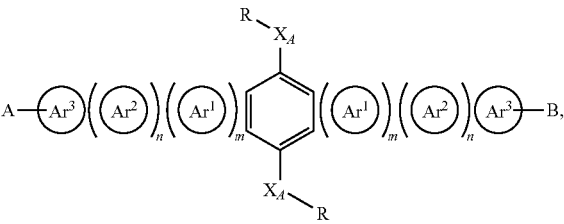
(V)
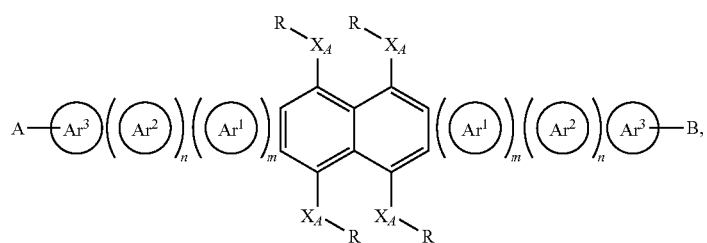
(VI)
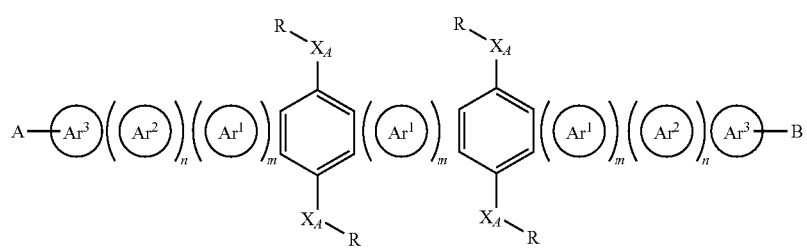
wherein:
A and B are individually selected from the group consisting of:
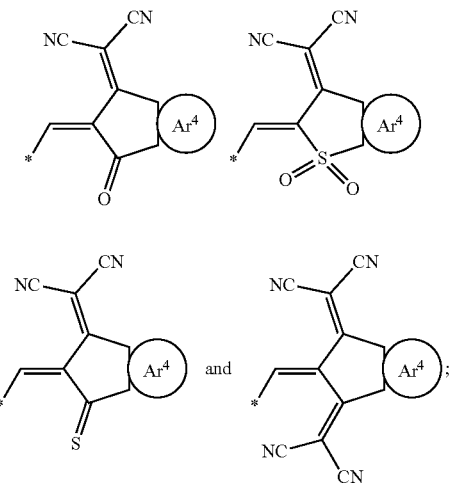
each Ar¹ is individually selected from the group consisting of:
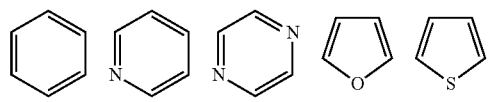
and 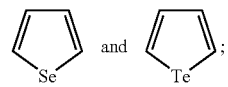;
each Ar² is individually selected from the group consisting of:
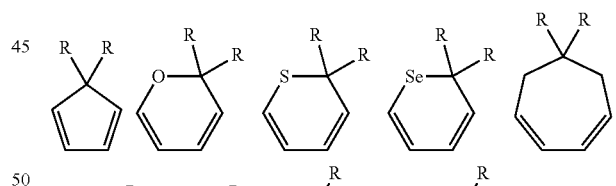
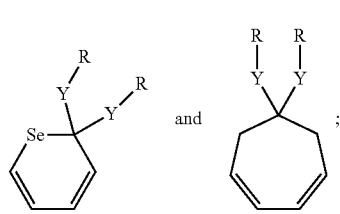
each Ar³ is individually selected from the group consisting of:

111

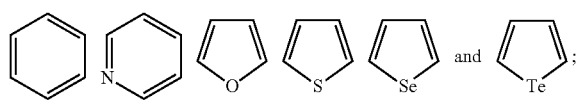

each Ar⁴ is individually selected from the group consisting of:

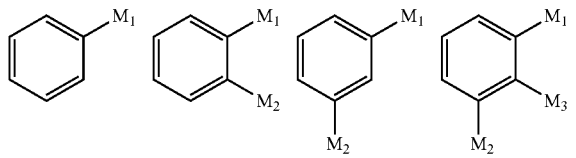

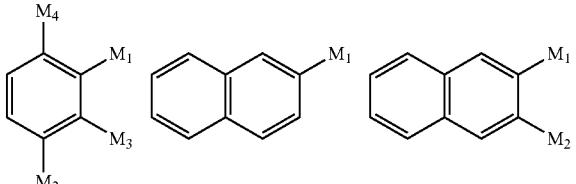

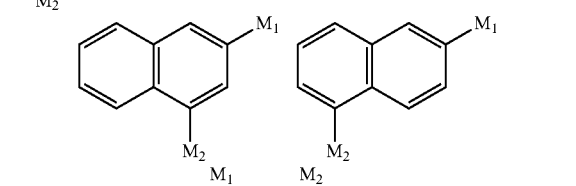

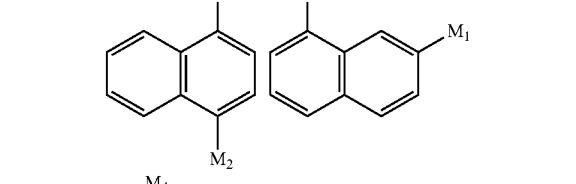

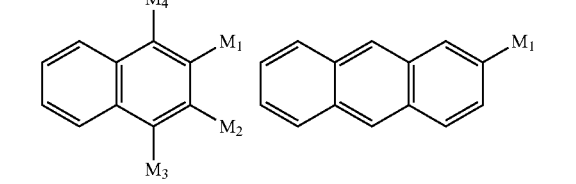

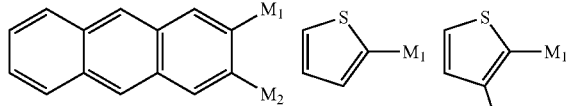

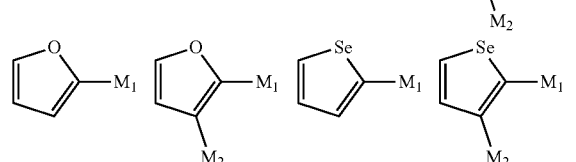

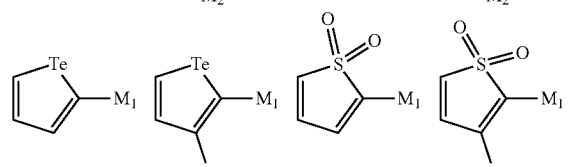

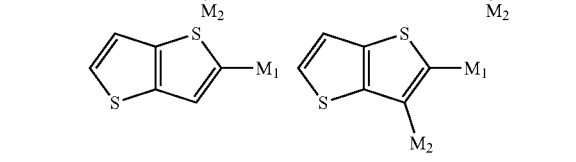

112

-continued

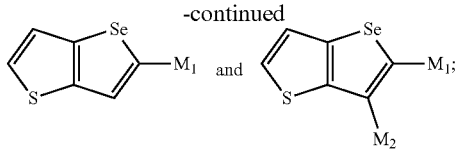

$M_1$-$M_4$ are individually selected from the group consisting of hydrogen, fluorine, chlorine, bromine, iodine, astatine, and a cyano group, wherein at least one of $M_1$-$M_4$ is a halogen;

each X is individually selected from the group consisting of S, NR, Se, Te, and O;

each R is individually a $C_1$-$C_{40}$ hydrocarbon or an aromatic hydrocarbon;

each Y is individually selected from the group consisting of:

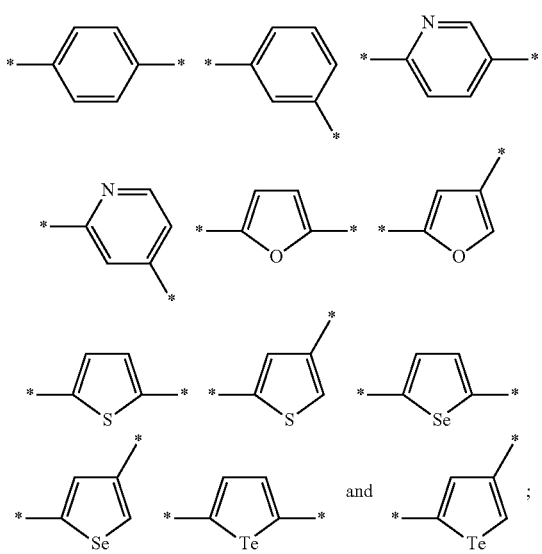

each m is an integer from 0 to 10; and
each n is an integer from 0 to 10.

13. The organic photovoltaic device of claim 12, wherein each R is independently selected from the group consisting of

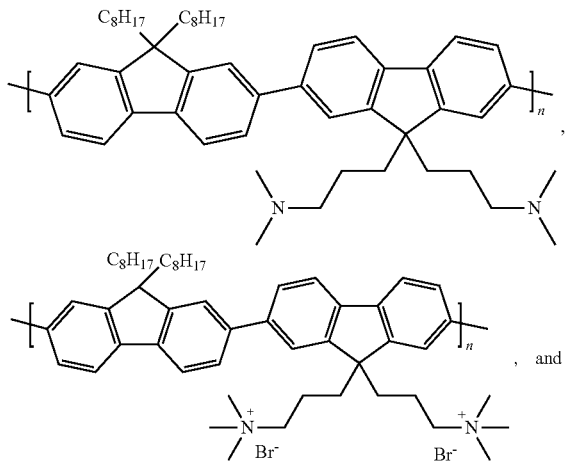

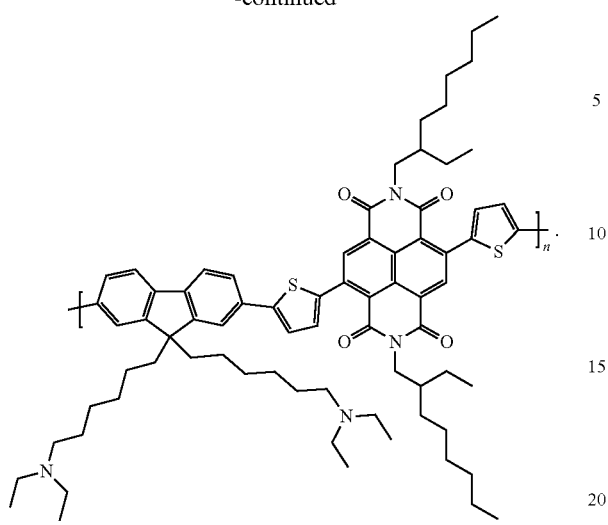
14. The organic photovoltaic device of claim 12, wherein the device further comprises at least one selected from the group consisting of hole transporting layer, an electrode transporting layer, an anode buffer, and a cathode buffer.
15. The organic photovoltaic device of claim 14, wherein the cathode buffer comprises a material selected from the group consisting of:
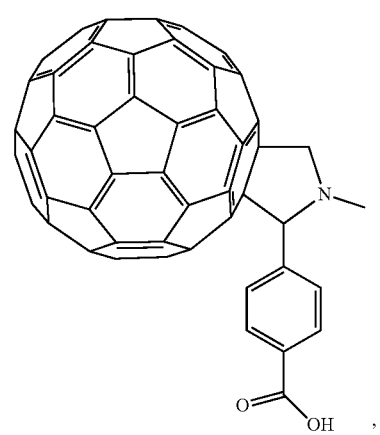
,
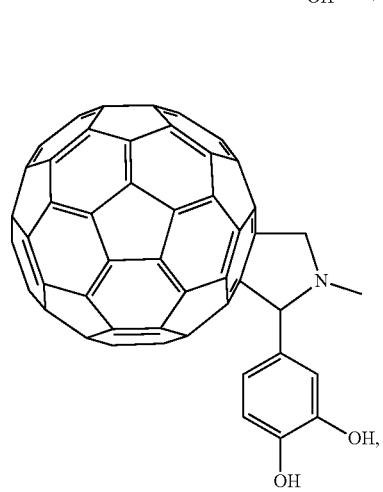
,
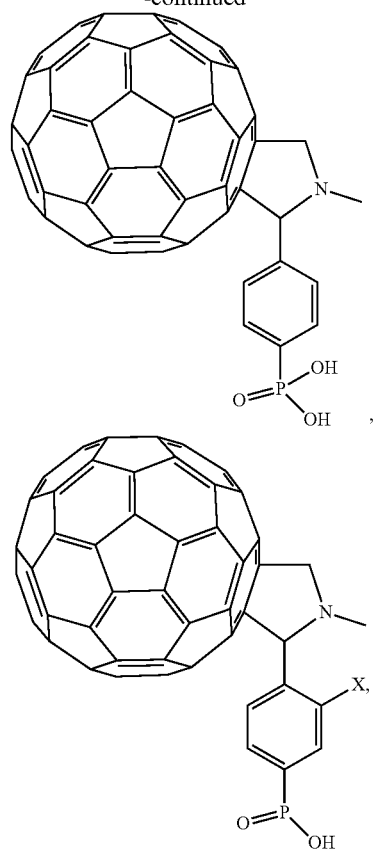
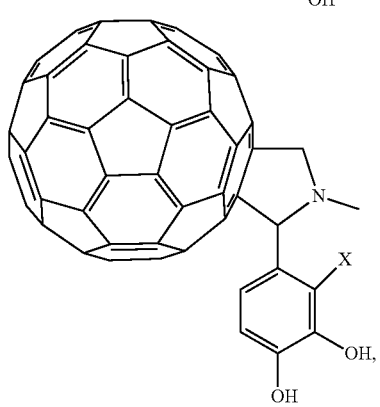
,
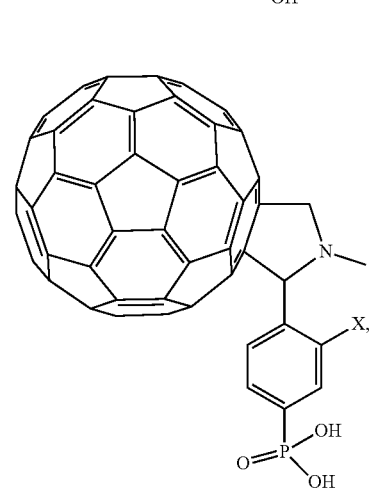

-continued
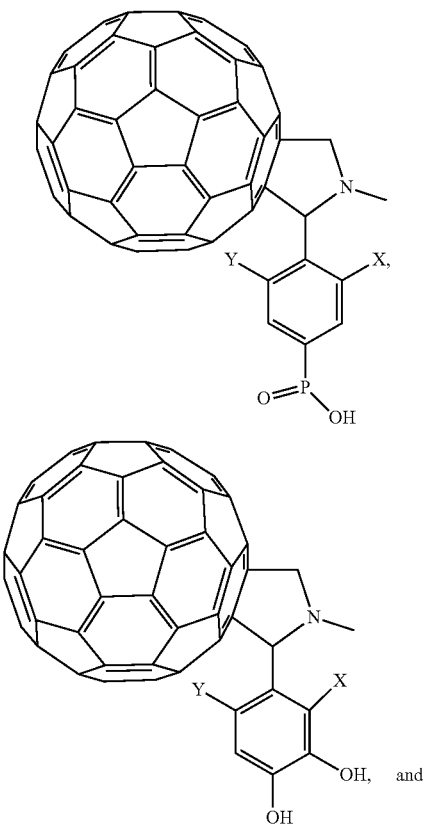
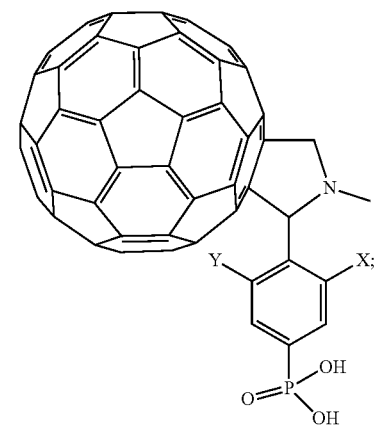
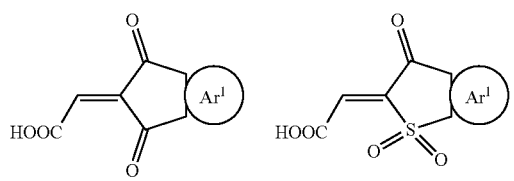
wherein each X is individually selected from the group consisting of oxygen, carbon, hydrogen, sulfur, selenium, and nitrogen;
each Y is individually selected from the group consisting of:
-continued
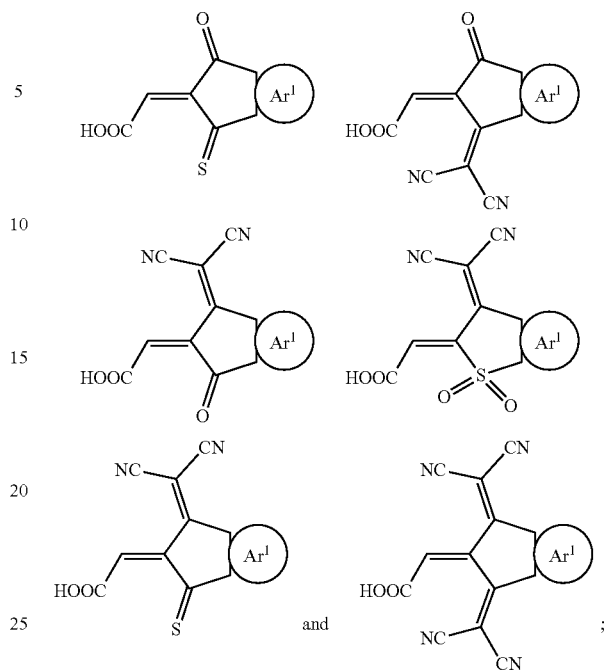
each Ar¹ is independently selected from the group consisting of:
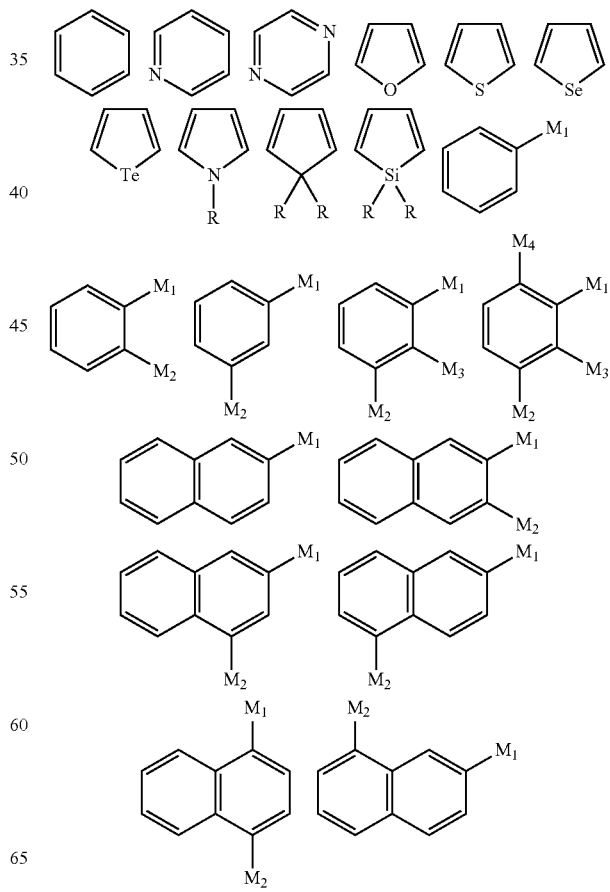

-continued

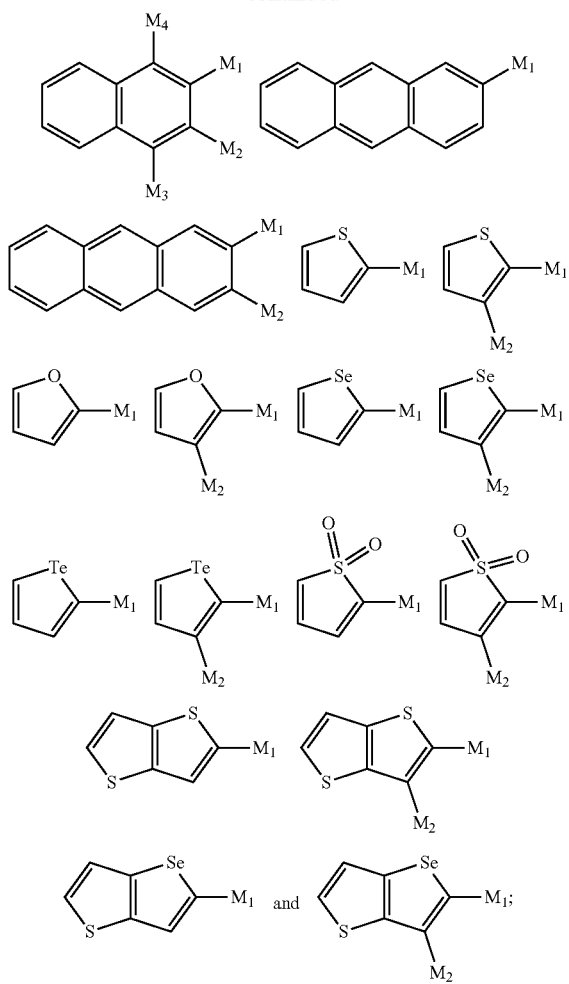

$M_1$-$M_4$ are each independently selected from the group consisting of hydrogen, fluorine, chlorine, bromine, iodine, astatine, and a cyano group, wherein at least one of $M_1$-$M_4$ is a halogen; and each R is independently a $C_1$-$C_{20}$ hydrocarbon or an aromatic hydrocarbon.

16. The organic photovoltaic device of claim 14, wherein the cathode buffer comprises a material selected from the group consisting of:

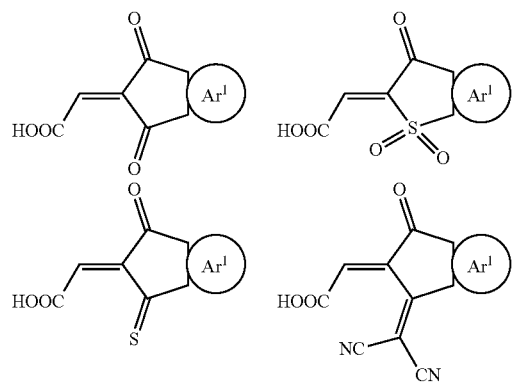

-continued

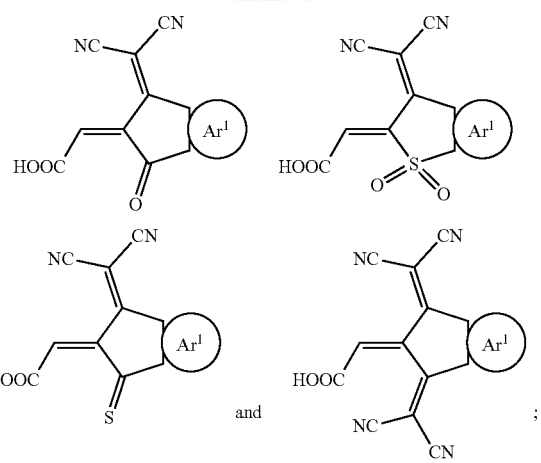

wherein each AO is independently selected from the group consisting of:

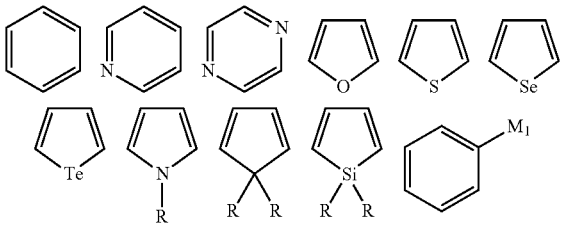

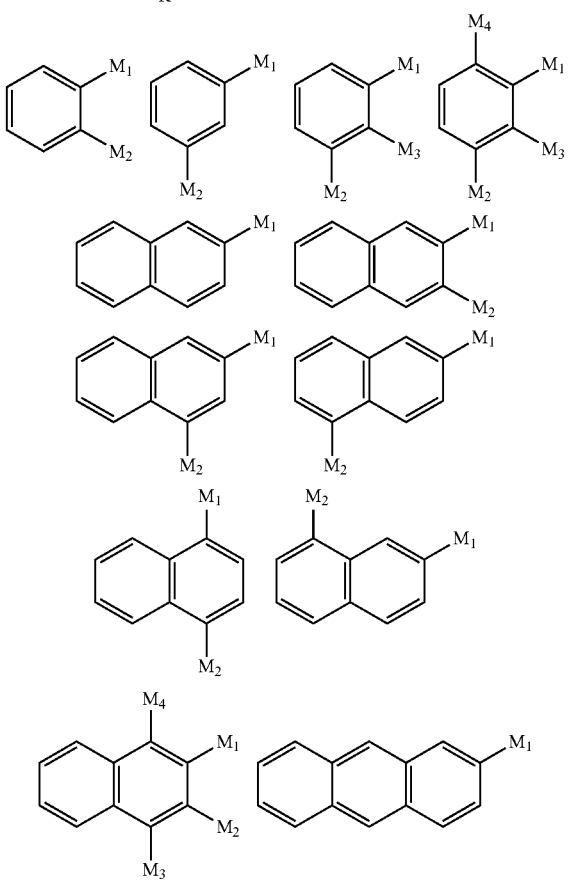

-continued

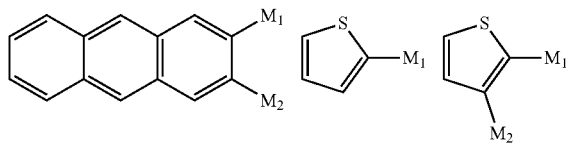

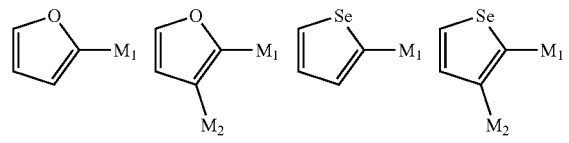

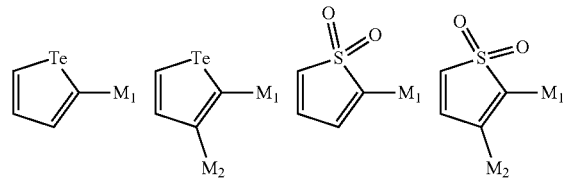

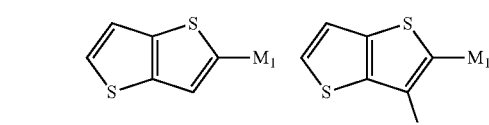

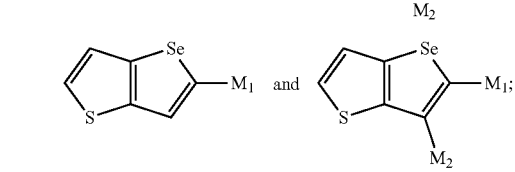

$M_1$-$M_4$ are each independently selected from the group consisting of hydrogen, fluorine, chlorine, bromine, iodine, astatine, and a cyano group, wherein at least one of $M_1$-$M_4$ is a halogen; and each R is independently a $C_1$-$C_{20}$ hydrocarbon or an aromatic hydrocarbon.

17. The organic photovoltaic device of claim 14, wherein the anode buffer comprises a material selected from the group consisting of:

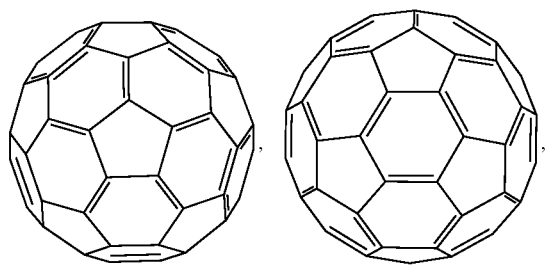

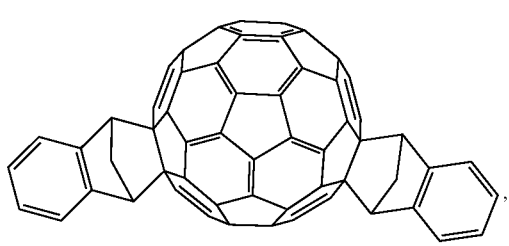

-continued

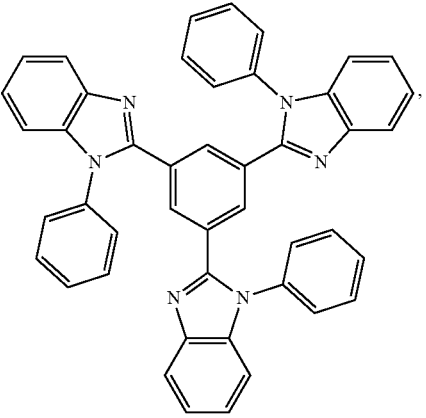

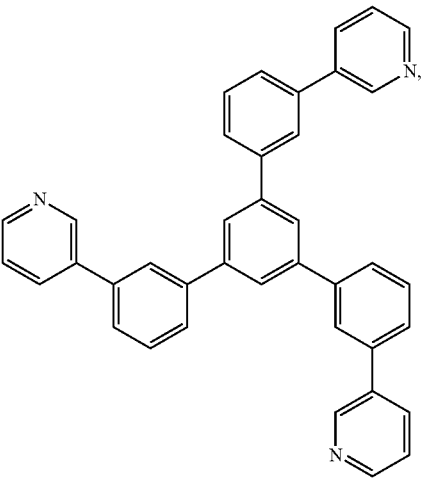

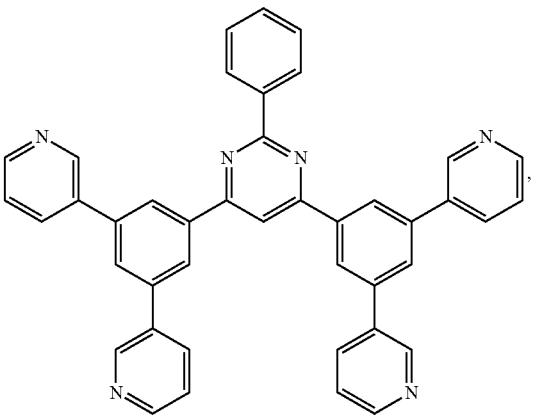

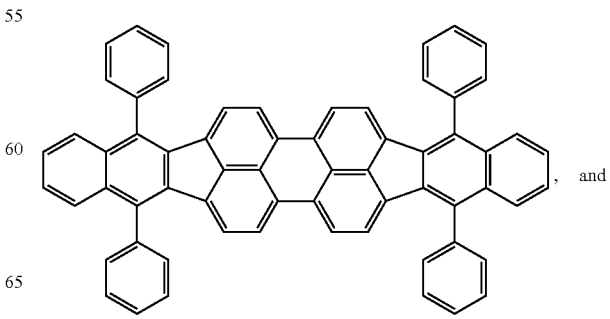

, and

-continued
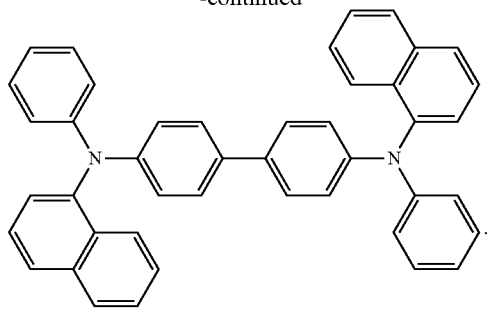
18. A formulation comprising the compound of claim 1.
19. A composition comprising a compound represented by one of formulae (I)-(VI) and at least one of a cathode buffer and an anode buffer:
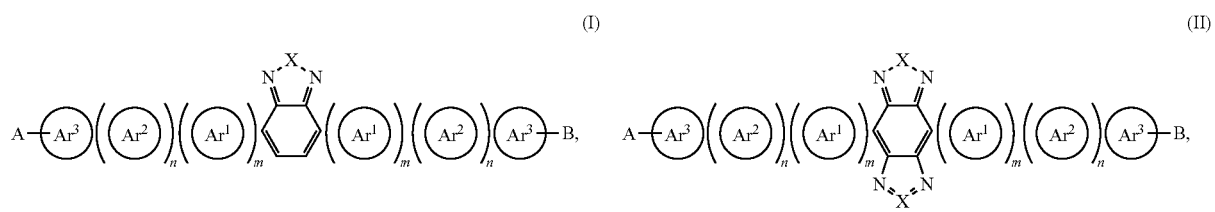
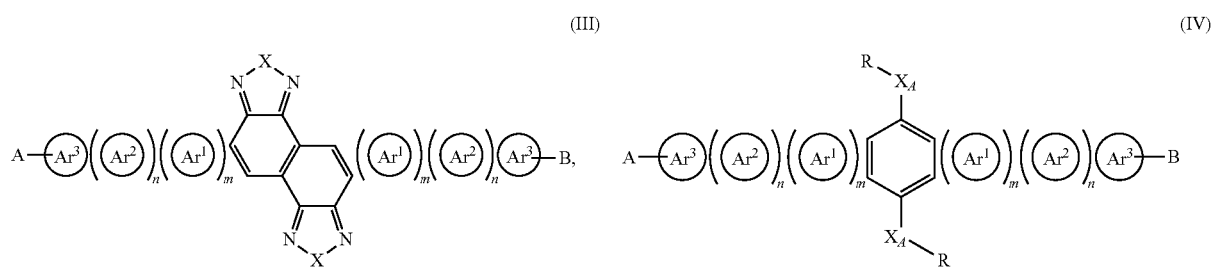
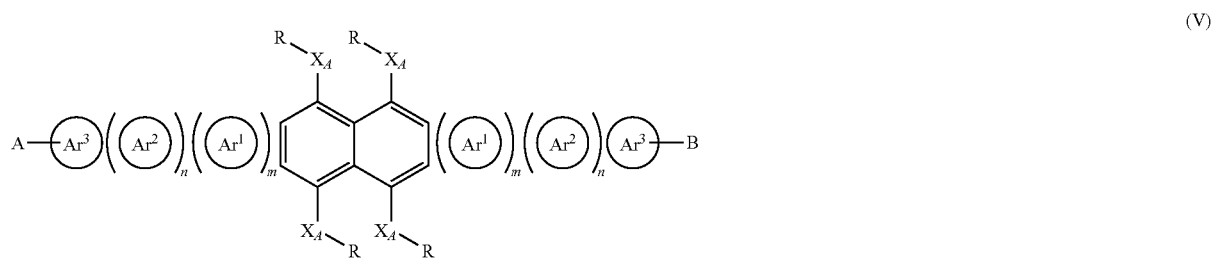
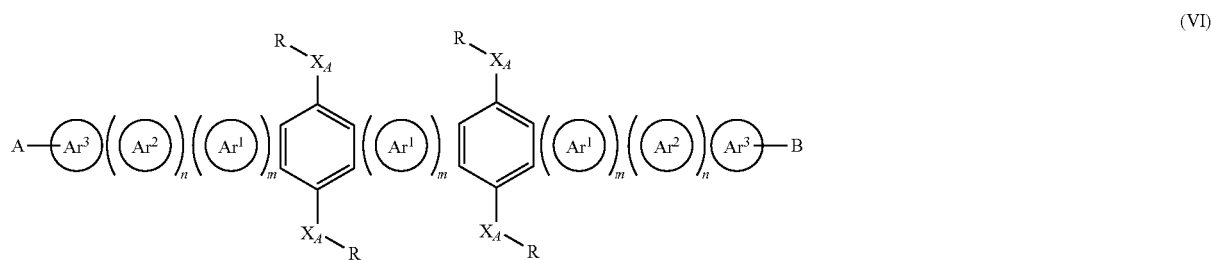

wherein:
A and B are individually selected from the group consisting of:
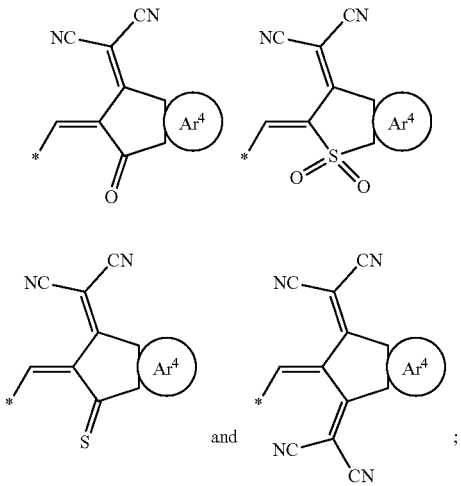
each $Ar^1$ is individually selected from the group consisting of:
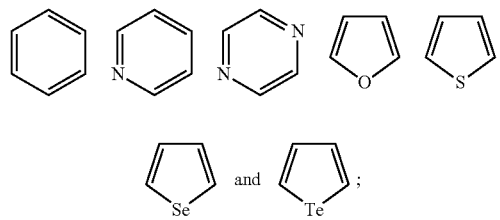
each $Ar^2$ is individually selected from the group consisting of:
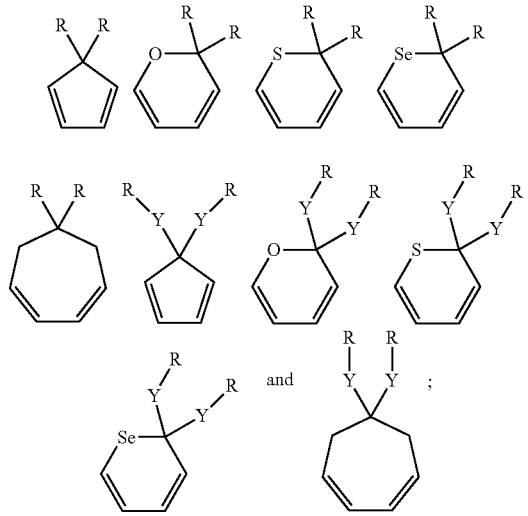
each $Ar^3$ is individually selected from the group consisting of:
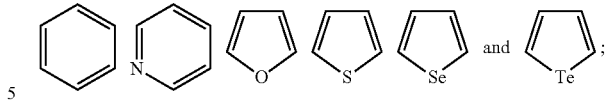
each $Ar^4$ is individually selected from the group consisting of:
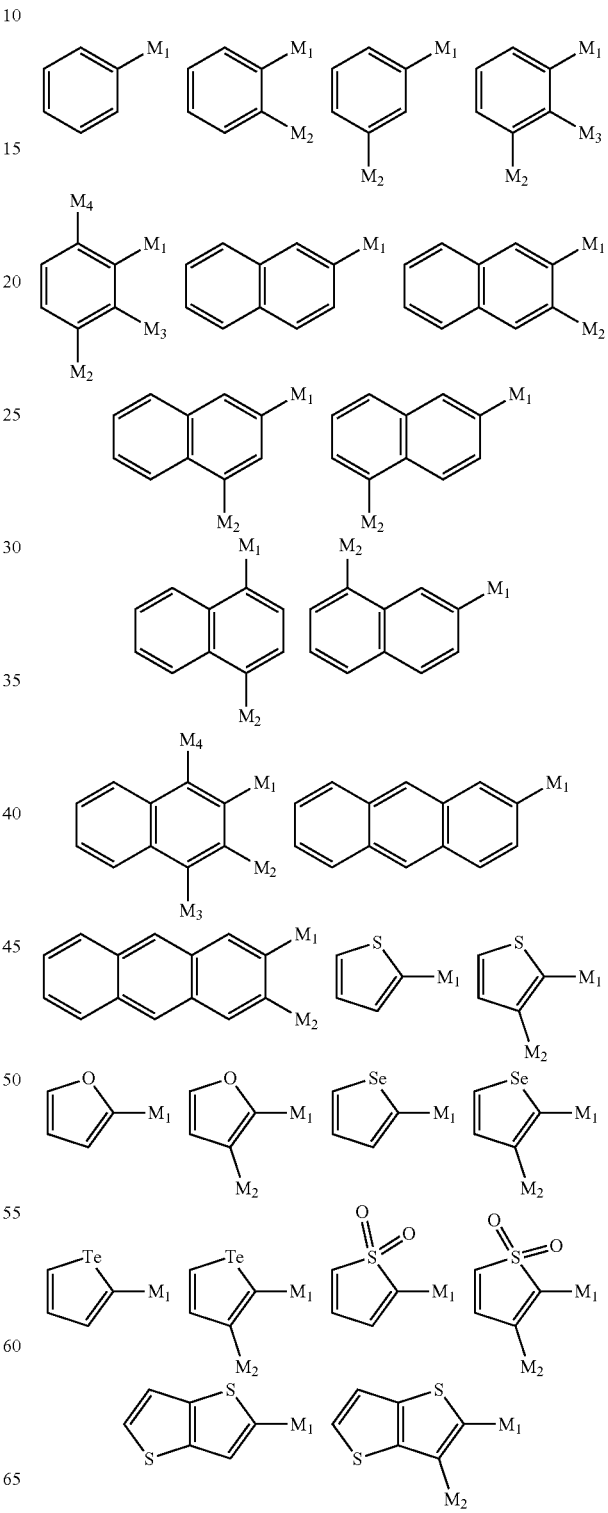

-continued

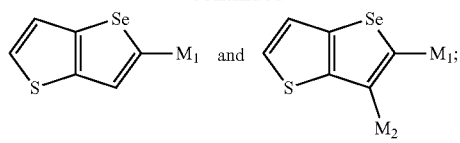

M$_1$-M$_4$ are individually selected from the group consisting of hydrogen, fluorine, chlorine, bromine, iodine, astatine, and a cyano group, wherein at least one of M$_1$-M$_4$ is a halogen;

each X is individually selected from the group consisting of S, NR, Se, Te, and O;

each X$_A$ is individually selected from the group consisting of CRR, O, S, Se and NR;

each R is individually a Ci-Cao hydrocarbon or an aromatic hydrocarbon;

each Y is individually selected from the group consisting of:

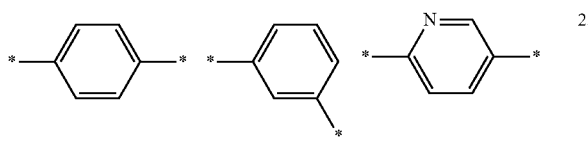

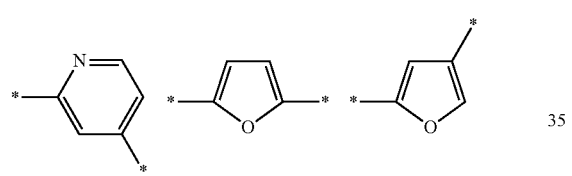

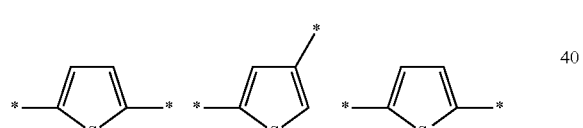

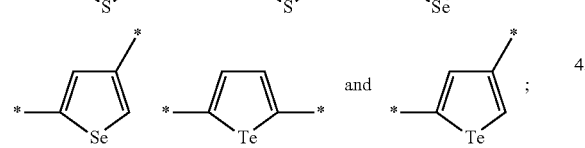

each m is an integer from 0 to 10; and
each n is an integer from 0 to 10;

the anode buffer comprises a material selected from the group consisting of:

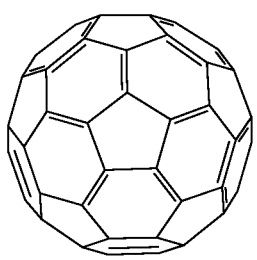

-continued

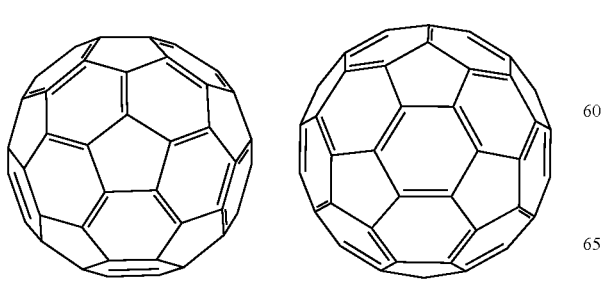

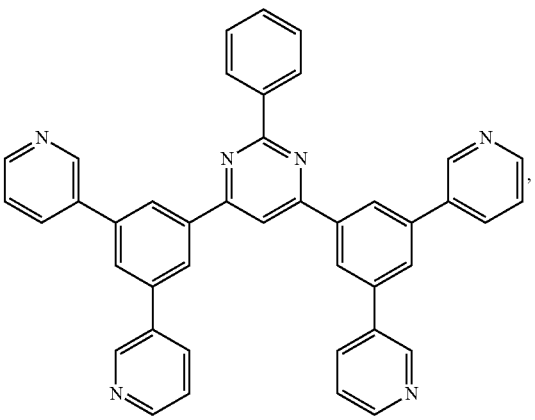

-continued
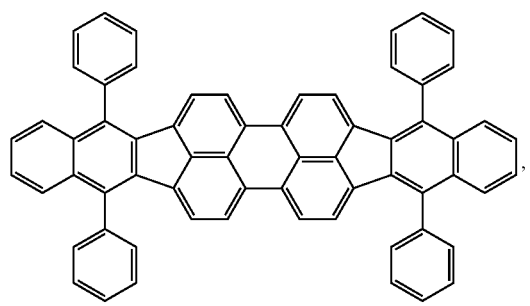, and
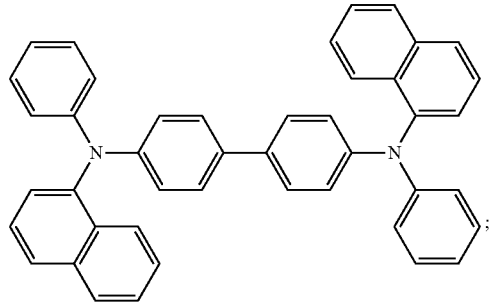;
and
the cathode buffer comprises a material selected from the group consisting of:
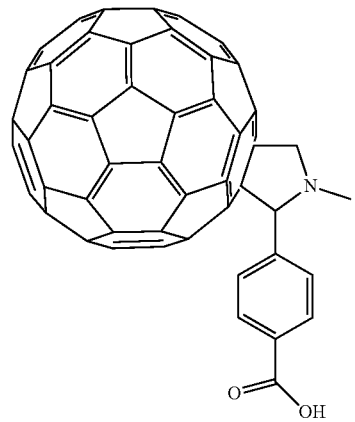
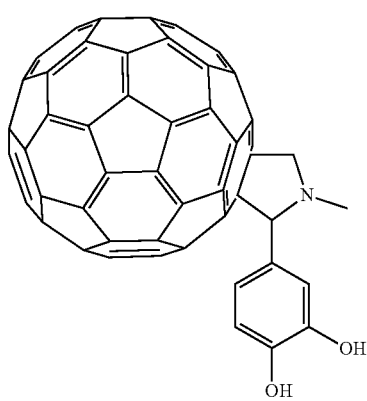
-continued
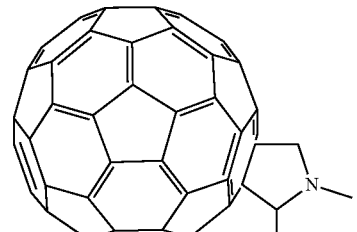
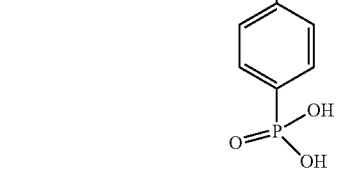
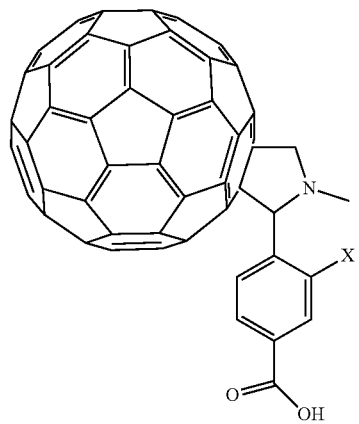
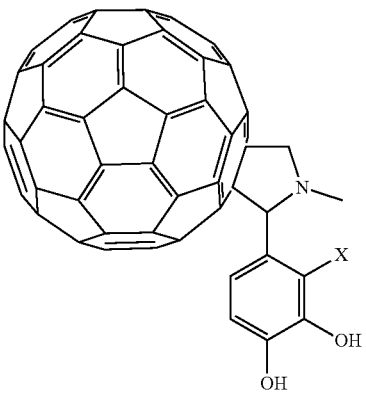
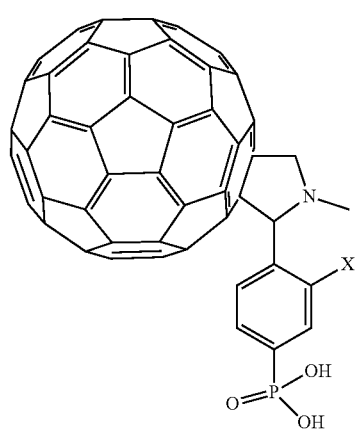

-continued
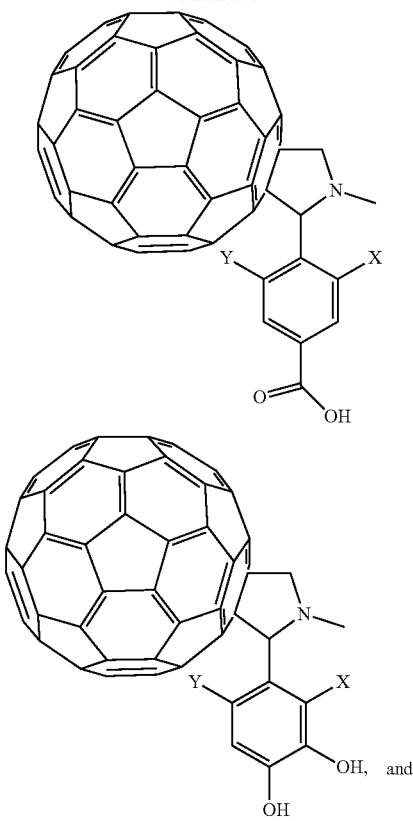
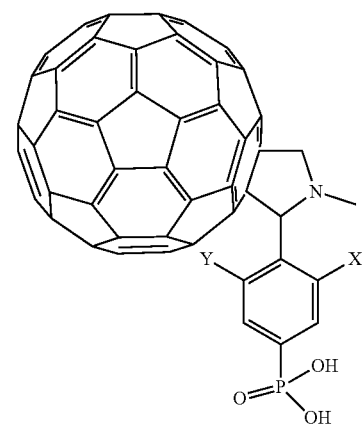
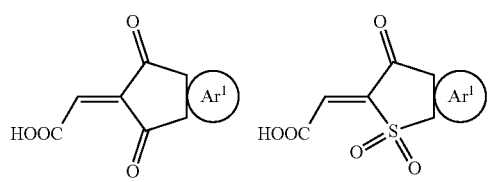
wherein each X is individually selected from the group consisting of oxygen, carbon, hydrogen, sulfur, selenium, and nitrogen;
each Y is individually selected from the group consisting of:
-continued
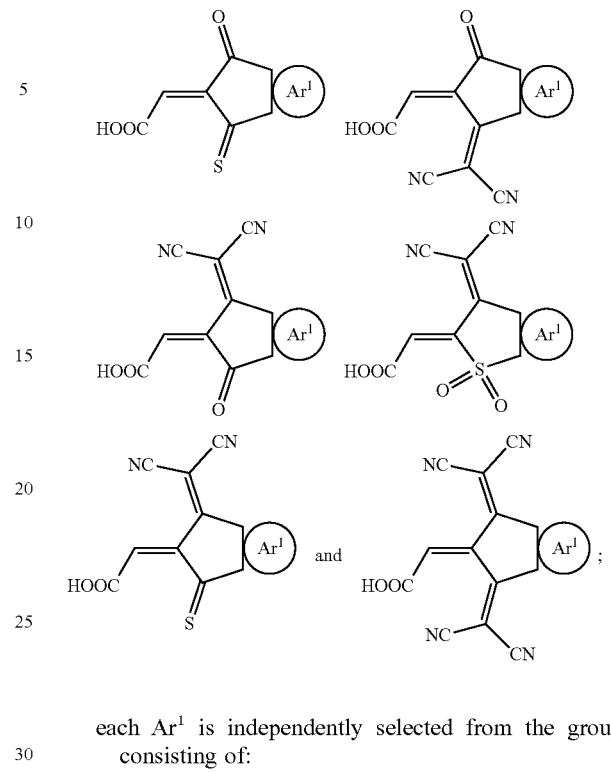
each $Ar^1$ is independently selected from the group consisting of:
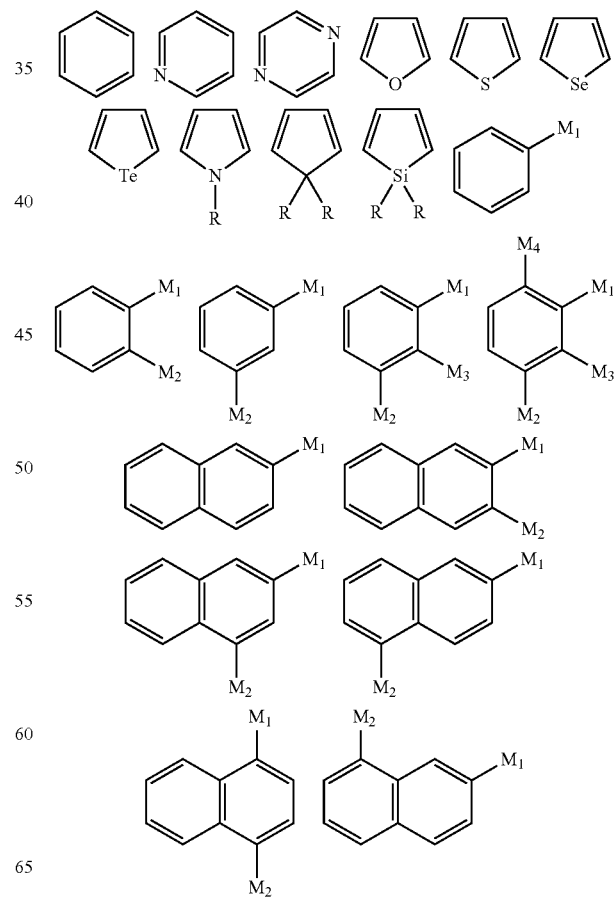

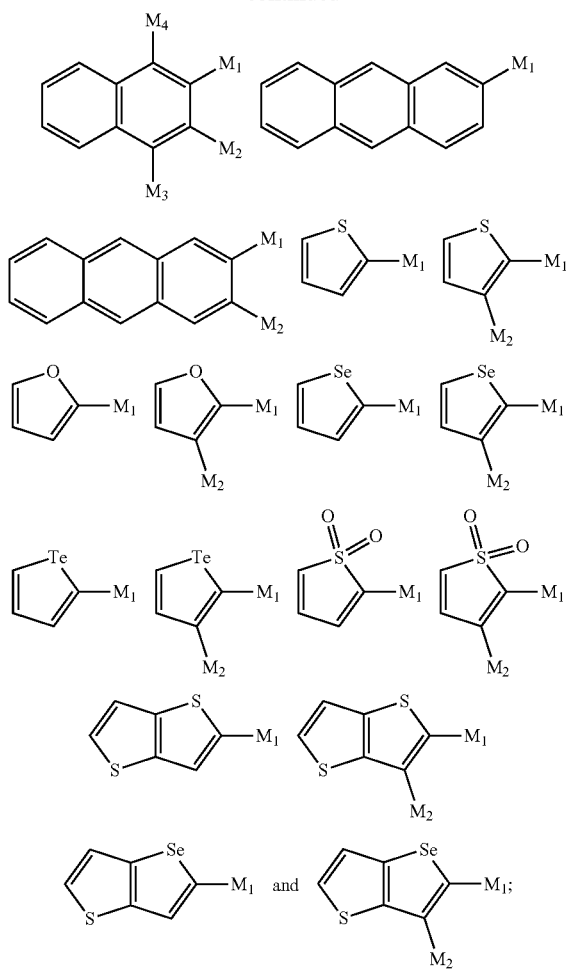

$M_1$-$M_4$ are each independently selected from the group consisting of hydrogen, fluorine, chlorine, bromine, iodine, astatine, and a cyano group, wherein at least one of $M_1$-$M_4$ is a halogen; and each R is independently a $C_1$-$C_{20}$ hydrocarbon or an aromatic hydrocarbon; or wherein the cathode buffer comprises a material selected from the group consisting of:

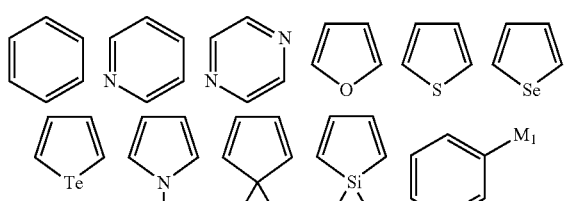

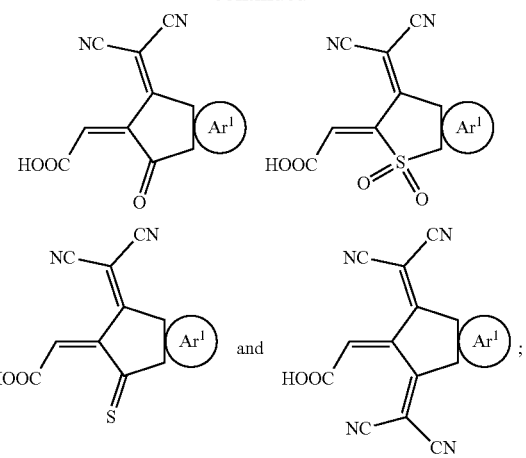

each $Ar^1$ is independently selected from the group consisting of:

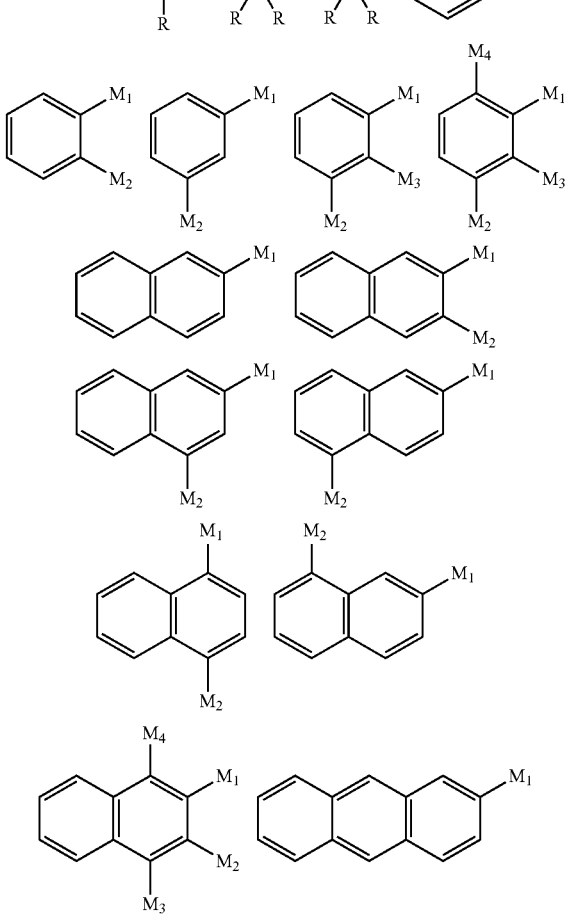

-continued
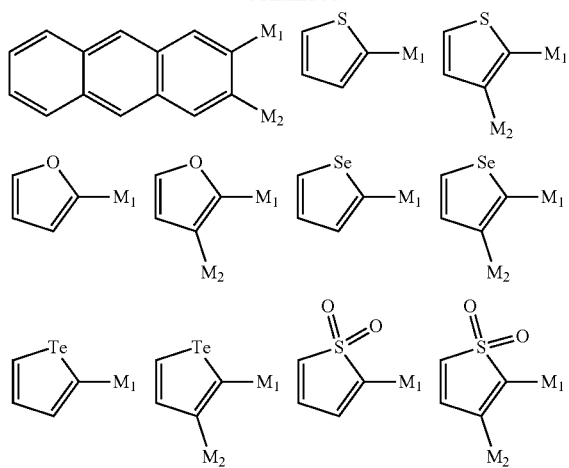
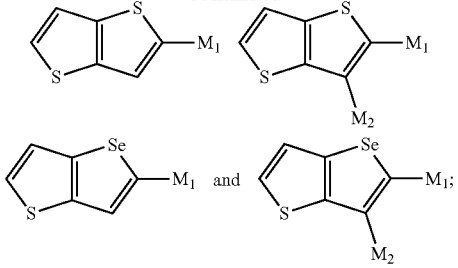
$M_1$-$M_4$ are each independently selected from the group consisting of hydrogen, fluorine, chlorine, bromine, iodine, astatine, and a cyano group, wherein at least one of $M_1$-$M_4$ is a halogen; and
each R is independently a $C_1$-$C_{20}$ hydrocarbon or an aromatic hydrocarbon.
* * * * *